United States Patent
Saito et al.

(10) Patent No.: US 8,779,496 B2
(45) Date of Patent: Jul. 15, 2014

(54) SPIN FET, MAGNETORESISTIVE ELEMENT AND SPIN MEMORY

(75) Inventors: Yoshiaki Saito, Kawasaki (JP); Hideyuki Sugiyama, Yokohama (JP); Tomoaki Inokuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1149 days.

(21) Appl. No.: 12/029,117

(22) Filed: Feb. 11, 2008

(65) Prior Publication Data

US 2008/0239930 A1 Oct. 2, 2008

(30) Foreign Application Priority Data

Mar. 26, 2007 (JP) ................................. 2007-079966

(51) Int. Cl.
  *H01L 29/76* (2006.01)
(52) U.S. Cl.
  USPC .......................................... 257/314; 257/213
(58) Field of Classification Search
  USPC ................... 257/E21.665, E27.005, 213, 314; 369/126
  See application file for complete search history.

(56) References Cited

U.S. PATENT DOCUMENTS

| 7,271,010 | B2 * | 9/2007 | Motoyoshi | 438/3 |
|---|---|---|---|---|
| 2004/0134876 | A1 * | 7/2004 | Hosotani | 216/22 |
| 2005/0282379 | A1 * | 12/2005 | Saito et al. | 438/624 |
| 2007/0025029 | A1 * | 2/2007 | Hayakawa et al. | 360/324.2 |
| 2007/0048485 | A1 * | 3/2007 | Jogo et al. | 428/64.1 |
| 2007/0076469 | A1 * | 4/2007 | Ashida et al. | 365/158 |
| 2007/0164336 | A1 | 7/2007 | Saito et al. | |
| 2007/0165449 | A1 * | 7/2007 | Zheng et al. | 365/158 |
| 2007/0171694 | A1 * | 7/2007 | Huai et al. | 365/145 |
| 2008/0009080 | A1 * | 1/2008 | Kim et al. | 438/3 |
| 2008/0037179 | A1 * | 2/2008 | Ito et al. | 360/313 |

FOREIGN PATENT DOCUMENTS

| JP | 2001-339110 | 12/2001 |
|---|---|---|
| JP | 2004-179219 | 6/2004 |
| JP | 2004-524689 | 8/2004 |
| JP | 2004-260149 | 9/2004 |
| JP | 2006-286726 | 10/2006 |
| WO | WO 02/069356 A1 | 9/2002 |
| WO | WO 2005/083714 A1 | 9/2005 |

OTHER PUBLICATIONS

Ch. Binek et al., "Electrically Controlled Exchange Bias for Spintronic Application", J. of Applied Physics, v. 97, p. 10C514-1.*
S.M. Sze. "Semiconductor Devices. Physics and Technology. 2nd Edition", (C) 2002 John Wiley and Sons, p. 186, fig. 14.*

(Continued)

*Primary Examiner* — Jae Lee
(74) *Attorney, Agent, or Firm* — Oblon, Spivak, McClelland, Maier & Neustadt, L.L.P.

(57) ABSTRACT

A spin FET includes a first ferromagnetic film disposed on a first source/drain area, a direction of magnetization thereof being fixed in an upward direction or a downward direction perpendicular to a film surface, a second ferromagnetic film disposed on a second source/drain area, a direction of magnetization thereof being changed in the upward direction or the downward direction, an anti-ferromagnetic ferroelectric film disposed on the second ferromagnetic film, and a tunnel barrier film disposed at least between the first source/drain area and the first ferromagnetic film or between the second source/drain and the second ferromagnetic film. Resistance of the anti-ferromagnetic ferroelectric film is larger than ON resistance when the first and second source/drain areas conduct electricity through the channel area.

21 Claims, 36 Drawing Sheets

Direction of arrowhead: direction of remanent magnetization

(56) References Cited

OTHER PUBLICATIONS

S.M. Sze "Semiconductor Devices. Physics and Technology. 2nd Edition", © 2002 John Wiley and Sons.*

Ch. Binek, et al., "Electrically controlled exchange bias for spintronic applications" Journal of Applied Physics, vol. 97, 2005, pp. 10C514-1 to 10C514-3.

H. Zheng, et al., "Multiferroic $BaTiO_3$-$CoFe_2O_4$ Nanostructures", Science, vol. 303, Jan. 30, 2004, pp. 661-663.

* cited by examiner

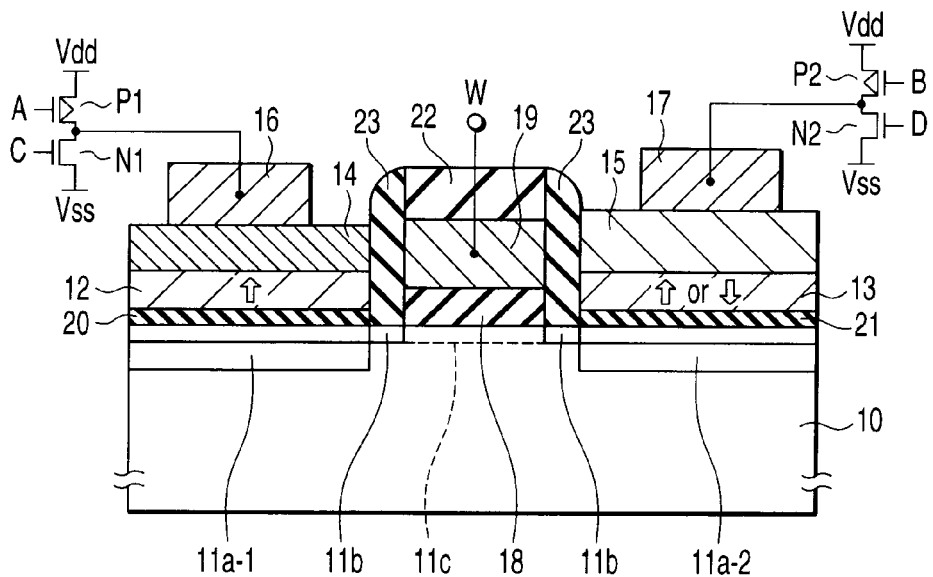
Direction of arrowhead: direction of remanent magnetization
F I G. 1
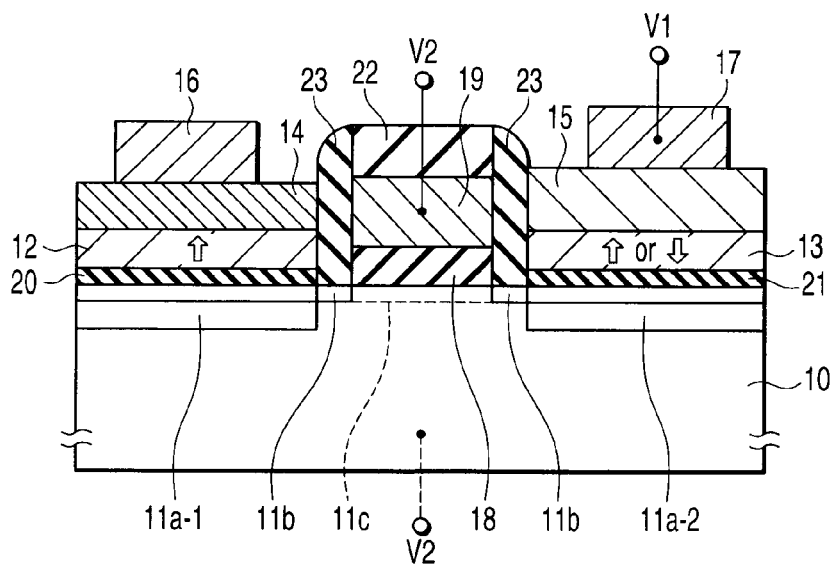
Direction of arrowhead: direction of remanent magnetization
F I G. 2

Direction of arrowhead: direction of remanent magnetization

Direction of arrowhead: direction of remanent magnetization

Direction of arrowhead: direction of remanent magnetization

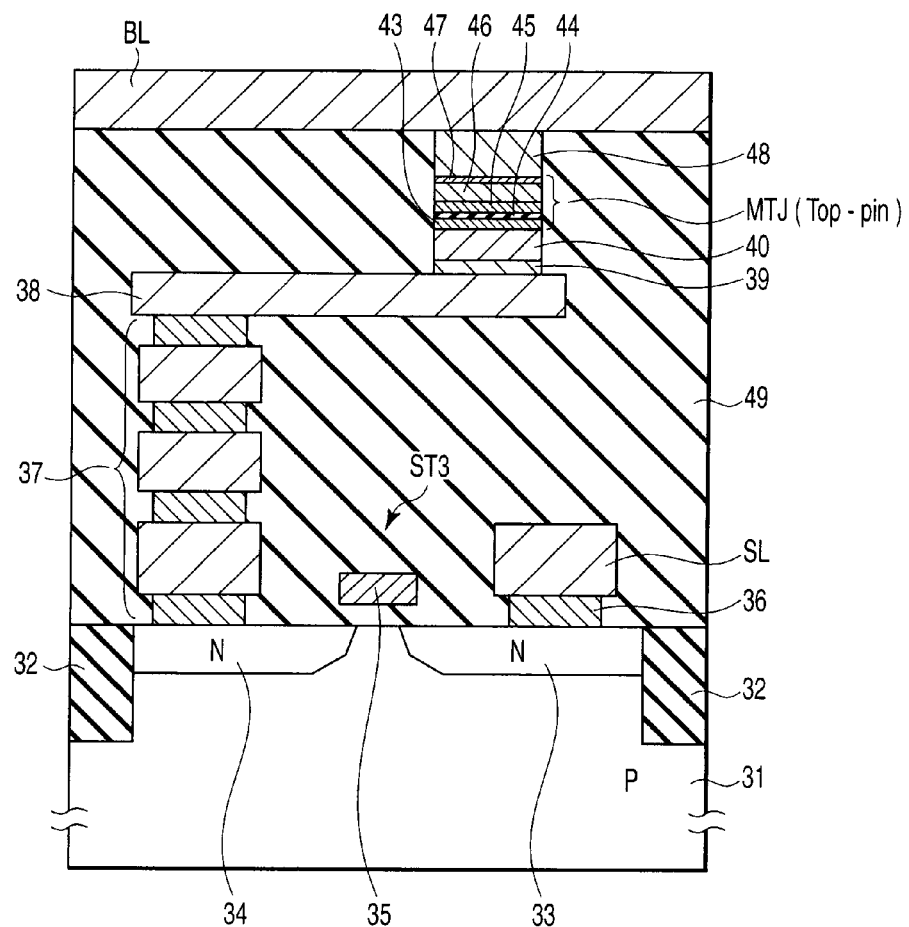
F I G. 10

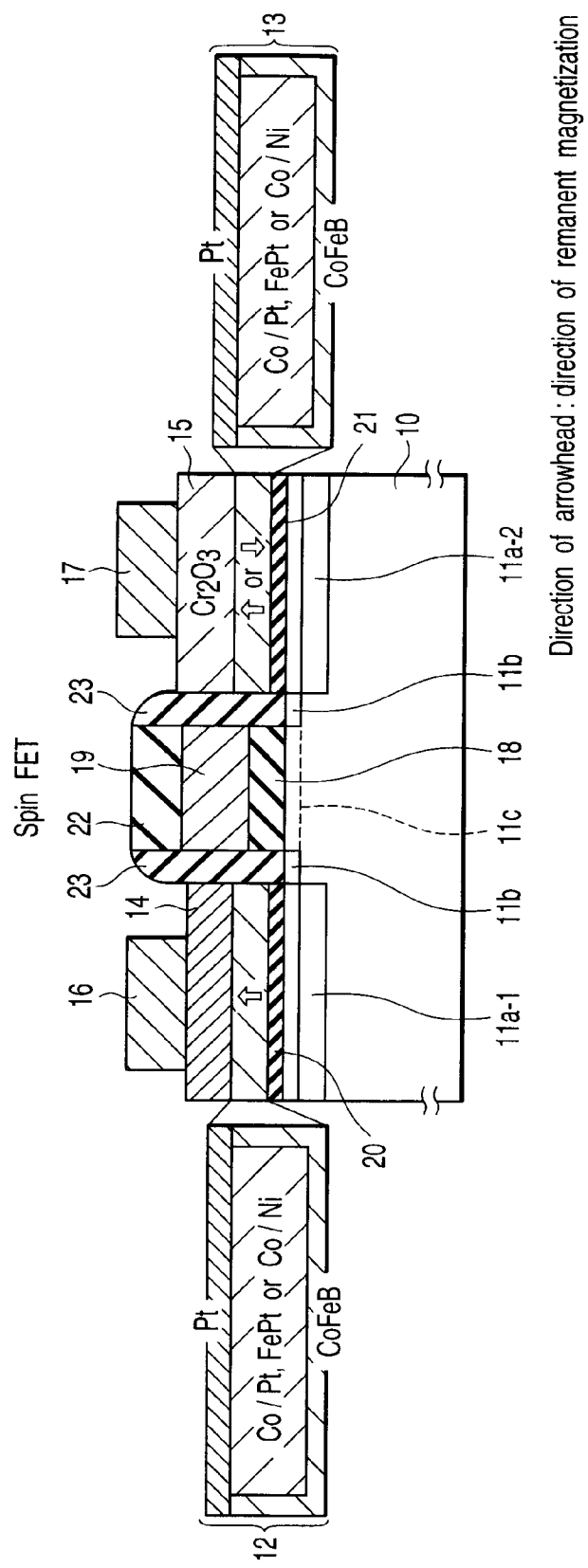
F I G. 17

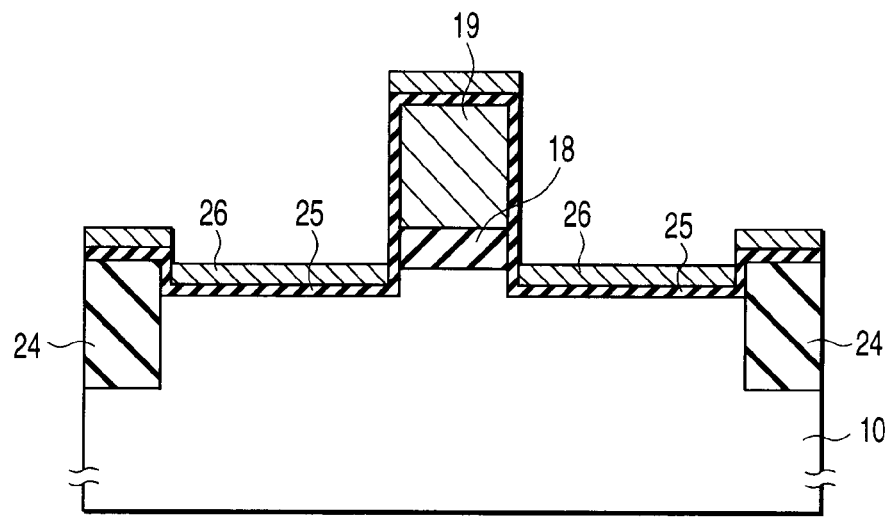
F I G. 22
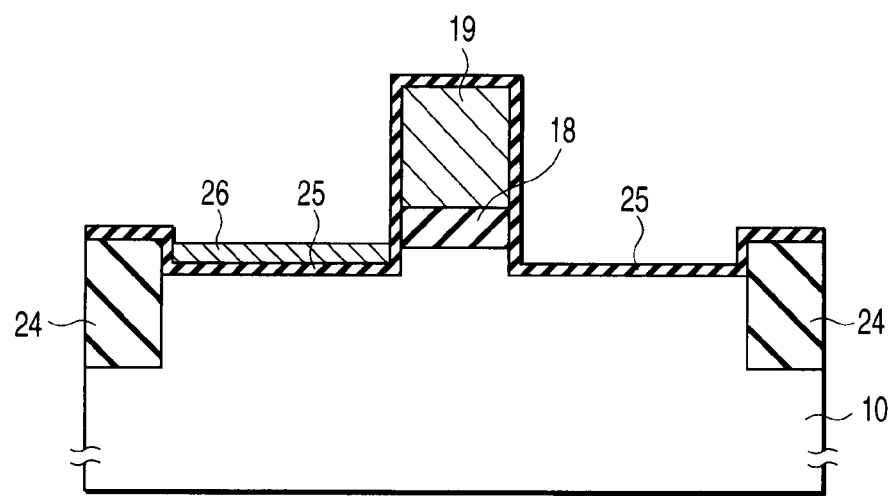
F I G. 23

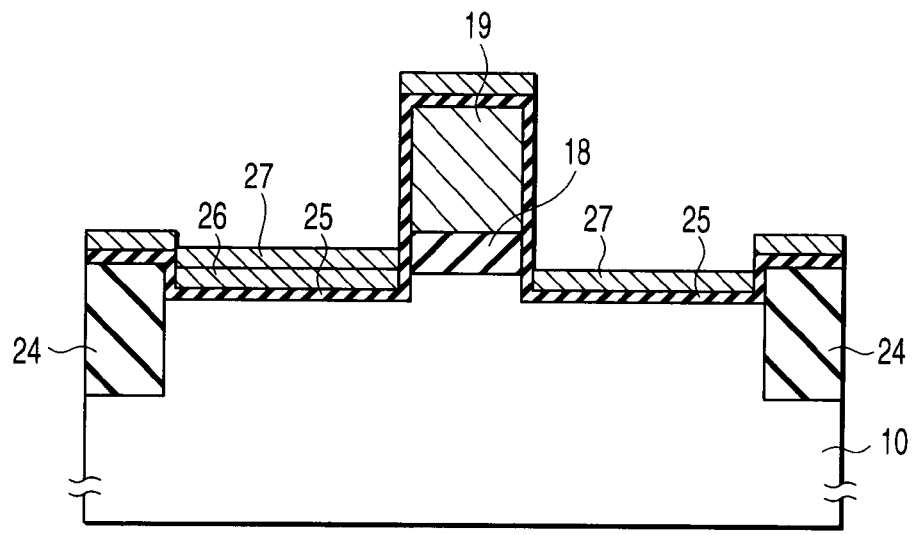
F I G. 24
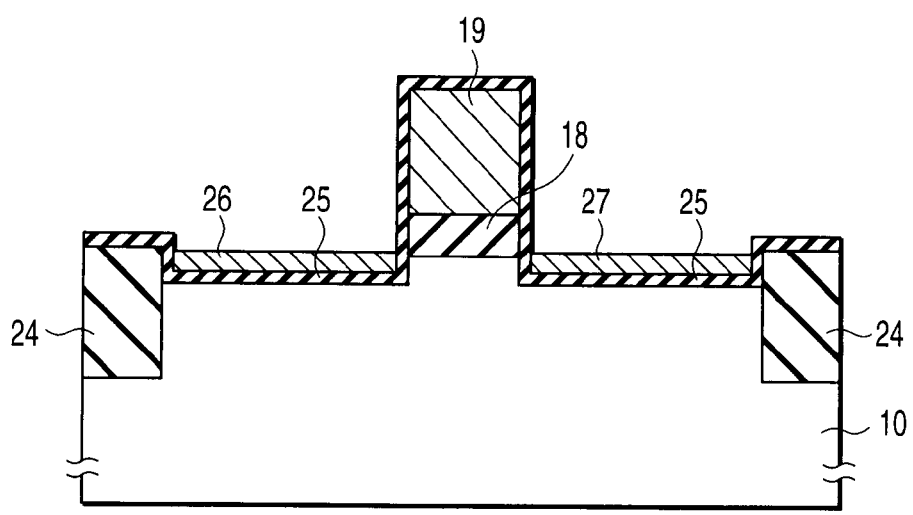
F I G. 25

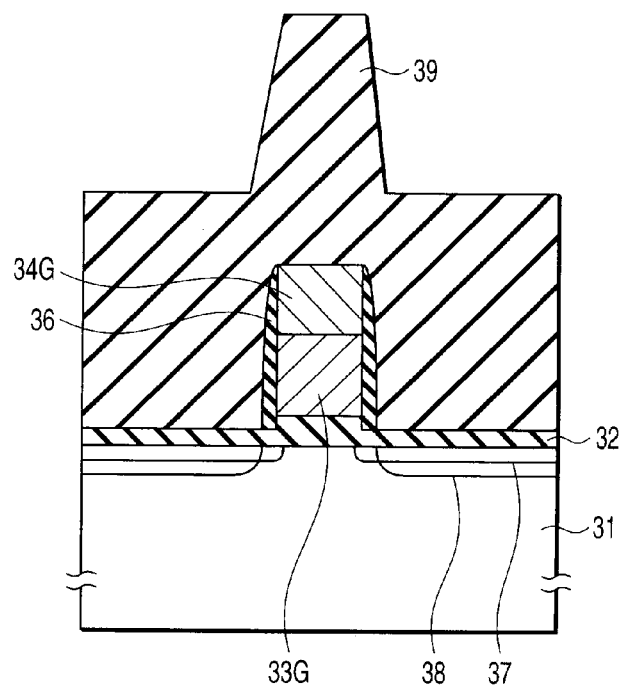
F I G. 28
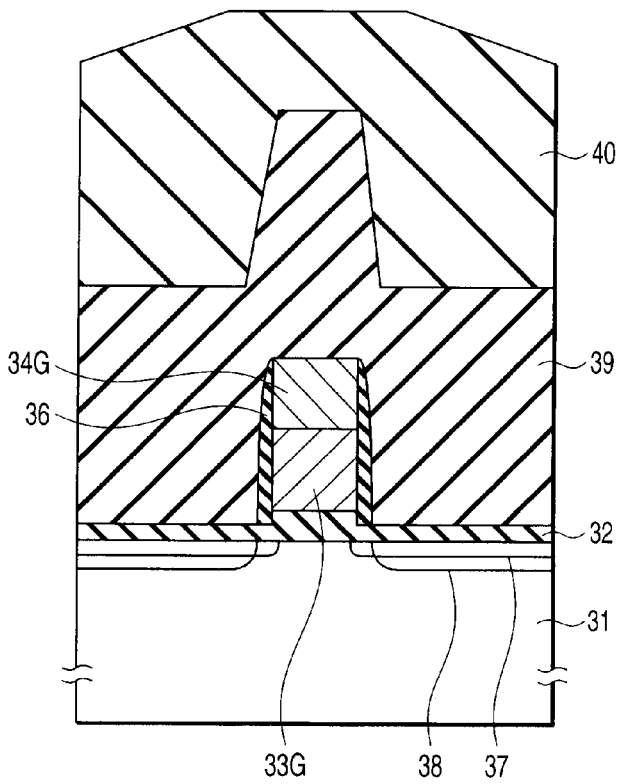
F I G. 29

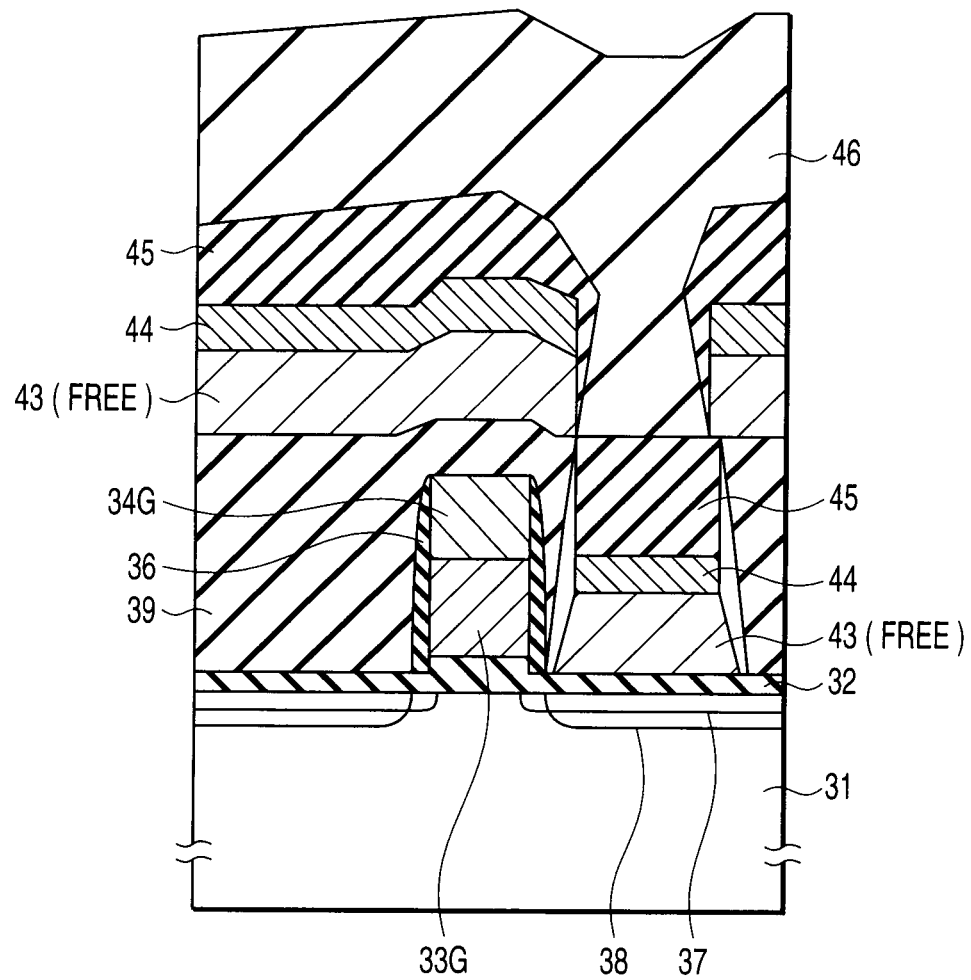
F I G. 34

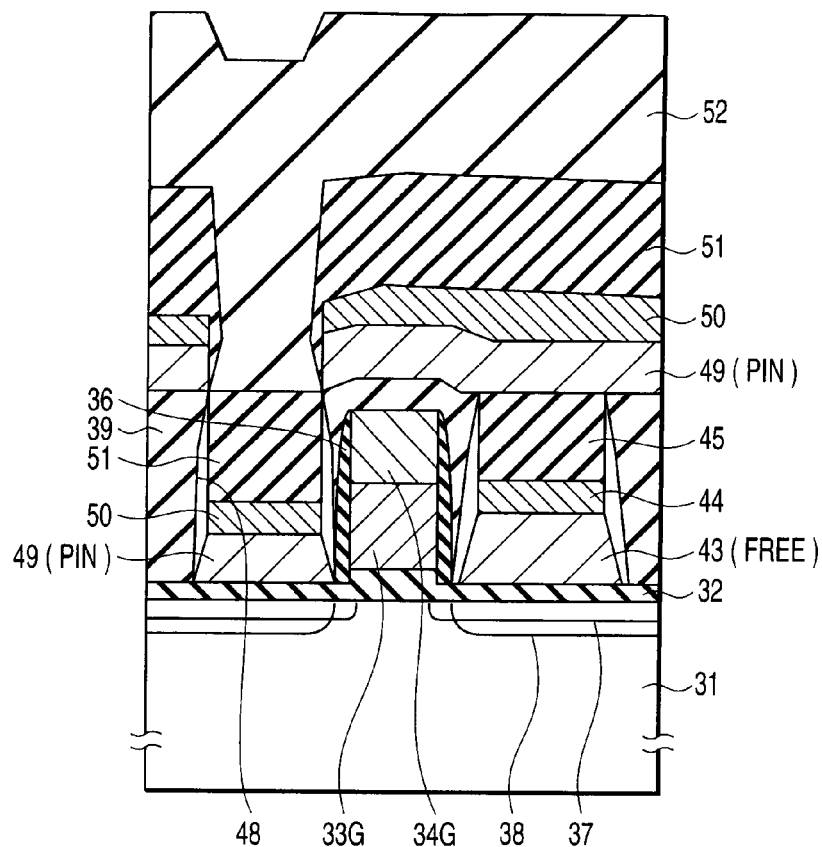
F I G. 3 9
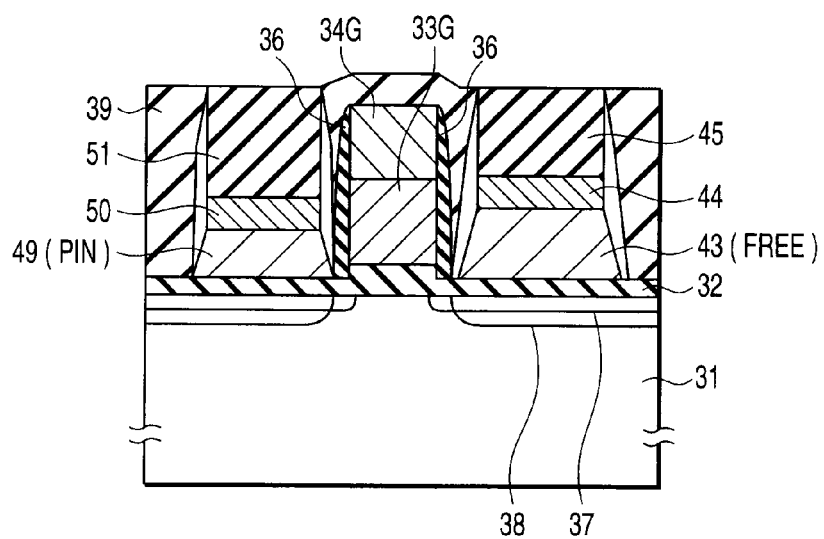
F I G. 4 0

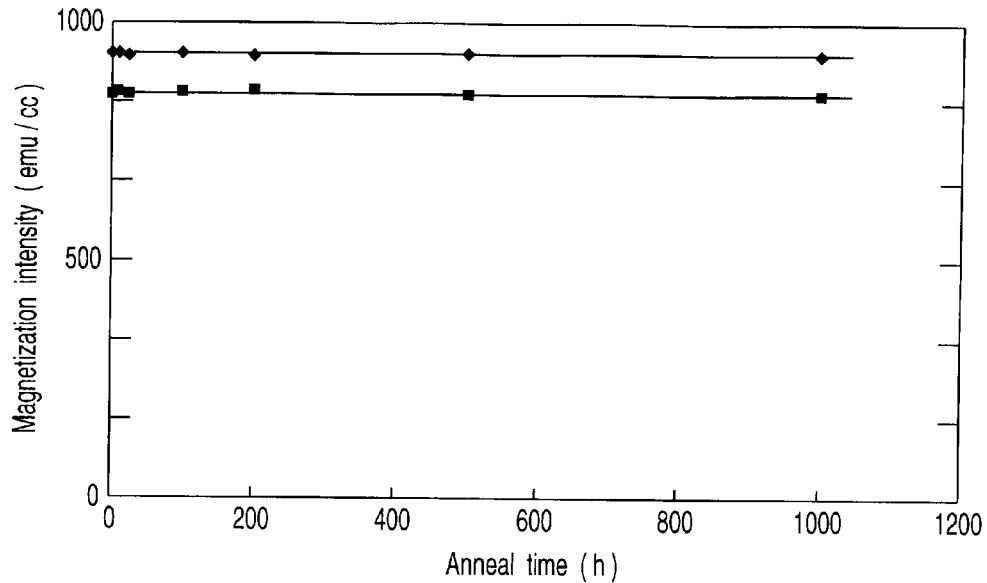
F I G. 4 3
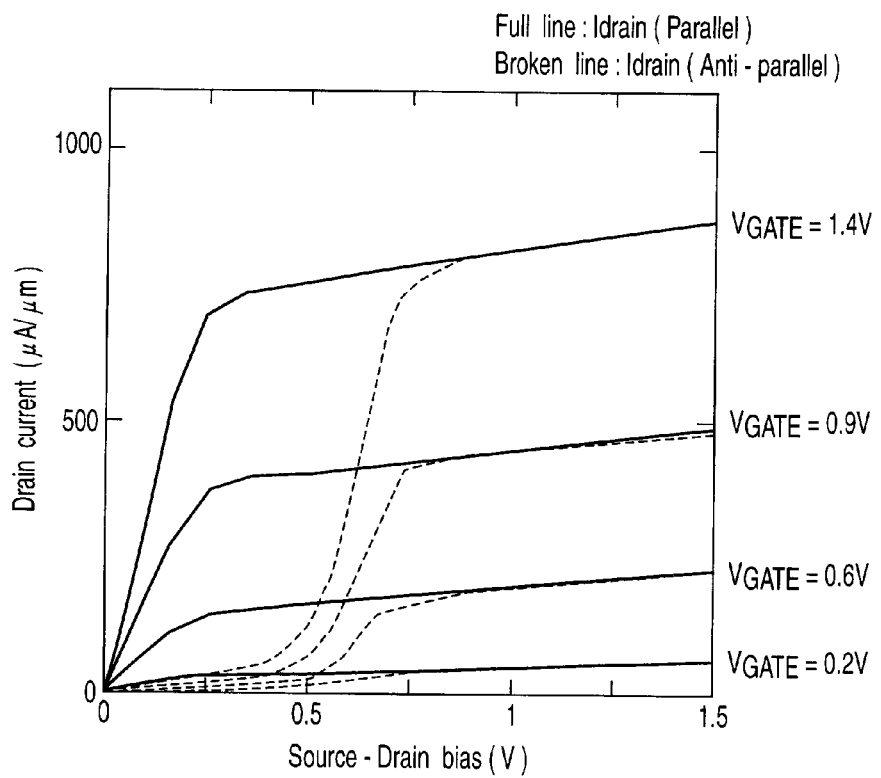
F I G. 4 4

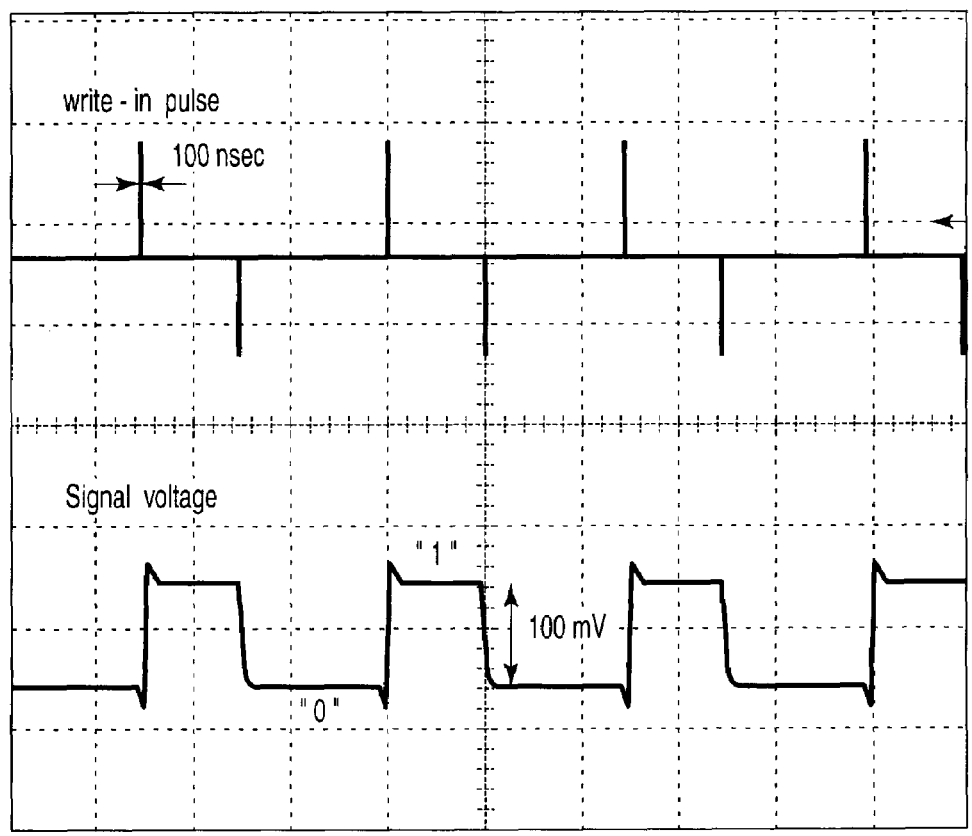
F I G. 4 5

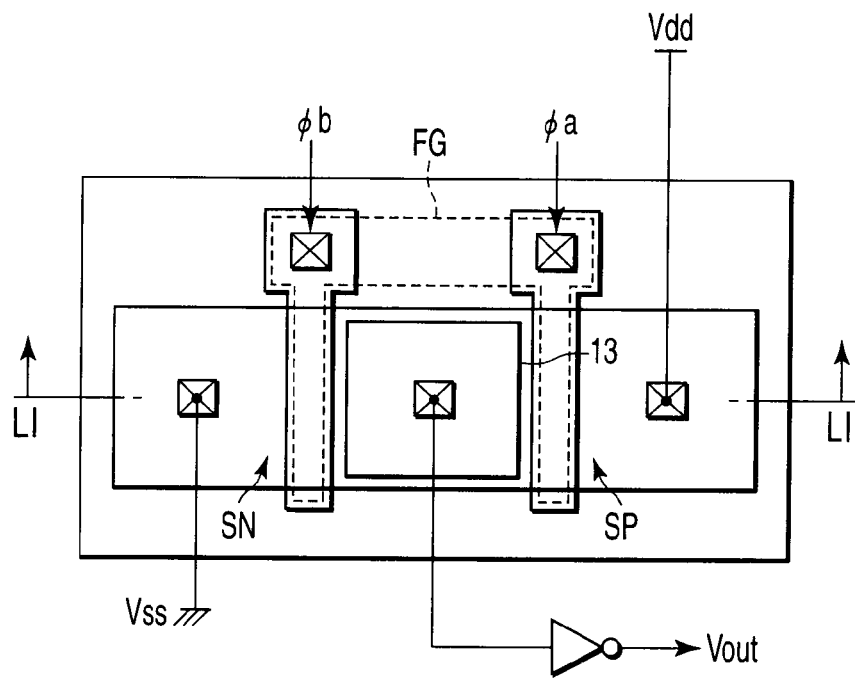
F I G. 5 0
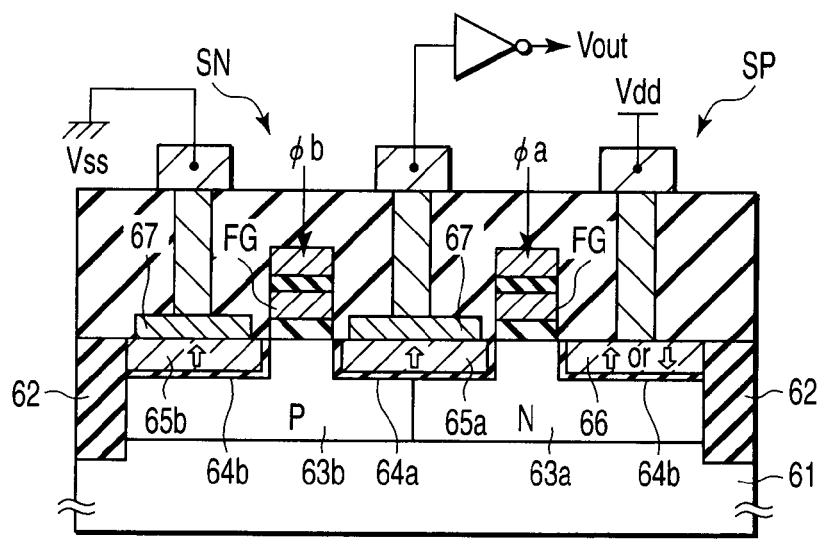
F I G. 5 1

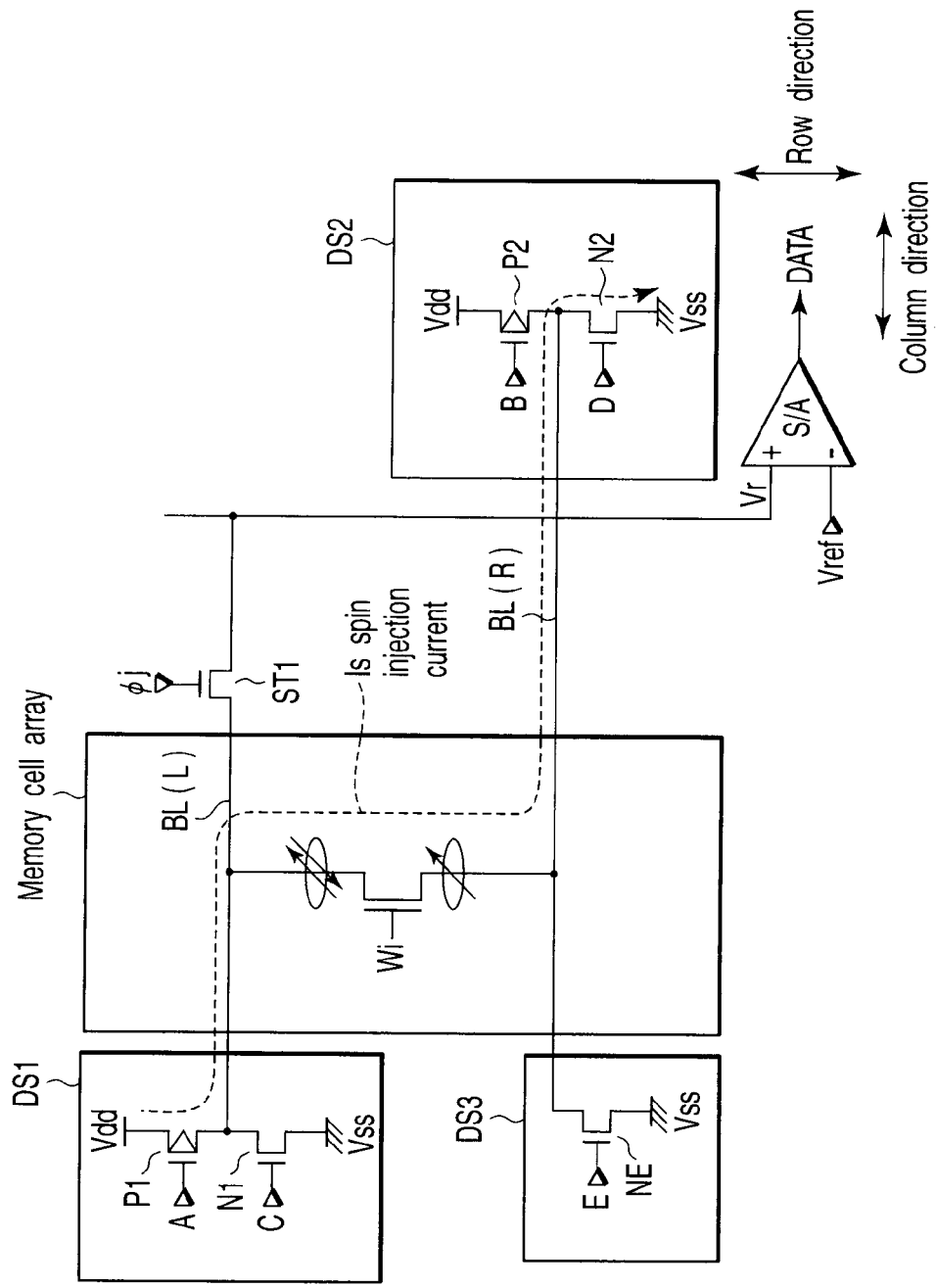
F I G. 5 8

SPIN FET, MAGNETORESISTIVE ELEMENT AND SPIN MEMORY

CROSS-REFERENCE TO RELATED APPLICATIONS

This application is based upon and claims the benefit of priority from prior Japanese Patent Application No. 2007-079966, filed Mar. 26, 2007, the entire contents of which are incorporated herein by reference.

BACKGROUND OF THE INVENTION

1. Field of the Invention

The present invention relates to a spin field effect transistor (FET), a magnetoresistive element and a spin memory.

2. Description of the Related Art

In recent years, research and development aiming at achievement of a spin electronics device using spin freedom of electron have been actively made. For example, devices using tunnel magneto-resistance (TMR) effect such as a magnetic random access memory (MRAM) and a reproduction magnetic head of a hard disk are typical examples.

Recently, the spin FET has been proposed as a next-generation spin device.

The spin FET has a feature in having a magnetic recording portion for memorizing binary data and is used as a component of a reconfigurable logic circuit. If a logic circuit is configured of the spin FET, all logics such as AND, NOR, OR and EX-OR can be achieved selectively only by rewriting data in a magnetic recording portion of one kind of circuit.

If this is achieved, necessity of changing the layout of a transistor depending on the kind of the logic circuit is eliminated, thereby achieving reduction of design/development term to a large extent and reduction of manufacturing cost to a large extent.

Therefore, it has been considered to use such a logic circuit by combination of a non-volatile semiconductor memory such as a magnetic random access memory and a ferroelectric random access memory (FeRAM).

However, in a current spin FET, writing of data into the magnetic recording portion is carried out with current magnetic field (magnetic field generated by a writing current) or a spin injection current (spin torque by a spin polarized electron).

Thus, if the device size is decreased when the current magnetic field is used in the former case, the value of write-in current is increased thereby increasing consumption power. If the spin injection current is used as the latter case, a problem in reliability, that is, destruction of a tunnel barrier film occurs because a large current density is needed for data writing.

Such a problem occurs also in the spin memory in which magnetization of the magnetoresistive element is changed using the spin freedom of electron.

BRIEF SUMMARY OF THE INVENTION

A spin FET according to an aspect of the present invention comprises first and second source/drain areas, a channel area disposed between the first and second source/drain areas, a gate insulation film disposed on the channel area, a gate electrode disposed on the gate insulation film, a first ferromagnetic film disposed on the first source/drain area, a direction of magnetization thereof being fixed in an upward direction or a downward direction perpendicular to a film surface, a second ferromagnetic film disposed on the second source/drain area, a direction of magnetization thereof being changed in the upward direction or the downward direction, an anti-ferromagnetic ferroelectric film disposed on the second ferromagnetic film, and a tunnel barrier film disposed at least between the first source/drain area and the first ferromagnetic film or between the second source/drain and the second ferromagnetic film, wherein resistance of the anti-ferromagnetic ferroelectric film is larger than ON resistance when the first and second source/drain areas conduct electricity through the channel area.

A spin FET according to an aspect of the present invention comprises a first ferromagnetic film in which a direction of magnetization is fixed to an upward direction or a downward direction perpendicular to a film surface, a second ferromagnetic film in which a direction of magnetization is changed in the upward direction or the downward direction, a channel area disposed between the first and second ferromagnetic films, a gate insulation film disposed on the channel area, a gate electrode disposed on the gate insulation film, an anti-ferromagnetic ferroelectric film disposed on the second ferromagnetic film, and a tunnel barrier film disposed at least between the first ferromagnetic film and the channel area or between the second ferromagnetic film and the channel area. Resistance of the anti-ferromagnetic ferroelectric film is larger than ON resistance when the first and second ferromagnetic films conduct electricity through the channel area.

A magnetoresistive element according to an aspect of the present invention comprises a first ferromagnetic film in which a direction of magnetization is fixed to an upward direction or a downward direction perpendicular to a film surface, a second ferromagnetic film in which a direction of magnetization is changed in the upward direction or the downward direction, a tunnel barrier film disposed between the first and second ferromagnetic films, and an anti-ferromagnetic ferroelectric film disposed on an opposite side to the tunnel barrier film adjacent the second ferromagnetic film. Resistance of the anti-ferromagnetic ferroelectric film is larger than a maximum value of resistance of a variable resistive element comprised of the first ferromagnetic film, the second ferromagnetic film and the tunnel barrier film.

A spin memory according to an aspect of the present invention comprises a semiconductor substrate: an FET disposed in a surface area of the semiconductor substrate, the above-described magnetoresistive element, disposed on the FET, a bottom end thereof being connected to one of the two source and drain areas of the FET, a bit line connected to an upper end of the magnetoresistive element and extending in a first direction, and a word line connected to a gate electrode of the FET and extending in a second direction perpendicular to the first direction.

BRIEF DESCRIPTION OF THE SEVERAL VIEWS OF THE DRAWING

FIG. 1 is a sectional view showing a first basic structure of a spin FET;

FIG. 2 is a sectional view showing a second basic structure of the spin FET;

FIG. 10 is a sectional view showing a second basic structure of the spin memory;

FIG. 17 is a sectional view showing an example of a material of the spin FET;

FIG. 22 is a sectional view showing the first example of the method of manufacturing the spin FET;

FIG. 23 is a sectional view showing the first example of the method of manufacturing the spin FET;

FIG. 24 is a sectional view showing the first example of the method of manufacturing the spin FET;

FIG. 25 is a sectional view showing the first example of the method of manufacturing the spin FET;

FIG. 28 is a sectional view showing the second example of the method of manufacturing the spin FET;

FIG. 29 is a sectional view showing the second example of the method of manufacturing the spin FET;

FIG. 34 is a sectional view showing the second example of the method of manufacturing the spin FET;

FIG. 39 is a sectional view showing the second example of the method of manufacturing the spin FET;

FIG. 40 is a sectional view showing the second example of the method of manufacturing the spin FET;

FIG. 43 is a diagram showing the characteristic of a sample of a third experimental example;

FIG. 44 is a diagram showing the characteristic of a sample of a fourth experimental example;

FIG. 45 is a diagram showing the characteristic of a sample of a fifth experimental example;

FIG. 50 is a plan view showing an example of a device structure;

FIG. 51 is a sectional view taken along the line LI-LI of FIG. 50;

FIG. 52 is a circuit diagram showing a second example of the reconfigurable logic circuit;

FIG. 53 is a circuit diagram showing the second example of the reconfigurable logic circuit;

FIG. 58 is a circuit diagram showing an example of a semiconductor memory which adopts the spin FET as its memory cell;

DETAILED DESCRIPTION OF THE INVENTION

Figure 3:
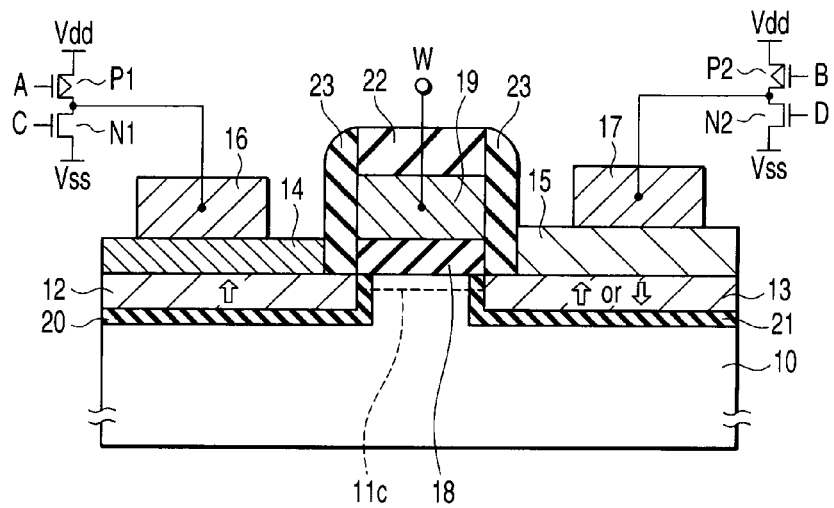
FIG. 3 is a sectional view showing a third basic structure of the spin FET.

A spin FET, a magnetoresistive element and a spin memory of an aspect of the present invention will be described below in detail with reference to the accompanying drawings.

1. Outline

According to the present invention, a free layer and a pinned layer are formed using a perpendicular magnetic film. The perpendicular magnetic film has a more excellent thermal stability than an in-plane magnetic film.

The perpendicular magnetic film mentioned here refers to a ferromagnetic film having perpendicular magnetic anisotropy in which the magnetization direction is perpendicular (upward or downward) to film face. The in-plane magnetic film refers to a ferromagnetic film in which the magnetization direction is parallel to the film face.

The film face refers to a face in the film thickness direction, that is, top face or bottom face of the film, and the side face of the film is not included in the film face.

Next, an anti-ferromagnetic ferroelectric film for assisting magnetization reversal is applied to the free layer comprised of the perpendicular magnetic film.

The anti-ferromagnetic ferroelectric film has an operation of significantly reducing magnetic field (critical magnetic field) or spin injection current (critical current density) necessary for magnetization reversal of the free layer by combining with the free layer as the perpendicular magnetic film.

A typical example of the anti-ferromagnetic ferroelectric film is $Cr_2O_3$.

For example, a laminate structure of $Cr_2O_3$/Pt/$[CoPt]_3$/Pt can control the magnetization direction of $[CoPt]_3$ as the free layer depending on the direction of voltage at a temperature of 150K.

Further, the present invention adopts a following configuration in order to prevent destruction of a tunnel barrier film at the time of writing.

In Case of Spin FET

Resistance of the anti-ferromagnetic ferroelectric film is increased with respect to ON resistance of the spin FET. The ON resistance of spin FET is defined by a resistance of a channel area of the spin FET when current is flowed through the channel area.

In Case of Magnetoresistive Element or Spin Memory

Resistance of the anti-ferromagnetic ferroelectric film is increased with respect to a maximum value of resistance of the magnetoresistive element (variable resistance element).

The purpose is to prevent destruction of the tunnel barrier film by increasing a voltage applied to the anti-ferromagnetic ferroelectric film with respect to a voltage applied to the tunnel barrier film.

As for the writing method, for example, a method for controlling the magnetization direction of the anti-ferromagnetic ferroelectric film depending on the direction of voltage is adopted.

When the magnetization direction of the anti-ferromagnetic ferroelectric film is determined, magnetization of the free layer (ferromagnetic film) is oriented easily in the same direction as the magnetization of the anti-ferromagnetic ferroelectric film due to magnetic coupling with the anti-ferromagnetic ferroelectric film.

Further, a method of using the spin injection current (spin torque by spin polarized-electron) or a method of using magnetic field generated by write current may be combined with the above method.

Because voltage is necessarily applied to the anti-ferromagnetic ferroelectric film in order to feed spin injection current, it is permissible to adopt the method of using the spin injection current independently.

2. Embodiments

Next, some embodiments which are considered the best will be described.

(1) Spin FET

An example of the present invention will be described about a case where a spin FET is applied.

A. First Basic Structure

FIG. 1 shows a first basic structure of the spin FET.

The first basic structure concerns a tunnel barrier type spin FET which executes write according to the spin injection writing method.

Source/drain areas $11a$-1, $11a$-2 and an extension area $11b$ are formed in a semiconductor substrate 10. These source/drain areas $11a$-1, $11a$-2 and the extension area $11b$ are comprised of an impurity diffused layer.

A channel area $11c$ is disposed between the two source/drain areas $11a$-1 and $11a$-2. When the spin FET is turned ON, a channel is formed in the channel area $11c$.

A gate electrode 19 is formed on the channel area $11c$ via a gate insulation film 18. A cap insulation film 22 which serves as a mask when the gate electrode 19 is processed is formed on the gate electrode 19. A side insulation film 23 is formed on the side faces of the gate insulation film 18, the gate electrode 19 and the cap insulation film 22.

A tunnel barrier film 20 is formed on the source/drain area $11a$-1. A pinned layer 12 comprised of a ferromagnetic film having perpendicular magnetic anisotropy is formed on the tunnel barrier film 20.

The magnetization direction of the pinned layer 12 is fixed by an anti-ferromagnetic film 14. For example, magnetization of the pinned layer 12 is fixed to be directed upward.

A tunnel barrier film 21 is formed on the source/drain area $11a$-2. A free layer 13 comprised of a ferromagnetic film having perpendicular magnetic anisotropy is formed on the tunnel barrier film 21.

One of the tunnel barrier layers 20, 21 may be omitted.

Further, magnetization of the pinned layer 12 may be fixed by forming the pinned layer 12 with a sufficient thickness without using the anti-ferromagnetic film 14. The magnetization of the pinned layer 12 may be fixed in a downward direction.

An anti-ferromagnetic ferroelectric film 15 is formed on the free layer 13. The anti-ferromagnetic ferroelectric film 15 assists magnetization reversal of the free layer 13.

The material and size of the anti-ferromagnetic ferroelectric film 15 are determined so that resistance of the anti-ferromagnetic ferroelectric film 15 is larger than the ON resistance of the spin FET.

Electrodes 16, 17 are formed on the anti-ferromagnetic film 14 and the anti-ferromagnetic ferroelectric film 15, respectively.

The electrode 16 is connected to a driver/sinker for generating spin injection current, that is, a P-channel MOS transistor P1 and an N-channel MOS transistor N1.

Likewise, the electrode 17 is connected to a driver/sinker for generating the spin injection current, that is, a P-channel MOS transistor P2 and an N-channel MOS transistor N2.

In the spin FET having such a structure, write therein is carried out by supplying a write voltage W to the gate electrode 19 to turn ON the spin FET so as to feed spin injection current in between the electrodes 16 and 17 through the channel area $11c$.

The value of written data is determined by the direction of the spin injection current. The direction of the spin injection current is controlled by ON/OFF of the P-channel MOS transistors P1, P2 and the N-channel MOS transistors N1, N2 by control signals A, B, C and D.

When the spin injection current is supplied, a constant voltage is applied to the anti-ferromagnetic ferroelectric film 15 so that electric field is generated therein. Consequently, distortion is generated in the anti-ferromagnetic ferroelectric film 15 and first, magnetization of the anti-ferromagnetic ferroelectric film 15 is inverted. Thus, the magnetization of the anti-ferromagnetic ferroelectric film 15 assists magnetization reversal of the free layer 13.

For example, when making magnetic moments of the pinned layer 12 and the free layer 13 to anti-parallel (opposite in magnetization direction), the spin injection current is supplied from the P-channel MOS transistor P1 to the N-channel MOS transistor N2.

At this time, in the anti-ferromagnetic ferroelectric film 15, plus electric field is generated on the free layer 13 side and minus electric field is generated on the electrode 17 side, so that the direction of magnetization of the anti-ferromagnetic ferroelectric film 15 is directed downward (anti-parallel to the direction of magnetization of the pinned layer 12).

The magnetization of the free layer 13 is directed easily in the same direction as the direction of magnetization of the anti-ferromagnetic ferroelectric film 15 by magnetic coupling between the free layer 13 and the anti-ferromagnetic ferroelectric film 15.

With this state, the spin injection current flows continuously from the P-channel MOS transistor P1 to the N-channel MOS transistor N2, so that electron spin-polarized opposite (downward) to the direction of magnetization of the pinned layer 12 is reflected by the pinned layer 12 so as to apply spin-torque to electrons in the free layer 13. At the same time, electron spin-polarized in the same direction (downward) as the direction of magnetization of the anti-ferromagnetic ferroelectric film 15 passes the anti-ferromagnetic ferroelectric film 15 so as to apply spin-torque to the electrons in the free layer 13.

As a result, the direction of magnetization of the free layer 13 is directed downward so that it is anti-parallel to the direction of magnetization of the pinned layer 12.

To make the magnetic moments of the pinned layer 12 and the free layer 13 parallel (equal in the direction of magnetization), the spin injection current is supplied from the P-channel MOS transistor P2 to the N-channel MOS transistor N1.

At this time, in the anti-ferromagnetic ferroelectric film 15, minus electric field is generated on the free layer 13 side and plus electric field is generated on the electrode 17 side. First of all, the direction of magnetization of the anti-ferromagnetic ferroelectric film 15 is directed upward (parallel to the direction of magnetization of the pinned layer 12).

Therefore, the magnetization of the free layer 13 is directed more easily to the same direction as the direction of magnetization of the anti-ferromagnetic ferroelectric film 15 by magnetic coupling between the free layer 13 and the anti-ferromagnetic ferroelectric film 15.

Because with this condition, the spin injection current flows continuously from the P-channel MOS transistor P2 to the N-channel MOS transistor N1, the electron spin-polarized in the same direction (upward) as the direction of magnetization of the pinned layer 12 passes the pinned layer and applies spin torque to electrons in the free layer 13.

As a result, the direction of magnetization of the free layer 13 is directed upward so that it becomes parallel to the direction of magnetization of the pinned layer 12.

As described above, according to the first basic structure, because the anti-ferromagnetic ferroelectric film 15 assists the spin injection magnetization reversal, critical current density of the spin injection current can be smaller than that obtained when magnetization reversal is carried out by only the spin injection writing method, thereby achieving reduced power consumption and improvement of reliability.

Further, a voltage applied to the anti-ferromagnetic ferroelectric film 15 at the time of writing becomes larger than a voltage applied to the tunnel barrier film 20, thereby preventing destruction of the tunnel barrier films, 20, 21.

Figure 5:
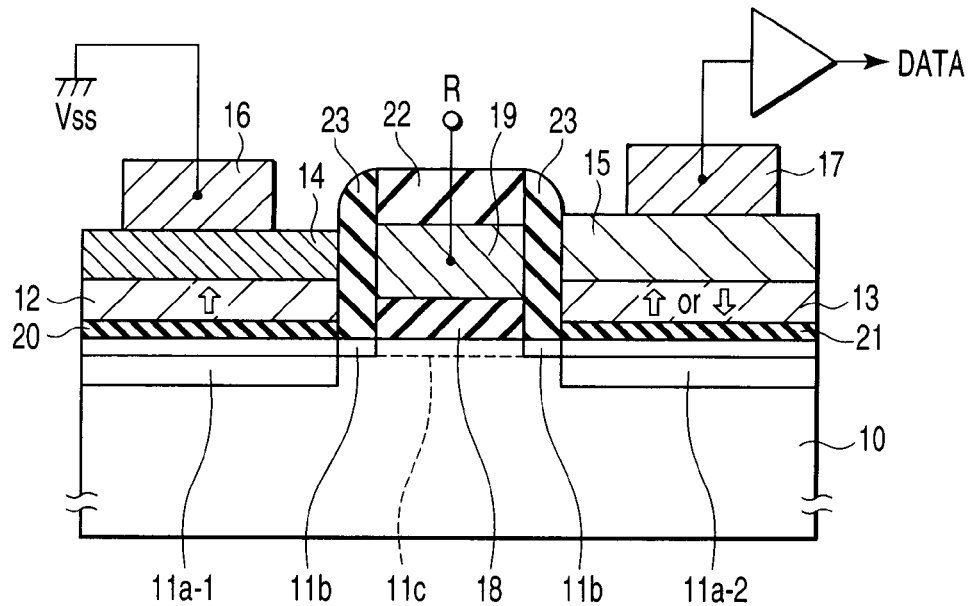
FIG. 5 is a sectional view showing a state upon reading from the spin FET.

As shown in FIG. 5, reading is carried out by applying a reading voltage R to the gate electrode 19 to turn ON the spin FET so as to supply reading current in between the electrodes 16 and 17 through the channel area 11c.

The reading current has a smaller value than the spin injection current in order to prevent erroneous writing at the time of reading.

If the magnetic moments of the pinned layer 12 and the free layer 13 are parallel, reading current flows when the spin FET is turned ON like an ordinary FET. Contrary to this, if the magnetic moments of the pinned layer 12 and the free layer 13 are anti-parallel, no reading current flows even if the spin FET is turned ON.

Thus, according to the first basic structure, the spin FET can be used selectively as an ordinary FET whose switching is controlled by a gate voltage or an FET always in OFF state regardless of the gate voltage, in accordance with data written into the free layer 13. Further, a reconfigurable logic circuit can be realized by rewriting data in the free layer 13.

Preferably, the pinned layer 12 and the free layer 13 are comprised of a highly resistant ferromagnetic material such as magnetic semiconductor and magnetic compound in order to realize a large magnetoresistive ratio.

According to the first basic structure, as described above, a pin FET with low power consumption and high reliability can be achieved by using the anti-ferromagnetic ferroelectric film whose magnetization direction is changed according to the direction of voltage.

B. Second Basic Structure

FIG. 2 shows a second basic structure of the spin FET.

The second basic structure concerns a tunnel barrier type spin FET which controls write data by the direction of voltage.

Because the device structure is the same as the first basic structure, description thereof is omitted here.

The second basic structure controls the direction of magnetization of the free layer 13 by only voltage without using the spin torque.

More specifically, writing of data is carried out by applying a writing voltage V1 to the electrode 17 and a writing voltage V2 to the gate electrode 19 so as to generate electric field inside the anti-ferromagnetic ferroelectric film 15.

For example, when the magnetic moments of the pinned layer (ferromagnetic film) 12 and the free layer (ferromagnetic film) 13 are made anti-parallel, the relationship between the voltages V1 and V2 is adjusted to V2>V1.

At this time, inside the ferromagnetic ferroelectric film 15, plus electric field is generated on the free layer 13 side and minus electric field is generated on the electrode 17 side.

Thus, the direction of magnetization of the anti-ferromagnetic ferroelectric film 15 is directed downward so that it is anti-parallel to the direction of magnetization (upward) of the pinned layer 12.

Accompanied by this, the direction of magnetization of the free layer 13 is directed in the same downward direction as the direction of magnetization of the anti-ferromagnetic ferroelectric film 15 (anti-parallel to the direction of magnetization of the pinned layer 12) due to magnetic coupling with the anti-ferromagnetic ferroelectric film 15.

To make the magnetic moments of the pinned layer 12 and the free layer 13 parallel to each other, the relationship between the voltages V1 and V2 is adjusted to V1>V2.

At this time, inside the anti-ferromagnetic ferroelectric film 15, minus electric field is generated on the free layer 13 side and plus electric field is generated on the electrode 17 side.

Therefore, the direction of magnetization of the anti-ferroelectric ferroelectric film 15 is directed upward so that it is parallel to the direction of magnetization (upward) of the pinned layer 12.

Accompanied by this, the direction of magnetization of the free layer 13 turns to the same upward direction as the direction of magnetization of the anti-ferromagnetic ferroelectric film 15 (parallel to the direction of magnetization of the pinned layer 12) due to magnetic coupling with the anti-ferromagnetic ferroelectric film 15.

According to the second basic structure, writing of data to the free layer 13 of the spin FET can be carried out by only the direction of voltage applied to the anti-ferromagnetic ferroelectric film 15, thereby achieving reduced power consumption and high reliability.

Further, at the time of writing, the voltage applied to the anti-ferromagnetic ferroelectric film 15 becomes larger than a voltage applied to the tunnel barrier films 20, 21, thereby preventing destruction of the tunnel barrier films 20, 21.

As shown in FIG. 5, reading is carried out by applying a reading voltage R to the gate electrode 19 to turn ON the spin FET so as to supply reading current in between the electrodes 16 and 17 through the channel area 11c.

If the magnetic moments of the pinned layer 12 and the free layer 13 are parallel, reading current flows when the spin FET is turned ON like an ordinary FET. To the contrary, if the magnetic moments of the pinned layer 12 and the free layer 13 are anti-parallel, no reading current flows even if the spin FET is turned ON.

Thus, according to the second basic structure, the spin FET can be used selectively as an ordinary FET whose switching is controlled by the gate voltage or an FET always in OFF state regardless of the gate voltage, in accordance with data written into the free layer 13. Further, a reconfigurable logic circuit can be achieved by rewriting data in the free layer 13.

According to the second basic structure, a writing voltage V2 may be applied to the semiconductor substrate 11 as back gate bias instead of applying the writing voltage V2 to the gate electrode 19. The writing voltage V2 may be applied to both the semiconductor substrate 11 and the gate electrode 19.

Preferably, the pinned layer 12 and the free layer 13 are comprised of a highly resistant ferromagnetic material such as magnetic semiconductor and magnetic compound in order to achieve a large MR ratio.

As described above, according to the second basic structure, a spin FET with low power consumption and high reliability can be achieved using the anti-ferromagnetic ferroelectric film whose magnetization direction is changed depending on the direction of voltage.

C. Third Basic Structure

FIG. 3 shows a third basic structure of the spin FET.

The third basic structure concerns a tunnel barrier type spin FET which executes writing according to the spin injection writing method.

The semiconductor substrate 10 has two concave portions.

The pinned layer 12 comprised of a ferromagnetic film having perpendicular magnetic anisotropy is formed in one of the two concave portions through the tunnel barrier film 20. The direction of magnetization of the pinned layer 12 is fixed by the anti-ferromagnetic film 14. For example, the magnetization of the pinned layer 12 is fixed to be directed upward.

The free layer 13 comprised of the ferromagnetic film having the perpendicular magnetic anisotropy is formed in the other one of the two concave portions through the tunnel barrier film 21.

Here, one of the tunnel barrier layers 20, 21 may be omitted.

The fixing of magnetization of the pinned layer 12 may be carried out by forming the pinned layer 12 with a sufficient thickness without using the anti-ferromagnetic film 14. Further, the magnetization of the pinned layer 12 may be fixed to be directed downward.

The channel area 11c is disposed between the pinned layer 12 and the free layer 13. When the spin FET is turned ON, a channel is formed in the channel area 11c.

The gate electrode 19 is formed on the channel area 11c through the gate insulation film 18. The cap insulation film 22 which serves as a mask when the gate electrode 19 is processed is formed on the gate electrode 19. The side wall insulation film 23 is formed on the side walls of the gate insulation film 18, the gate electrode 19 and the cap insulation film 22.

The anti-ferromagnetic ferroelectric film 15 is formed on the free layer 13. The anti-ferromagnetic ferroelectric film 15 assists magnetization reversal of the free layer 13.

The material and size of the anti-ferromagnetic ferroelectric film 15 are determined so that the resistance of the anti-ferromagnetic ferroelectric film 15 is larger than the ON resistance of the spin FET.

The electrodes 16, 17 are formed on the anti-ferromagnetic film 14 and the anti-ferromagnetic ferroelectric film 15, respectively.

The electrode 16 is connected to a driver/sinker for generating the spin injection current, that is, the P-channel MOS transistor P1 and the N-channel MOS transistor N1.

Likewise, the electrode 17 is connected to a driver/sinker for generating the spin injection current, that is, the P-channel MOS transistor P2 and the N-channel MOS transistor N2.

In the spin FET having such a structure, writing is carried out by applying a write voltage W to the gate electrode 19 to turn ON the spin FET so as to feed the spin injection current in between the electrodes 16 and 17 through the channel area 11c.

The value of the write data is determined by the direction of the spin injection current. The direction of the spin injection current is controlled by ON/OFF of the P-channel MOS transistors P1, P2 and the N-channel MOS transistors N1, N2 with the control signals A, B, C and D.

A constant voltage is applied to the anti-ferromagnetic ferroelectric film 15 and electric filed is generated inside thereof, when the spin injection current flows. Distortion is generated in the anti-ferromagnetic ferroelectric film 15 due to this, so that magnetization of the anti-ferromagnetic ferroelectric film 15 is inverted. Thus, the magnetization of the anti-ferromagnetic ferroelectric film 15 assists magnetization reversal of the free layer 13.

For example, to make the magnetic moments of the pinned layer 12 and the free layer 13 anti-parallel (opposite in magnetization direction), the spin injection current is supplied from the P-channel MOS transistor P1 to the N-channel MOS transistor N2.

At this time, in the anti-ferromagnetic ferroelectric film 15, plus electric field is generated on the free layer 13 side and minus electric field is generated on the electrode 17 side and first of all, the direction of magnetization of the anti-ferromagnetic ferroelectric film 15 is directed downward (anti-parallel to the direction of magnetization of the pinned layer 12).

Thus, the magnetization of the free layer 13 is directed more easily in the same direction as the direction of magnetization of the anti-ferromagnetic ferroelectric film 15 due to magnetic coupling between the free layer 13 and the anti-ferromagnetic ferroelectric film 15.

Because with this state, the spin injection current flows continuously from the P-channel MOS transistor P1 to the N-channel MOS transistor N2, electron spin-polarized opposite to the direction of magnetization (downward) of the pinned layer 12 is reflected by the pinned layer 12 so as to apply spin torque to electrons in the free layer 13. At the same time, the electron spin-polarized in the same direction (downward) as the direction of magnetization of the anti-ferromagnetic ferroelectric film 15 passes the anti-ferromagnetic ferroelectric film 15 so as to apply spin torque to the electrons in the free layer 13.

As a result, the direction of magnetization of the free layer 13 is directed downward, being anti-parallel to the direction of magnetization of the pinned layer 12.

To make the magnetic moments of the pinned layer 12 and the free layer 13 parallel (in the same direction of magnetization), the spin injection current is supplied from the P-channel MOS transistor P2 to the N-channel MOS transistor N1.

At this time, in the anti-ferromagnetic ferroelectric film 15, minus electric field is generated on the free layer 13 side and plus electric field is generated on the electrode 17 side. First of all, the direction of magnetization of the anti-ferromagnetic ferroelectric film 15 is directed upward (parallel to the direction of magnetization of the pinned layer 12).

Therefore, the magnetization of the free layer 13 is directed more easily in the same direction as the direction of magnetization of the anti-ferromagnetic ferroelectric film 15 due to magnetic coupling between the free layer 13 and the anti-ferromagnetic ferroelectric film 15.

Because the spin injection current flows continuously from the P-channel MOS transistor P2 to the N-channel MOS transistor N1 in this state, electron spin-polarized in the same direction (upward) as the direction of magnetization of the pinned layer 12 passes the pinned layer 12 so as to apply spin torque to electrons in the free layer 13.

As a result, the direction of magnetization of the free layer 13 is directed upward, being parallel to the direction of magnetization of the pinned layer 12.

Because according to the third basic structure, the anti-ferromagnetic ferroelectric film 15 assists spin injection magnetization reversal, the critical current density of the spin injection current can be lessened with respect to a case of carrying out magnetization reversal according to only the spin injection writing method, thereby achieving reduced power consumption and improvement of reliability.

At the time of writing, voltage applied to the anti-ferromagnetic ferroelectric film 15 becomes larger than voltage applied to the tunnel barrier films 20, 21, thereby preventing destruction of the tunnel barrier films 20, 21.

Because reading is carried out in the same manner as the first basic structure (FIG. 5), description thereof is omitted here.

As described above, the third basic structure can achieve a spin FET with low power consumption and high reliability using the anti-ferromagnetic ferroelectric film whose magnetization direction is changed by the direction of voltage.

D. Fourth Basic Structure

Figure 4:
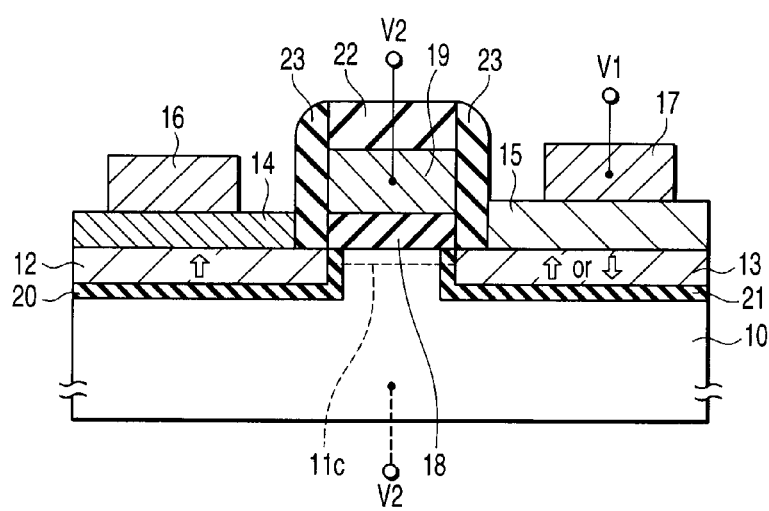
FIG. 4 is a sectional view showing a fourth basic structure of the spin FET.

FIG. 4 shows a fourth basic structure of the spin FET.

The fourth basic structure concerns a tunnel barrier type spin FET which controls write data by the direction of voltage.

Because the device structure is the same as the third basic structure, description thereof is omitted here.

The fourth basic structure controls the direction of magnetization of the free layer 13 by only voltage without using the spin torque.

More specifically, writing of data is carried out by applying the writing voltage V1 to the electrode 17 and the writing voltage V2 to the gate electrode 19 so as to generate electric field inside the anti-ferromagnetic ferroelectric film 15.

For example, when making the magnetic moments of the pinned layer (ferromagnetic film) 12 and the free layer (ferromagnetic film) 13 anti-parallel, the relationship between the voltages V1 and V2 is adjusted to V2>V1.

At this time, inside the anti-ferromagnetic ferroelectric film 13, plus electric field is generated on the free layer 13 side and minus electric field is generated on the electrode 17 side.

Thus, the direction of magnetization of the anti-ferromagnetic ferroelectric film 15 is directed downward, being anti-parallel to the direction of magnetization (upward) of the pinned layer 12.

Accompanied by this, the direction of magnetization of the free layer 13 is directed in the same downward direction as the anti-ferromagnetic ferroelectric film 15 (anti-parallel to the direction of magnetization of the pinned layer 12) due to magnetic coupling with the anti-ferromagnetic ferroelectric film 15.

To make the magnetic moments of the pinned layer 12 and the free layer parallel, the relationship between the voltages V1 and V2 is adjusted to V1>V2.

At this time, inside the anti-ferromagnetic ferroelectric film 15, minus electric field is generated on the free layer 13 side and plus electric field is generated on the electrode 17 side.

Therefore, the direction of magnetization of the anti-ferromagnetic ferroelectric film 15 is directed upward, being parallel to the direction of magnetization of the pinned layer 12.

Accompanied by this, the direction of magnetization of the free layer 13 is directed in the same upward direction as the anti-ferromagnetic ferroelectric film 15 (parallel to the direction of magnetization of the pinned layer 12) due to magnetic coupling with the anti-ferromagnetic ferroelectric film 15.

According to the fourth basic structure, data can be written to the free layer 13 of the spin FET by only the direction of voltage applied to the anti-ferromagnetic ferroelectric film 15, thereby achieving low power consumption and high reliability.

Further, at the time of writing, a voltage applied to the anti-ferromagnetic ferroelectric film 15 becomes larger than a voltage applied to the tunnel barrier films 20, 21, thereby preventing destruction of the tunnel barrier films 20, 21.

Because reading is carried out in the same manner as the first basic structure (FIG. 5), description thereof is omitted.

In the fourth basic structure, the write voltage V2 may be applied to the semiconductor substrate 11 as back gate bias instead of applying the write voltage V2 to the gate electrode 19. Further, the write voltage V2 may be applied to both the semiconductor substrate 11 and the gate electrode 19.

As described, the fourth basic structure can realize a spin FET with lower power consumption and high reliability using the anti-ferromagnetic ferroelectric film whose magnetization direction is changed corresponding to the direction of voltage.

(2) Spin Memory

Next, a case of applying embodiments of the present invention to the spin memory will be described.

Although the structure of the memory cell array is not restricted to any particular one upon application of an embodiment of the present invention, a typical example of the memory cell array to which the present invention can be applied will be described to make the description easy to understand.

Figure 6:
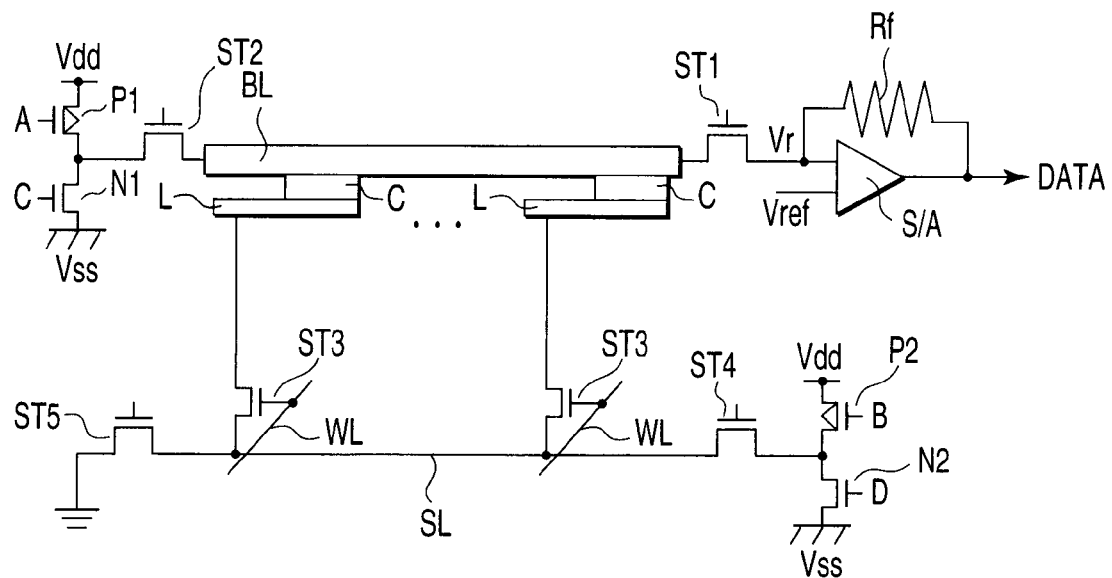
FIG. 6 is a circuit diagram showing an example of a memory cell array of a spin memory.

FIG. 6 shows an example of the memory cell array.

An end of a magnetoresistive element C is connected to a bit line BL.

An end of the bit line BL is connected to a sense amplifier S/A through an N-channel MOS transistor ST1 as a selection switch. The sense amplifier S/A compares a potential Vr read from the magnetoresistive element C with reference potential Vref and outputs an output signal DATA. In the meantime, Rf denotes feedback resistor.

The other end of the bit line BL is connected to the P-channel MOS transistor P1 and the N-channel MOS transistor N1 through an N-channel MOS transistor ST2 as a selection switch.

The other end of the magnetoresistive element C is connected to a lower electrode L. The lower electrode L is connected to a source line SL through a MOS transistor ST3 as a selection switch. The source line SL is connected to the P-channel MOS transistor P2 and the N-channel MOS transistor N2 through an N-channel MOS transistor ST4 as a selection switch.

The source line SL is connected to a grounding point Vss through an N-channel MOS transistor ST5 as a selection switch. The gate of the MOS transistor ST3 is connected to a word line WL. The word line WL is extended in a direction intersecting the extension direction of the bit line BL.

In the spin memory having this structure, writing of data is carried out according to the spin injection writing method. That is, the direction of spin injection current flowing through the magnetoresistive element C is controlled by ON/OFF of the P-channel MOS transistors P1, P2 and the N-channel MOS transistors N1, N2 based on the control signals A, B, C and D so as to execute writing of data.

As for writing of data, a method of executing writing of data to the magnetoresistive element C by only the direction of voltage without depending on the spin injection writing method may be adopted.

Figure 7:
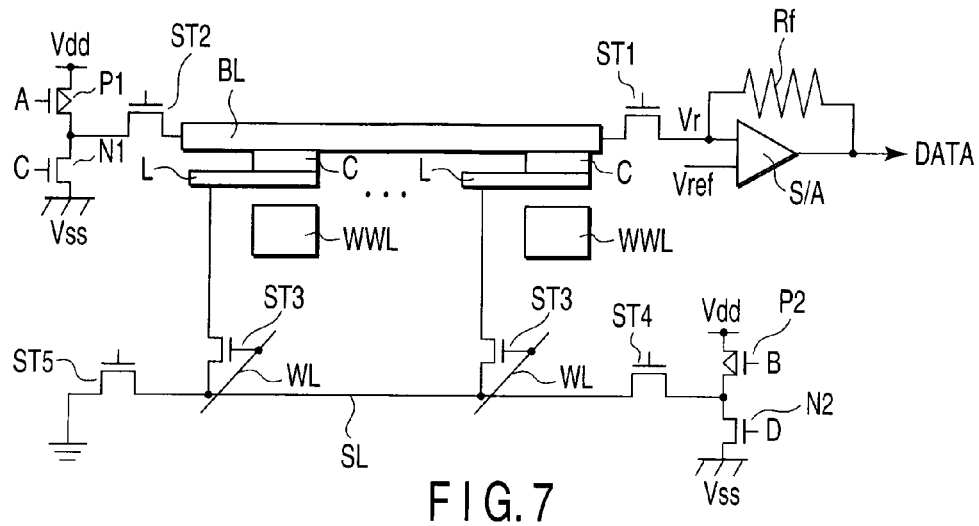
FIG. 7 is a circuit diagram showing an example of a memory cell array of the spin memory.

It is permissible to dispose a write current line WWL in a memory cell array as shown in FIG. 7 and use a magnetic field generated by write current flowing through the write current line WWL as assistance to magnetization reversal.

Hereinafter, the basic structure of the memory cell of the spin memory of the present invention will be described by referring to a memory cell array shown in FIG. 6.

A. First Basic Structure

Figure 8:
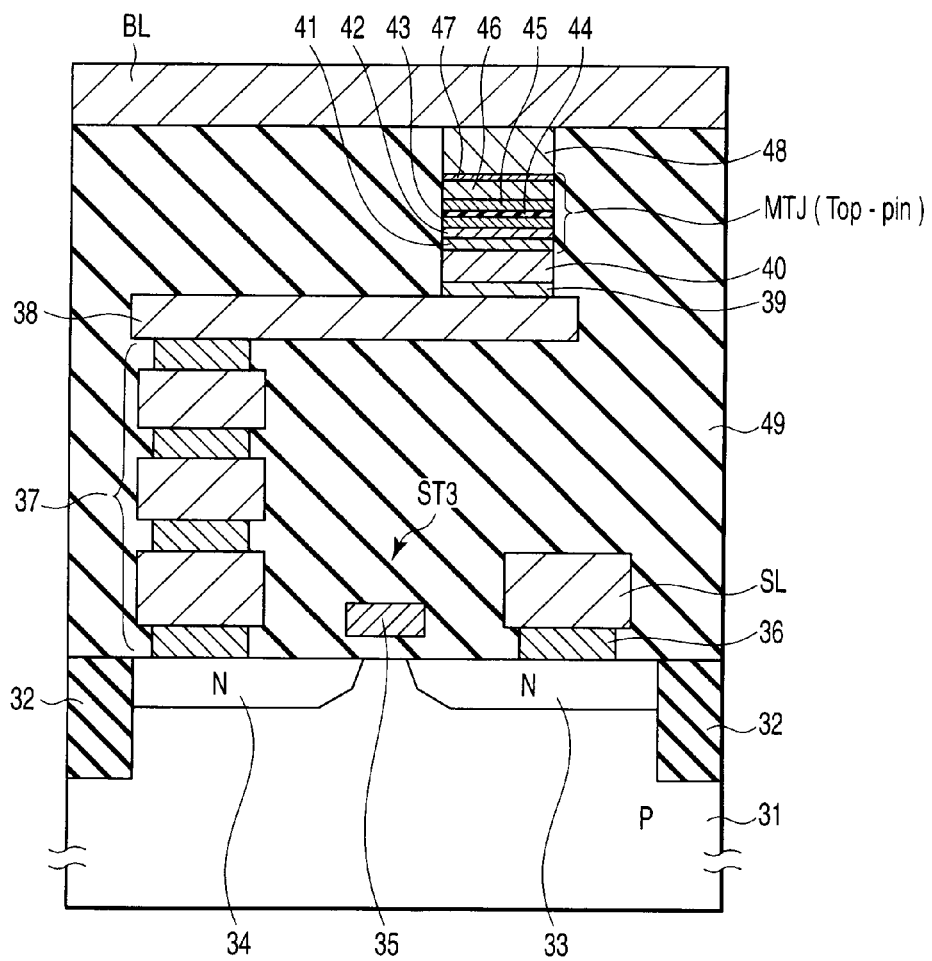
FIG. 8 is a sectional view showing a first basic structure of the spin memory.

FIG. 8 shows a first basic structure of the spin memory.

The first basic structure concerns a spin memory which controls write data according to the direction of the spin injection current and the direction of voltage. In the first basic structure, its magnetoresistive element MTJ has a synthetic anti-ferromagnetic (SAF) structure.

A shallow trench isolation (STI)-structured element separation layer 32 is formed in a semiconductor substrate 31. The N-channel MOS transistor ST3 is formed as a selection switch in an element area surrounded by the element separation layer 32.

The MOS transistor ST3 has a source diffused region 33, a drain diffused region 34 and a gate electrode 35 formed on the top of a channel area between these regions. The gate electrode 35 corresponds to a word line WL in FIG. 6.

The source diffused region 33 is connected to the source line SL through a contact plug 36. The drain diffused region 34 is connected to a lower electrode 38 through an intermediate layer 37.

An amorphous buffer layer 39 is formed on the lower electrode 38. An anti-ferromagnetic ferroelectric film 40 is formed on the amorphous buffer layer 39. A magnetoresistive element MTJ is formed on the anti-ferromagnetic ferroelectric film 40. The magnetoresistive element MTJ is a top-pin type magnetic tunnel junction (MTJ) element.

The material and size of the anti-ferromagnetic ferroelectric film 40 are determined so that resistance of the anti-ferromagnetic ferroelectric film 40 is larger than the maximum value of resistance of the magnetoresistive element (variable resistive element) MTJ.

In this example, the magnetoresistive element MTJ is comprised of a ferromagnetic film 41 on the anti-ferromagnetic ferroelectric film 40, a non-magnetic film 42 on the ferromagnetic film 41, a ferromagnetic film 43 on the non-magnetic film 42, a tunnel barrier film 44 on the ferromagnetic film 43, a ferromagnetic film 45 on the tunnel barrier film 44 and an anti-ferromagnetic film 46 on the ferromagnetic film 45.

The ferromagnetic films 41, 43, 45 have perpendicular magnetic anisotropy.

The free layer has a laminate structure of the ferromagnetic film 41, the non-magnetic film 42 and the ferromagnetic film 43, that is, the SAF structure. The ferromagnetic films 41, 43 are coupled to each other magnetically due to antiferromagnetic interaction.

The pinned layer is comprised of the ferromagnetic film 45 and the direction of magnetization thereof is fixed by the anti-ferromagnetic film 46. The direction of magnetization of the pinned layer may be fixed by increasing the retaining force of the ferromagnetic film 45 instead of application of the anti-ferromagnetic film 46.

It is preferable to fix the direction of magnetization of the pinned layer by the anti-ferromagnetic film 46 from the viewpoints of stability and long-term reliability.

The top face of the magnetoresistive element MTJ is connected to the bit line BL through a cap conductive film 47 having a function of protecting the magnetoresistive element MTJ and a contact layer (for example, metal) 48.

The magnetoresistive element MTJ and selection switch are covered with an insulation layer 49 and the bit line BL is disposed on the insulation layer 49.

In the spin memory having such a structure, writing of data is carried out by turning ON the MOS transistor ST3 to supply the spin injection current to the memory cell.

The value of the write data is determined by controlling the direction of the spin injection current by turning ON/OFF of the P-channel MOS transistors P1, P2 and the N-channel MOS transistors N1, N2 in FIG. 6.

When the spin injection current is flowing, a constant voltage is applied to the anti-ferromagnetic ferroelectric film 40, so that electric field is generated inside thereof. Distortion is generated in the anti-ferromagnetic ferroelectric film 40 due to this and first of all, magnetization of the anti-ferromagnetic ferroelectric film 40 is inverted.

Then, the anti-ferromagnetic ferroelectric film 40 assists a magnetization reversal of the free layer of the magnetoresistive element MTJ.

That is, because the free layer of the magnetoresistive element MTJ is coupled magnetically with the anti-ferromagnetic ferroelectric film 40, its magnetization attempts to be oriented in the same direction as the direction of magnetization of the anti-ferromagnetic ferroelectric film 40.

Therefore, magnetization reversal by the spin polarization electron is carried out more easily in the free layer of the magnetoresistive element MTJ.

Further, the memory cell structure of this example can execute writing of data only by the direction of voltage instead of the spin injection writing method.

Reading of data is carried out by turning ON the MOS transistor ST3 to supply a reading current to the magnetoresistive element MTJ.

The reading current shall be a smaller value than the spin injection current for preventing erroneous writing at the time of reading.

Figure 9:
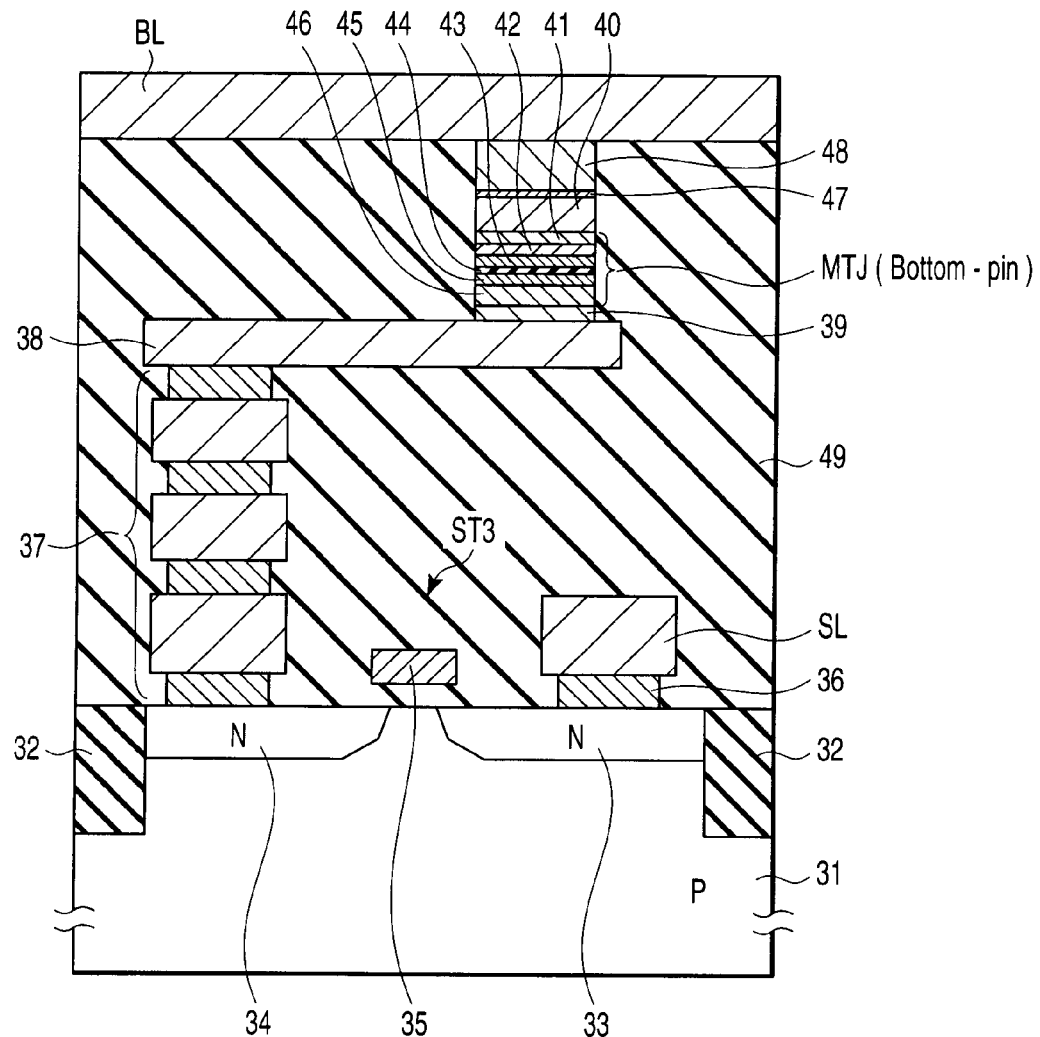
FIG. 9 is a sectional view showing the first basic structure of the spin memory.

Although this example adopts a top-pin type MTJ element, it is not restricted to this type but a bottom-pin type may be adopted as shown in FIG. 9.

In case of the top-pin type, as shown in FIG. 8, the anti-ferromagnetic ferroelectric film 40, the ferromagnetic film 41, the non-magnetic film 42, the ferromagnetic film 43, the tunnel barrier film 44, the ferromagnetic film 45 and the anti-ferromagnetic film 46 are formed in this order on the amorphous buffer layer 39.

Contrary to this, in case of the bottom-pin type, as shown in FIG. 9, the anti-ferromagnetic film 46, the ferromagnetic film 45, the tunnel barrier film 44, the ferromagnetic film 43, the non-magnetic film 42, the ferromagnetic film 41 and the anti-ferromagnetic ferroelectric film 40 are formed in this order on the amorphous buffer layer 39.

Both of them are equal in the other structure.

As described above, the first basic structure can achieve a spin memory with lower power consumption and high reliability using the anti-ferromagnetic ferroelectric film whose magnetization direction is changed depending on the direction of voltage.

B. Second Basic structure

FIG. 10 shows a second basic structure of the spin memory.

The second basic structure concerns a spin memory which controls write data by the direction of spin injection current and the direction of voltage. In the second basic structure, the pinned layer and the free layer of the magnetoresistive element MTJ are comprised of a ferromagnetic film.

An STI-structured element separation layer 32 is formed in the semiconductor substrate 31. An N-channel MOS transistor ST3 is formed as a selection switch in an element area surrounded by the element separation layer 32.

The structure of the MOS transistor ST3 is the same as the first basic structure.

The amorphous buffer layer 39 is formed on the lower electrode 38. The anti-ferromagnetic ferroelectric film 40 is formed on the amorphous buffer layer 39. The magnetoresistive element MTJ is formed on the anti-ferromagnetic ferroelectric film 40. The magnetoresistive element MTJ is a top-pin type MTJ element.

The material and size of the anti-ferromagnetic ferroelectric film 40 are determined so that resistance of the anti-ferromagnetic ferroelectric film 40 is larger than the maximum value of resistance of the magnetoresistive element (variable resistive element) MTJ.

In this embodiment, the magnetoresistive element MTJ is comprised of the ferromagnetic film 43 on the anti-ferromagnetic ferroelectric film 40, the tunnel barrier film 44 on the ferromagnetic film 43, the ferromagnetic film 45 on the tunnel barrier film 44 and the anti-ferromagnetic film 46 on the ferromagnetic film 45.

The ferromagnetic films 43, 45 have perpendicular magnetic anisotropy.

The free layer is comprised of the ferromagnetic film 43. The pinned layer is comprised of the ferromagnetic film 45 and the direction of magnetization is fixed by the anti-ferromagnetic film 46. The direction of magnetization of the pinned layer may be fixed by increasing the retaining force of the ferromagnetic film 45 instead of application of the anti-ferromagnetic film 46.

It is preferable to fix the direction of magnetization of the pinned layer by the anti-ferromagnetic film 46 from the viewpoints of stability and long-term reliability.

The top face of the magnetoresistive element MTJ is connected to the bit line BL through the cap conductive film 47 having a function of protecting the magnetoresistive element MTJ and the contact layer (for example, metal) 48.

The magnetoresistive element MTJ and the selection switch are covered with the insulation layer 49 and the bit line BL is disposed on the insulation layer 49.

In the spin memory having such a structure, writing of data is carried out by turning ON the MOS transistor ST3 to supply the spin injection current to the memory cell.

The value of the write data is determined by controlling the direction of the spin injection current by turning ON/OFF the P-channel MOS transistors P1, P2 and the N-channel MOS transistors N1, N2 in FIG. 6.

When the spin injection current is flowing, a constant voltage is applied to the anti-ferromagnetic ferroelectric film 40, so that electric field is generated inside thereof. Distortion is generated in the anti-ferromagnetic ferroelectric film 40 due to this and first of all, magnetization of the anti-ferromagnetic ferroelectric film 40 is inverted.

Therefore, like the first basic structure, the anti-ferromagnetic ferroelectric film 40 assists magnetization reversal of the free layer of the magnetoresistive element MTJ.

In the meantime, the memory cell structure of this embodiment can execute writing of data only by the direction of voltage instead of the spin injection writing method.

Like the first basic structure, reading of data is carried out by turning ON the MOS transistor ST3 to supply reading current to the magnetoresistive element MTJ.

Figure 11:
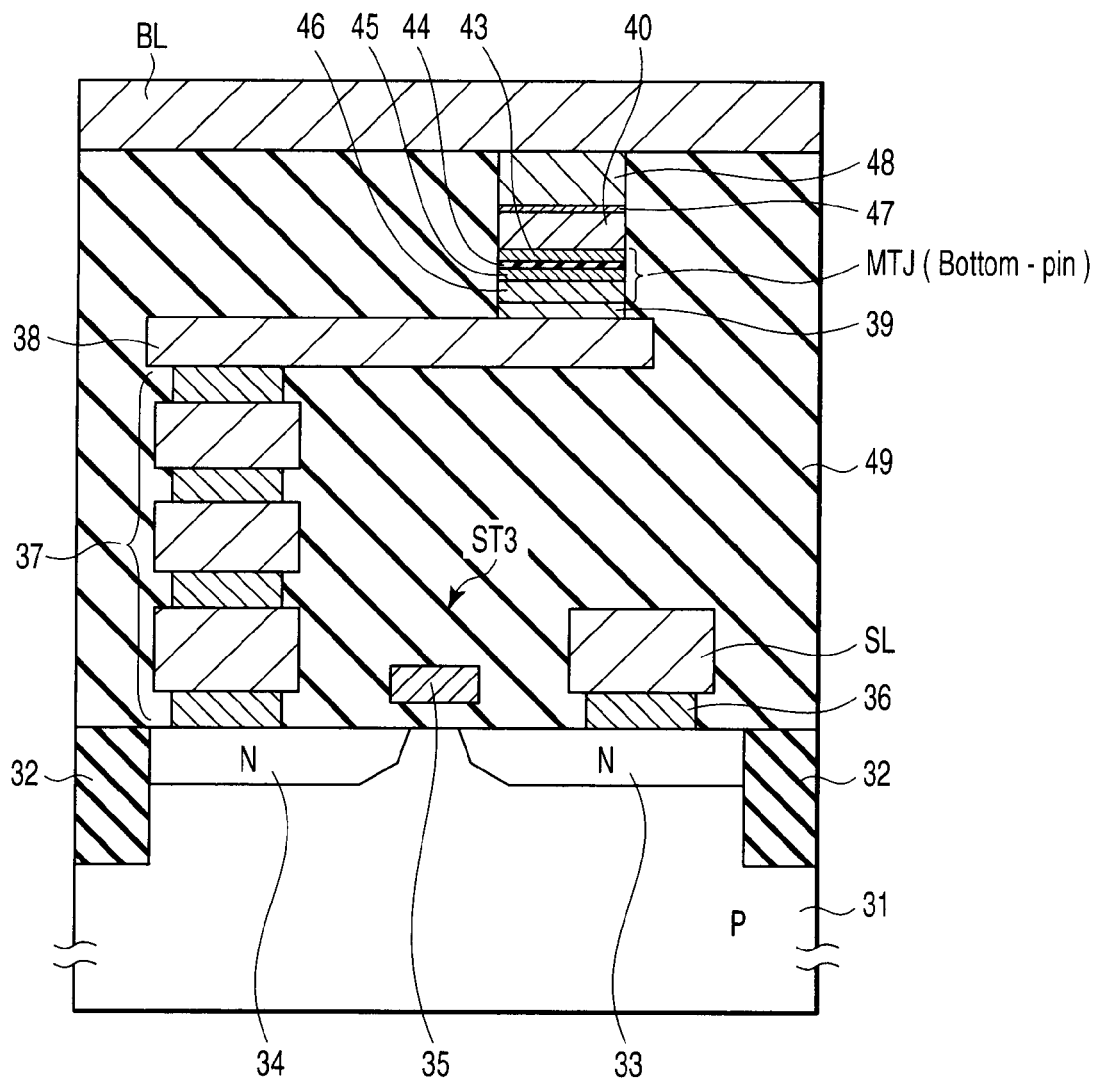
FIG. 11 is a sectional view showing the second basic structure of the spin memory.

Although this example adopts a top-pin type MTJ element, it is not restricted to this type but a bottom-pin type may be adopted as shown in FIG. 11.

In case of the top-pin type, as shown in FIG. 10, the anti-ferromagnetic ferroelectric film 40, the ferromagnetic film 43, the tunnel barrier film 44, the ferromagnetic film 45 and the anti-ferromagnetic film 46 are formed in this order on the amorphous buffer layer 39.

Contrary to this, in case of the bottom-pin type, as shown in 11, the anti-ferromagnetic film 46, the ferromagnetic film 45, the tunnel barrier film 44, the ferromagnetic film 43, and the anti-ferromagnetic ferroelectric film 40 are formed in this order on the amorphous buffer layer 39.

Both of them are equal in the other structure.

As described above, the second basic structure can achieve a spin memory with lower power consumption and high reliability using the anti-ferromagnetic ferroelectric film whose magnetization direction is changed depending on the direction of voltage.

C. Third Basic Structure

Figure 12:
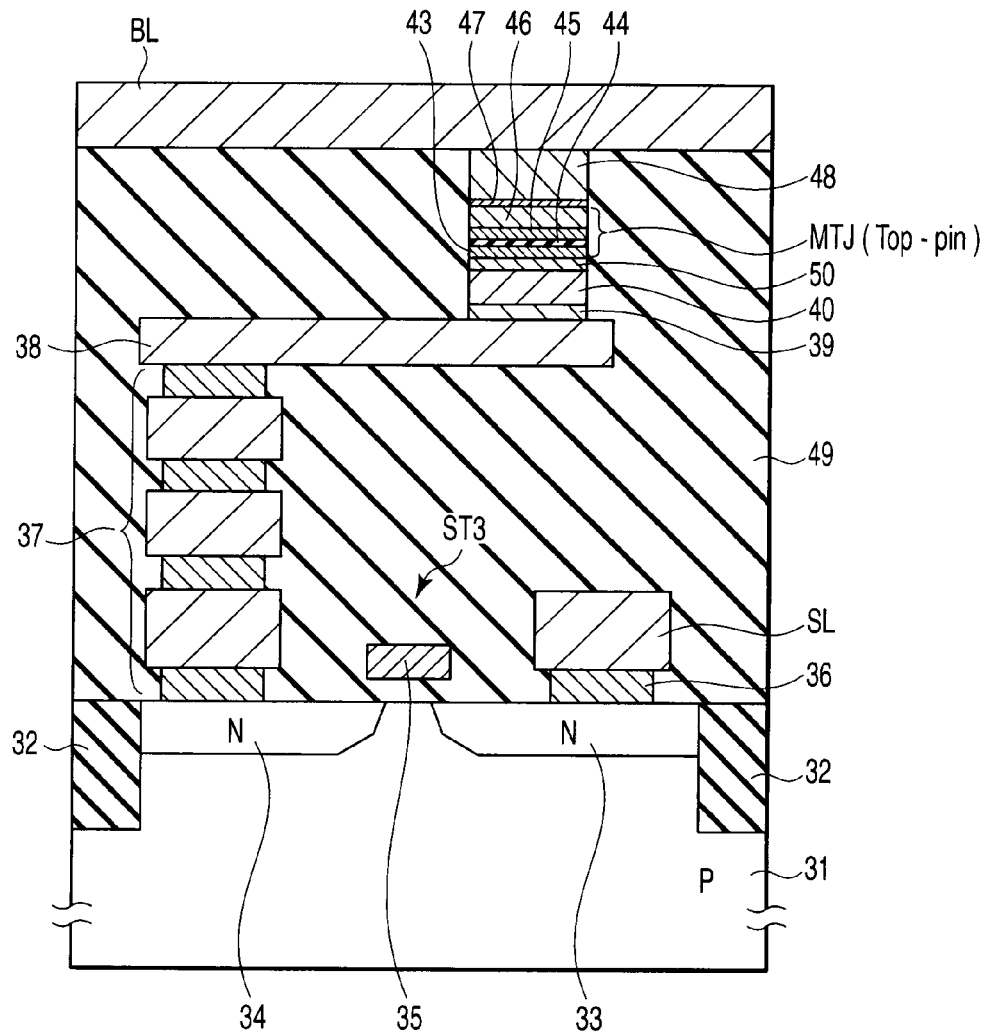
FIG. 12 is a sectional view showing a third basic structure of the spin memory.

FIG. 12 shows a third basic structure of the spin memory.

The third basic structure concerns a spin memory which controls write data by the direction of spin injection current or the direction of voltage. In the third basic structure, the non-magnetic film is disposed between the ferromagnetic film as the free layer and the anti-ferromagnetic ferroelectric film.

The STI-structured element separation layer 32 is formed in the semiconductor substrate 31. An N-channel MOS transistor ST3 is formed as a selection switch in an element area surrounded by the element separation layer 32.

The structure of the MOS transistor ST3 is the same as the first basic structure.

The amorphous buffer layer 39 is formed on the lower electrode 38. The anti-ferromagnetic ferroelectric film 40 is formed on the amorphous buffer layer 39. A non-magnetic film 50 is formed on the anti-ferromagnetic ferroelectric film 40.

The magnetoresistive element MTJ is formed on the non-magnetic film 50. The magnetoresistive element MTJ is a top-pin type MTJ element.

The material and size of the anti-ferromagnetic ferroelectric film 40 are determined so that resistance of the anti-ferromagnetic ferroelectric film 40 is larger than the maximum value of resistance of the magnetoresistive element (variable resistive element) MTJ.

In this embodiment, the magnetoresistive element MTJ is comprised of the ferromagnetic film 43 on the non-magnetic film 50, the tunnel barrier film 44 on the ferromagnetic film 43, the ferromagnetic film 45 on the tunnel barrier film 44 and the anti-ferromagnetic film 46 on the ferromagnetic film 45.

The ferromagnetic films 43, 45 have perpendicular magnetic anisotropy.

The free layer is comprised of the ferromagnetic film 43. The pinned layer is comprised of the ferromagnetic film 45 and the direction of magnetization thereof is fixed by the anti-ferromagnetic film 46. The direction of magnetization of the pinned layer may be fixed by increasing the retaining force of the ferromagnetic film 45 instead of application of the anti-ferromagnetic film 46.

It is preferable to fix the direction of magnetization of the pinned layer by the anti-ferromagnetic film 46 from the viewpoints of stability and long-term reliability.

The non-magnetic film 50 is disposed to adjust the magnitude of magnetic coupling between the anti-ferromagnetic ferroelectric film 40 and the ferromagnetic film 43 as the free layer. Because the material of the non-magnetic film 50 is not restricted to any particular one, for example, insulator and conductor may be used.

The non-magnetic film 50 is preferably comprised of precious metal.

The top face of the magnetoresistive element MTJ is connected to the bit line BL through the cap conductive film 47 having a function of protecting the magnetoresistive element MTJ and the contact layer (for example, metal) 48.

The magnetoresistive element MTJ and the selection switch are covered with the insulation layer 49 and the bit line BL is disposed on the insulation layer 49.

In the spin memory having such a structure, writing of data is carried out by turning ON the MOS transistor ST3 to supply the spin injection current to the memory cell.

The value of the write data is determined by controlling the direction of the spin injection current by turning ON/OFF the P-channel MOS transistors P1, P2 and the N-channel MOS transistors N1, N2 in FIG. 6.

When the spin injection current is flowing, a constant voltage is applied to the anti-ferromagnetic ferroelectric film 40, so that electric field is generated inside thereof. Distortion is generated in the anti-ferromagnetic ferroelectric film 40 due to this and first of all, magnetization of the anti-ferromagnetic ferroelectric film 40 is inverted.

Therefore, like the first basic structure, the anti-ferromagnetic ferroelectric film 40 assists magnetization reversal of the free layer of the magnetoresistive element MTJ.

In the meantime, the memory cell structure of this embodiment can execute writing of data only by the direction of voltage instead of the spin injection writing method.

Like the first basic structure, reading of data is carried out by turning ON the MOS transistor ST3 to supply reading current to the magnetoresistive element MTJ.

Figure 13:
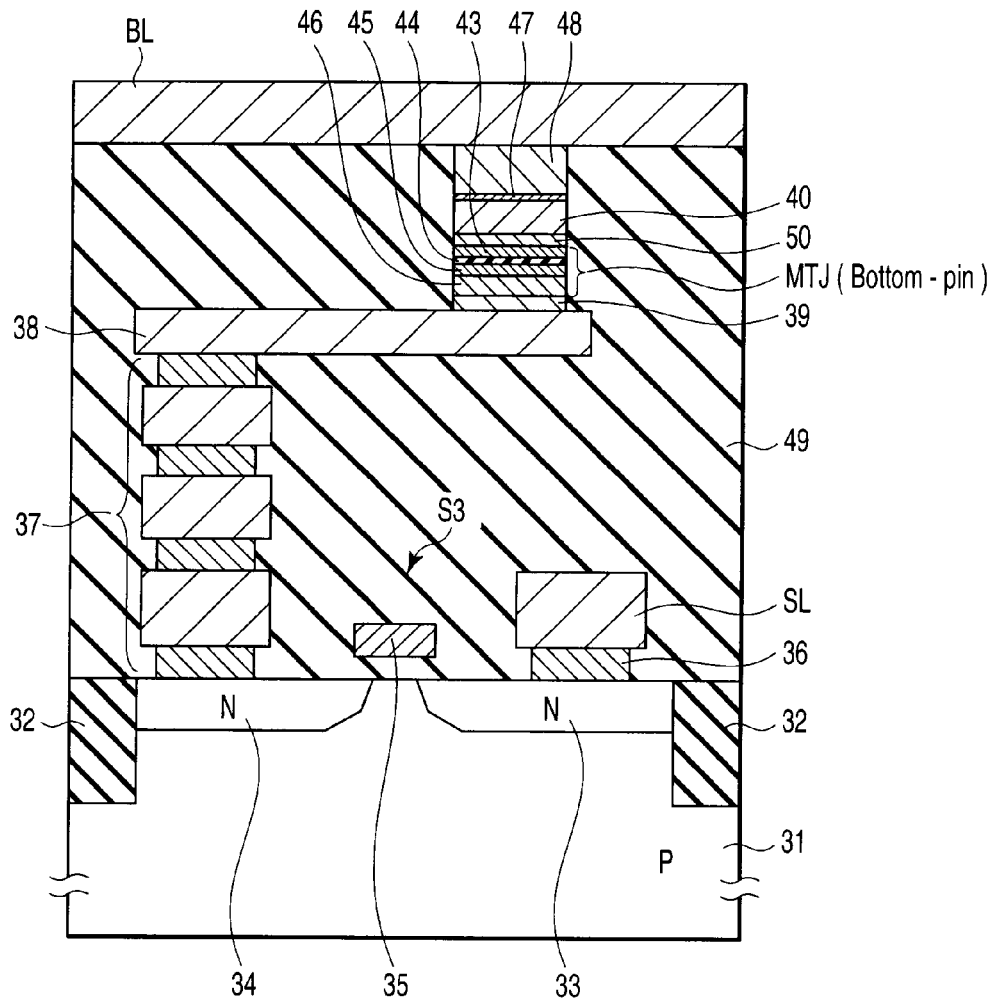
FIG. 13 is a sectional view showing the third basic structure of the spin memory.

Although this example adopts a top-pin type MTJ element, it is not restricted to this type but a bottom-pin type may be adopted as shown in FIG. 13.

In case of the top-pin type, as shown in FIG. 12, the anti-ferromagnetic ferroelectric film 40, the non-magnetic film 50, the ferromagnetic film 43, the tunnel barrier film 44, the ferromagnetic film 45 and the anti-ferromagnetic film 46 are formed in this order on the amorphous buffer layer 39.

Contrary to this, in case of the bottom-pin type, as shown in FIG. 13, the anti-ferromagnetic film 46, the ferromagnetic film 45, the tunnel barrier film 44, the ferromagnetic film 43, the non-magnetic film 50 and the anti-ferromagnetic ferroelectric film 40 are formed in this order on the amorphous buffer layer 39.

Both of them are equal in the other structure.

As described above, the third basic structure can achieve a spin memory with lower power consumption and high reliability using the anti-ferromagnetic ferroelectric film whose magnetization direction is changed depending on the direction of voltage.

D. Structure of Magnetoresistive Element

The spin memory of the present invention has a feature in applying the anti-ferromagnetic ferroelectric film 40 to the magnetoresistive element MTJ. Therefore, the structure of the magnetoresistive element MTJ is not restricted to the first to third basic structures.

Although the magnetoresistive elements MTJ include two types, top-pin type and bottom-pin type, the top-pin type is more preferable than the bottom-pin type from the viewpoints of manufacturing process and element characteristic.

(3) Others

The aspect ratio of the ferromagnetic film will be described.

The aspect ratio mentioned here refers to a ratio between the maximum width hmax and the minimum width hmin (hmax/hmin) of a flat shape of the ferromagnetic film.

If the ferromagnetic film is rectangular, the maximum width hmax is the length of the long side while the minimum width hmin is the length of the short side. If the ferromagnetic film is elliptic, the maximum width hmax is the length of its long axis and the minimum width hmin is the length of the short axis.

The aspect ratio of the ferromagnetic film (perpendicular magnetic film) for use in the spin FET and the spin memory of the present invention is set to 1 or more.

Although magnetization of the ferromagnetic film is directed more easily in a perpendicular direction to film surface if the aspect ratio is 1 or in a range in the vicinity of 1, the direction of magnetization of the ferromagnetic film is tilted gradually from the direction perpendicular to the film surface as the aspect ratio is increased.

That is, if the aspect ratio exceeds 1, the direction of magnetization θ of the ferromagnetic film is directed easily to $0°<θ<90°$ with respect to the film surface.

Although in the embodiment of the present invention, there is no problem even if the direction of magnetization of the ferromagnetic film is tilted to some extent from the perpendicular direction to the film surface, it is not preferable that this tilting angle θ is increased excessively. Thus, the upper limit value of the aspect ratio is preferred to be a value in which the magnetization of the ferromagnetic film is substantially perpendicular to the film surface, that is, 3 or more.

3. Example of Material

The example of material of the spin FET and the spin memory of the embodiment of the present invention will be described.

The anti-ferromagnetic ferroelectric film is $Cr_2O_3$ and the like.

In case of $Cr_2O_3$, if the crystalline structure is (111) oriented and electric field is in [111] direction, magnetization can be changed in the [111] direction.

The ferromagnetic film which comprises the pinned layer and the free layer is comprised of for example, laminated first and second thin films.

The first thin film is comprised of at least one of an amorphous material such as Ni—Fe, Co—Fe, Co—Fe—Ni and Co—Fe—B, Heusler alloy such as $Co_2FeSi_{1-x}Al_x$ (0.25≤x≤0.75), $Co_2MnGe$, $Co_2Mn_{1-x}Fe_xSi$ (0.25≤x≤0.75) and $Co_2MnSi$, and a magnetic semiconductor such as SiMn, GeMn, $Fe_3Si$ and $Fe_3Ge$.

In case of $Co_2Mn_{1-x}Fe_xSi$, the composition range of Mn and Fe is in the range of 0.25≤x≤0.75 and more preferably, it is x=0.5.

The second thin film is comprised of a material having perpendicular magnetic anisotropy, such as FePt, Co/Pt and Co/Ni.

A-B means alloy containing elements A, B and A-B-C means alloy containing elements A, B, C. A/B means a structure in which the film A and the film B are laminated.

The tunnel barrier film is comprised of oxide or nitride of a material selected from the group comprising of Si, Ge, Al, Ga, Mg and Ti.

Preferably, the thickness of the tunnel barrier film is set in the range of 0.1 nm to 100 nm.

The semiconductor substrate may be comprised of semiconductor such as Si or may be comprised of compound semiconductor such as GaAs and ZnSe.

Because in the former case, it is difficult to form the tunnel barrier film directly on Si, Ge is disposed between Si and the tunnel barrier film. In the latter case, the tunnel barrier film may be formed directly on GaAs, ZnSe.

The embodiment of the present invention is on the premise that the pinned layer and the free layer have perpendicular magnetic anisotropy. In this case, by using $Cr_2O_3$ as the material of the anti-ferromagnetic ferroelectric film, the critical magnetic field or the critical current density can be reduced largely.

The non-magnetic film comprised of precious metal such as Pt, Pd may be inserted in between the free layer (ferromagnetic film) of the spin FET and the anti-ferromagnetic ferroelectric film.

Figure 14:
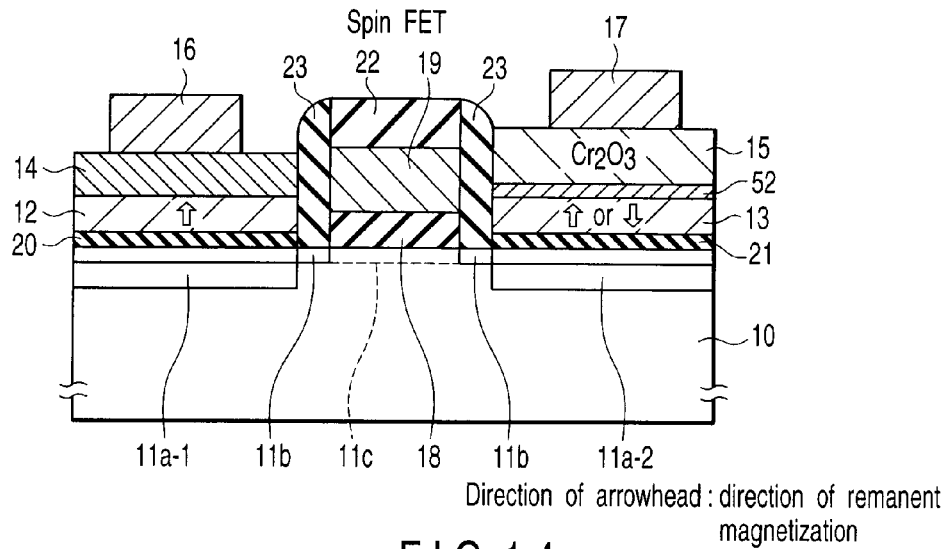
FIG. 14 is a sectional view showing an example of a material of the spin FET.
Figure 15:
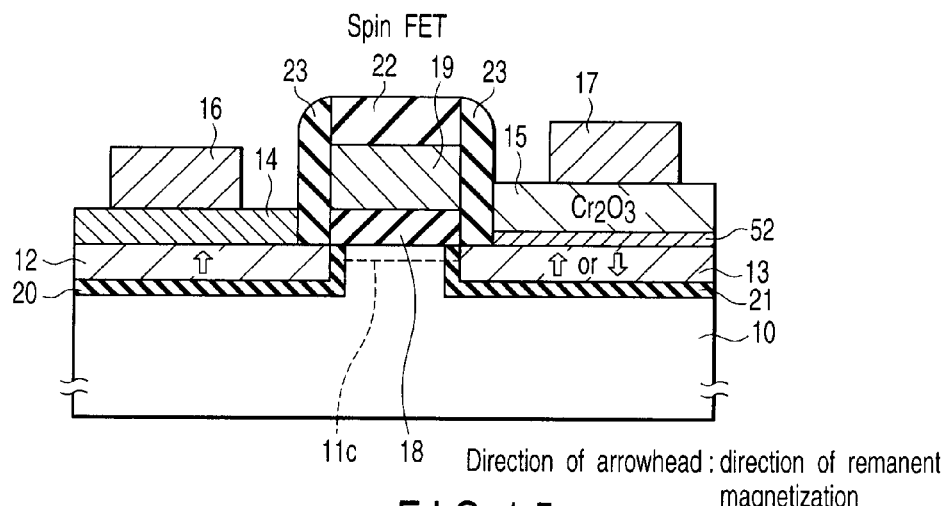
FIG. 15 is a sectional view showing an example of a material of the spin FET.

For example, if $Cr_2O_3$ is used as the anti-ferromagnetic ferroelectric film, a non-magnetic film 52 comprised of precious metal such as Pt, Pd is disposed in between the free layer 13 and the anti-ferromagnetic ferroelectric film 15 as shown in FIGS. 14 and 15.

Likewise, the non-magnetic film comprised of precious metal such as Pt, Pd may be inserted in between the free layer (ferromagnetic film) of the spin memory and the anti-ferromagnetic ferroelectric film.

Figure 16:
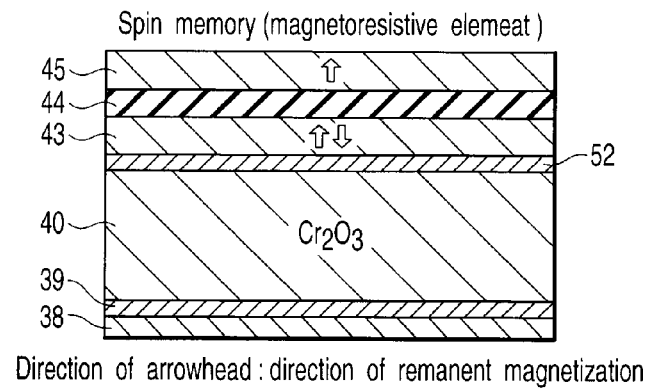
FIG. 16 is a sectional view showing an example of a material of the memory cell of the spin memory.

For example, if $Cr_2O_3$ is used as the anti-ferromagnetic ferroelectric film, as shown in FIG. 16, the non-magnetic film 52 comprised of precious metal such as Pt, Pd is disposed between the free layer 43 and the anti-ferromagnetic ferroelectric film 40.

Figure 18:
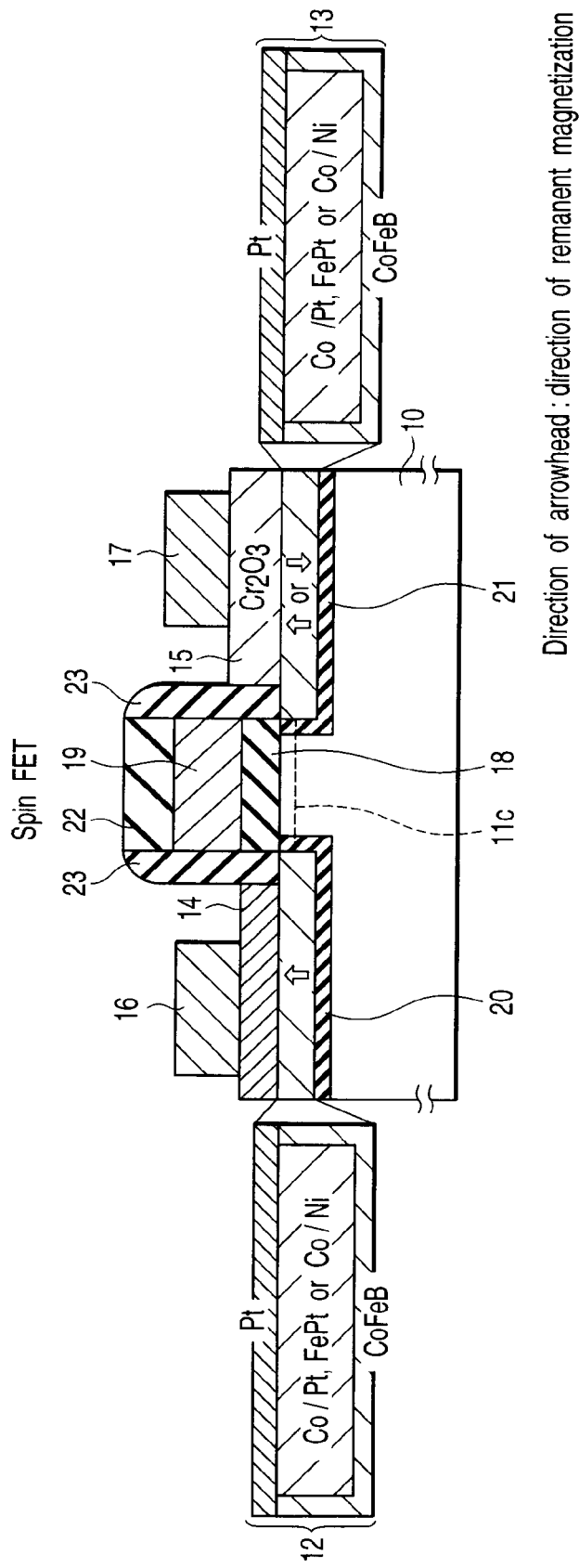
FIG. 18 is a sectional view showing an example of a material of the spin FET.
Figure 19:
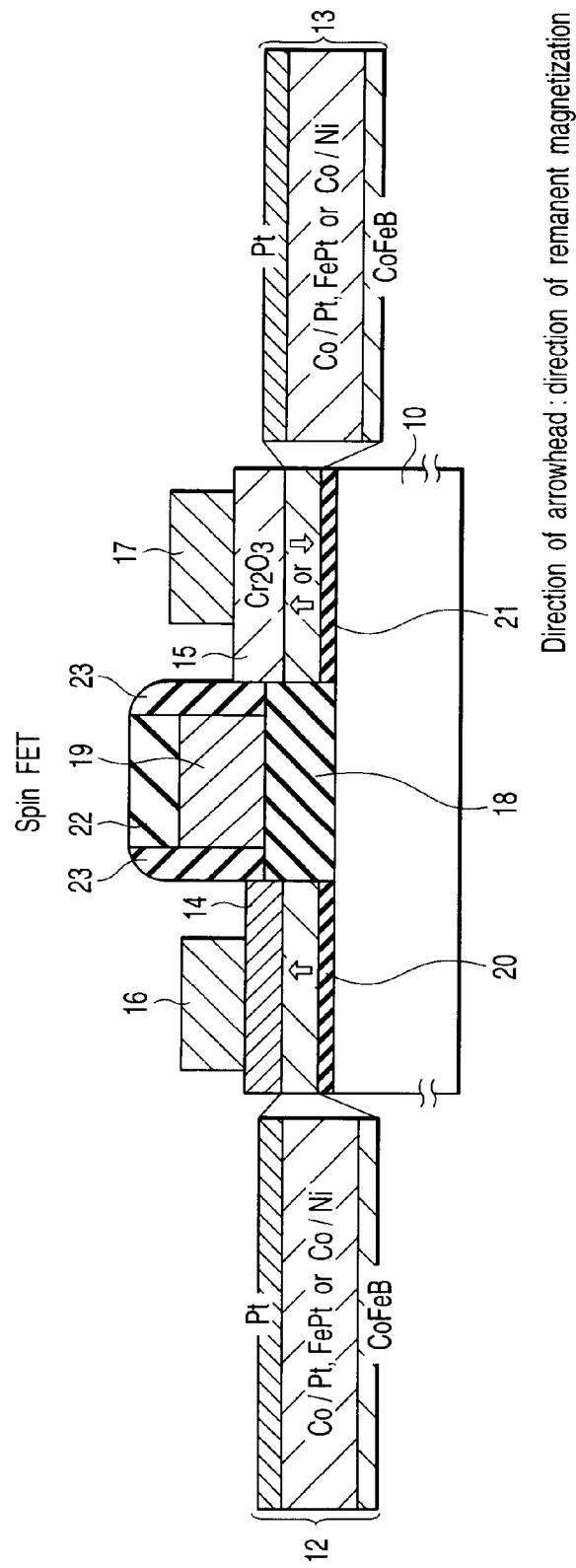
FIG. 19 is a sectional view showing an example of a material of the spin FET.

If $Cr_2O_3$ is used as the anti-ferromagnetic ferroelectric film, as shown in FIGS. 17 to 19, the pinned layer 12 and the free layer 13 of the spin FET are respectively comprised of full Heusler alloy such as CoFeB having a large MR ratio disposed in a portion which makes contact with the tunnel barrier films 20, 21 and the ferromagnetic film having perpendicular magnetic anisotropy such as Co/Pt, FePt and Co/Ni disposed in a portion which makes no contact with the tunnel barrier films 20, 21.

Figure 20:
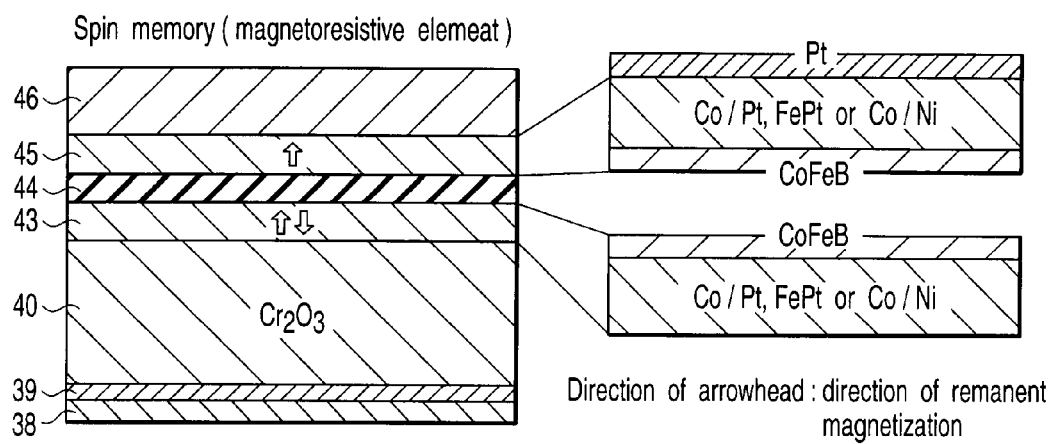
FIG. 20 is a sectional view showing an example of a material of the memory cell of the spin memory.

Likewise, as shown in FIG. 20, the pinned layer 45 and the free layer 43 of the spin memory are respectively comprised of full Heusler alloy such as CoFeB having a large MR ratio disposed in the portion which makes contact with the tunnel barrier film 44 and the ferromagnetic film having perpendicular magnetic anisotropy such as Co/Pt, FePt and Co/Ni disposed in the portion which makes no contact with the tunnel barrier film 44.

In this case, a large MR ratio can be obtained with full Heusler alloy and at the same time, the magnetization of the full Heusler alloy can be directed in a perpendicular direction (upward direction or downward direction) with the ferromagnetic film having perpendicular magnetic anisotropy such as Co/Pt, FePt and Co/Ni.

The full Heusler alloy includes Co—Fe, Co—Fe—Ni, Ni—Fe(Fe rich), $Co_2FeSi_{1-x}Al_x$ as well as Co—Fe—B.

In FIGS. 17 to 20, the non-magnetic film comprised of precious metal (for example, Ru, Rh) may be disposed between the free layer and the anti-ferromagnetic ferroelectric film as shown in FIGS. 14 to 16.

The ferromagnetic film as the pinned layer and the free layer must not be of super paramagnetism and for this purpose, preferably, its thickness is set to 0.4 nm or more.

If MgO is used as the tunnel barrier film and full Heusler alloy such as Co—Fe—B and $Co_2FeSi_{1-x}Al_x$ is used as the ferromagnetic film by combination, a larger MR ratio can be achieved.

The anti-ferromagnetic film for fixing the direction of magnetization of the pinned layer uses one material selected from the group comprising of Fe(iron)-Mn(manganese), Pt(platinum)-Mn(manganese), Pt(platinum)-Cr(chromium)-Mn (manganese), Ni(nickel)-Mn(manganese), Ir(iridium)-Mn (manganese), NiO(nickel oxide) and $Fe_2O_3$(iron oxide).

The physical properties such as magnetic property, crystalline property, mechanical property and chemical property of the ferromagnetic film and anti-ferromagnetic film may be adjusted by adding non-magnetic elements such as Ag (silver), Cu (copper), Au (gold), Al (aluminum), Ru (ruthenium), Os (osmium), Re (rhenium), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium) and B (boron).

In the ferromagnetic film as the pinned layer, fixing of the magnetization direction is intensified by adopting a three-layer structure, for example, Co(Co—Fe)/Ru/Co(CoFe), Co(Co—Fe)/Ir/Co(CoFe), Co(Co—Fe)/Os/Co(CoFe), Co(Co—Fe)/Re/Co(CoFe), amorphous material like Co—Fe—B/Ru/Co—Fe, amorphous material like Co—Fe—B/Ir/Co—Fe, amorphous material like Co—Fe—B/Os/Co—Fe, amorphous material like Co—Fe—B/Re/Co—Fe.

The non-magnetic film is comprised of Ag (silver), Cu (copper), Au (gold), Al (aluminum), Ru (ruthenium), Os (osmium), Re (rhenium), Si (silicon), Bi (bismuth), Ta (tantalum), B (boron), C (carbon), Pd (palladium), Pt (platinum), Zr (zirconium), Ir (iridium), W (tungsten), Mo (molybdenum), Nb (niobium) or an alloy thereof.

Use of these materials makes it difficult for magnetic field from the bit line or the word line to influence the pinned layer, thereby fixing magnetization of the pinned layer securely. Further, because stray field from the pinned layer can be reduced or adjusted, the condition for magnetization reversal of the ferromagnetic film as the free layer can be controlled based on the thickness of the ferromagnetic film as the pinned layer.

The spin FET may be structured in stack gate in which a floating gate is disposed between the gate insulation film and the gate electrode. A reconfigurable logic circuit may be constructed by combining the spin FET with an ordinary CMOS circuit (N-channel MOS transistor and P-channel MOS transistor).

4. Manufacturing Method

Next, a manufacturing method according to the embodiment of the present invention will be described.

Because the memory cell of the spin memory is formed by only patterning by stacking a plurality of films simply, the method of manufacturing the spin FET will be described here.

(1) First Example

FIGS. 21 to 26 show a first example of the method of manufacturing the spin FET.

In the spin FET formed according to this manufacturing method, the ferromagnetic film filled in a concave portion of the semiconductor substrate serves as a source/drain area.

Figure 21:
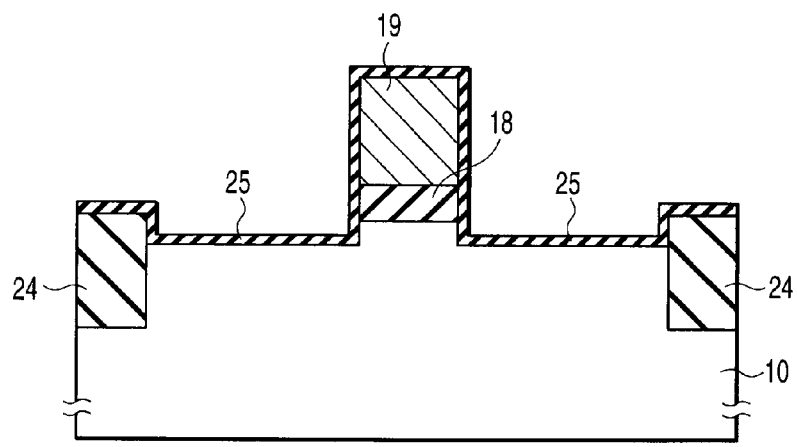
FIG. 21 is a sectional view showing a first example of a method of manufacturing the spin FET.

First, as shown in FIG. 21, the STI-structured element separation layer 24 is formed in the semiconductor substrate (for example, silicon substrate) 11 using any method of chemical vapor deposition (CVD), photo engraving process (PEP) or reactive ion etching (RIE). The element separation layer 24 may be constructed in LOCOS structure instead of the STI structure.

An insulation film is formed on the semiconductor substrate 11 according to thermal oxidation method, subsequently, a conductive poly-silicon film containing impurity is formed on the insulation film according to the CVD method and after that, a resist pattern is formed on the conductive poly-silicon film.

With this resist pattern as a mask, the conductive poly-silicon film and the insulation film are etched by RIE so as to form the gate insulation film 18 and the gate electrode 19. If subsequently, the semiconductor substrate 11 is etched by RIE using fluorine ion, concave portions are formed on the right and left sides of the gate electrode 19 of the semiconductor substrate 11. After that, the resist pattern is removed.

Then, the tunnel barrier film 25 covering at least the surface of the concave portion in the semiconductor substrate 11 is formed according to the sputtering method.

Next, the ferromagnetic film 26 which fills the concave portion in the semiconductor substrate 11 is formed according to a strongly directional sputtering method as shown in FIG. 22.

As shown in FIG. 23, one of the two concave portions in the semiconductor substrate 11 is covered with a mask material and the ferromagnetic film 26 in the concave portion not covered with the mask material is removed. After that, the mask material is removed.

Next, as shown in FIG. 24, the ferromagnetic ferroelectric film 27 which fills the concave portion in the semiconductor substrate 11 is formed again according to the strongly directional sputtering method.

As shown in FIG. 25, the other one of the two concave portions of the semiconductor substrate 11 is covered with a mask material and the anti-ferromagnetic ferroelectric film 27 existing on the ferromagnetic film 26 in the concave portion not covered with any mask material is removed. After that, the mask material is removed.

Figure 26:
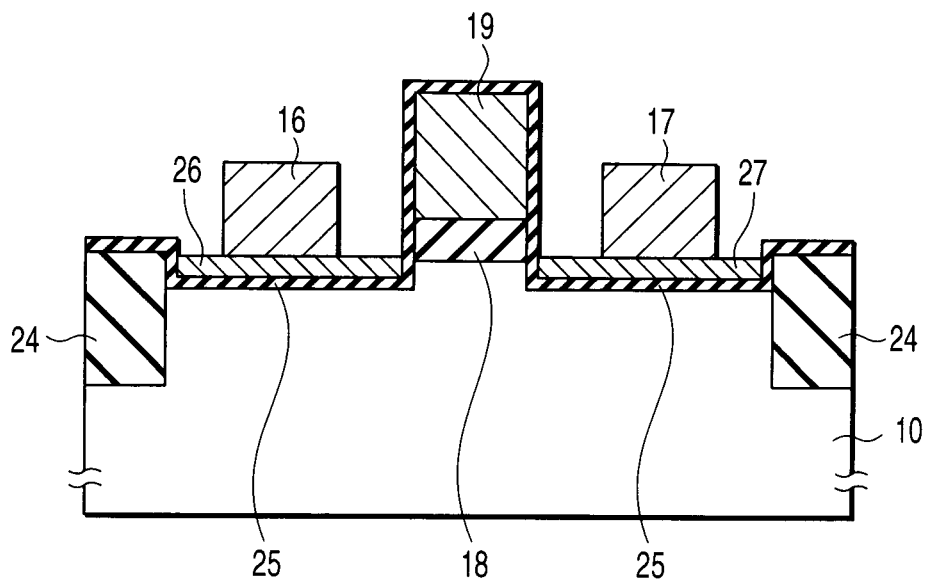
FIG. 26 is a sectional view showing the first example of the method of manufacturing the spin FET.

If as shown in FIG. 26, the electrodes 16, 17 are formed on the ferromagnetic film 26 and the anti-ferromagnetic ferroelectric film 27, respectively, according to the sputtering method, the spin FET is completed.

As described above, according to the first manufacturing method, the tunnel barrier type spin FET in which the source/drain areas are comprised of a ferromagnetic body can be formed easily.

(2) Second Example

FIGS. 27 to 40 show a second example of the method of manufacturing the spin FET.

The spin FET formed by this manufacturing method has a feature in that the pinned layer and the free layer as the ferromagnetic films are disposed on the source/drain diffused layer of an ordinary MOSFET.

Figure 27:
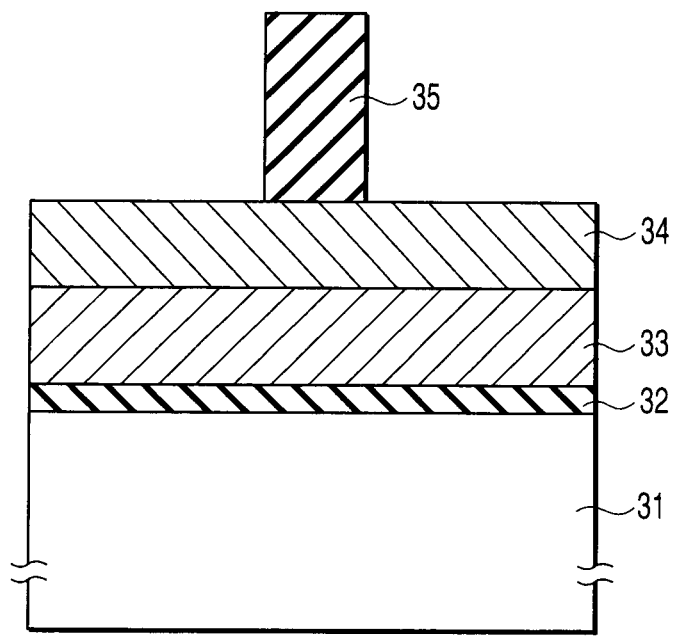
FIG. 27 is a sectional view showing a second example of the method of manufacturing the spin FET.

As shown in FIG. 27, the insulation film (for example, $AlO_x$, MgO) 32, the conductive film (for example, Ta) 33 and the conductive film (for example, Ti) 34 are formed successively on the semiconductor substrate (for example, Si, Ge) 31. The resist pattern 35 is formed on the conductive film 34 by first photo engraving process (PEP).

After that, the conductive films 34, 35 are etched by RIE with the resist pattern 35 as a mask so as to form gate electrodes 33G, 34G of the MOSFET as shown in FIG. 28. After that, the resist pattern 35 in FIG. 27 is removed.

The MOSFET may be comprised of only a gate electrode 33G. In this case, a step of forming the conductive film 34 in FIG. 27 is omitted.

After that, impurity is injected into the semiconductor substrate 31 by the ion injection method so as to form an extension area 37. After a side wall insulation film (for example, $SiO_2$) 36 is formed on the side wall of the gate electrodes 33G, 34G, again, impurity is injected into the semiconductor substrate 31 according to the ion injection method so as to form a source/drain area 38.

When the gate electrodes 33G, 34G are processed, part of the insulation film 32 is etched as shown in FIG. 28.

Consequently, the insulation film 32 just below the gate electrodes 33G, 34G serves as a gate insulation film and the thickness of the insulation films 32 existing on both sides of the gate electrodes 33G, 34G is decreased by etching so that it turns to a tunnel barrier film.

However, in order to improve the quality of the tunnel barrier film, it is permissible to peel the insulation film 32 on the source/drain area 38 after ions are injected so as to form the insulation film 32 again as the tunnel barrier film.

In this case, the materials of the gate insulation film and the tunnel barrier film can be differentiated. For example, it is possible to form the gate insulation film of $SiO_2$ and the tunnel barrier film of $AlO_2$ or MgO.

As shown in FIG. 28, an interlayer insulation film (for example, $SiO_2$) 39 which cover the gate electrodes 33G, 34G completely is formed.

Next, as shown in FIG. 29, a resist layer 40 is formed on the interlayer insulation film 39. The surface of the resist film 40 is substantially flattened due to its own characteristic.

Figure 30:
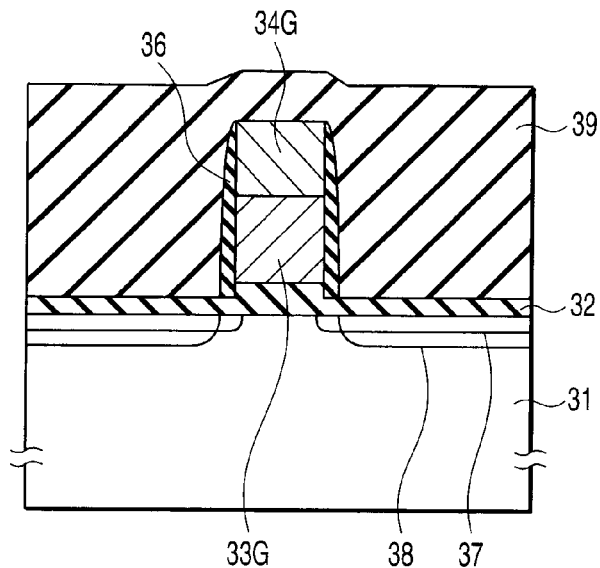
FIG. 30 is a sectional view showing the second example of the method of manufacturing the spin FET.

Thus, if the interlayer insulation film 39 and the resist film 40 are polished or etched at the same time, only the interlayer insulation film 39 whose surface is flattened is left as shown in FIG. 30.

Figure 31:
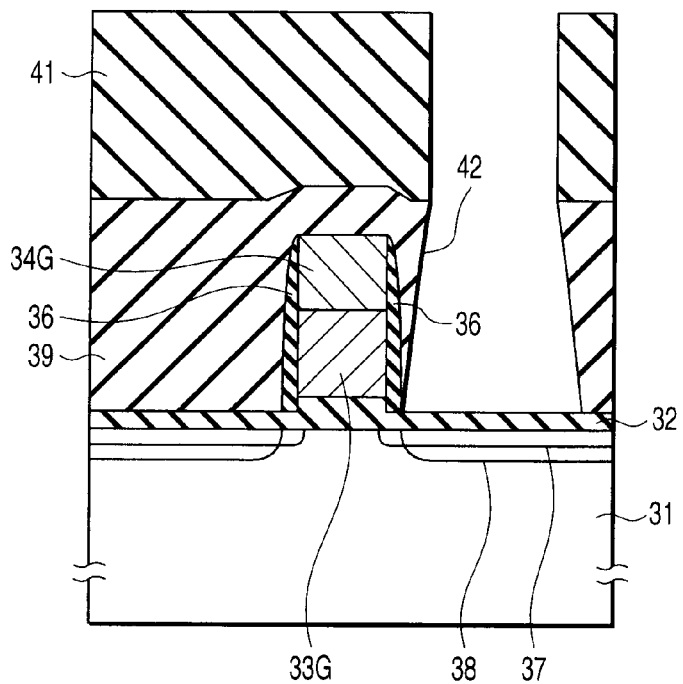
FIG. 31 is a sectional view showing the second example of the method of manufacturing the spin FET.

Next, as shown in FIG. 31, the resist pattern 41 is formed on the interlayer insulation film 39 by a second PEP.

If the interlayer insulation film 39 is etched by RIE with the resist pattern 41 as a mask, a contact hole 42 which reaches the source/drain area 38 is formed in the interlayer insulation film 39.

The configuration of the contact hole 42 is configured such that the size thereof as seen from above the semiconductor substrate 31 is increased gradually as it comes near the semiconductor substrate 31. In this case, the side wall of the contact hole 42 is over-hung shaped.

After that, the resist pattern 41 is removed.

Figure 32:
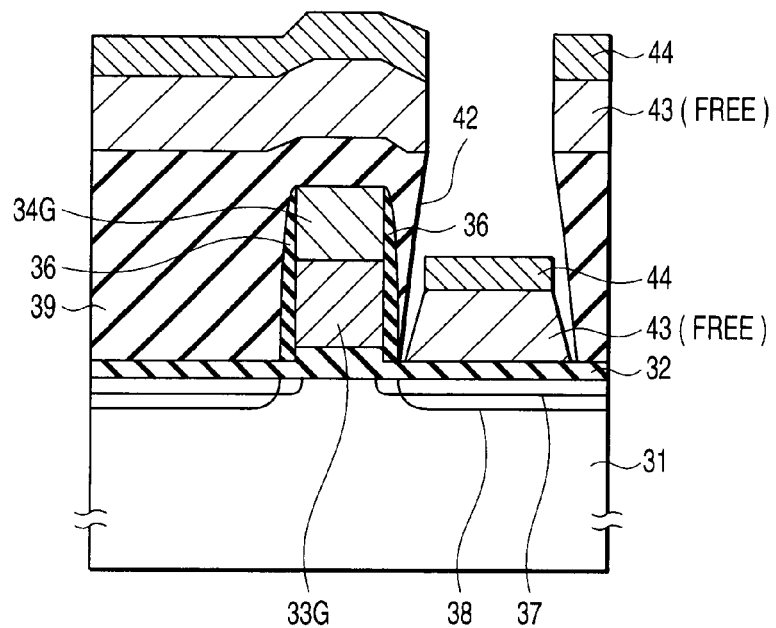
FIG. 32 is a sectional view showing the second example of the method of manufacturing the spin FET.

Next, as shown in FIG. 32, a free layer 43 (FREE) is formed of $Co_2FeSi_{0.5}Al_{0.5}$(2 nm)/[Co(1 nm)/Ni(6 nm)]$_6$/$Cr_2O_3$ on the interlayer insulation film 39 using a sputtering apparatus having an excellent directivity. The $Co_2FeSi_{0.5}Al_{0.5}$(2 nm)/[Co(1 nm)/Ni(6 nm)]$_6$ is a ferromagnetic film and $Cr_2O_3$ is an anti-ferromagnetic ferroelectric film.

A numeral in the parentheses indicates a thickness and the materials sectioned by a slash are formed successively from the left to the right. [Co/Ni]$_6$ means stacking the laminate film comprised of Co/Ni six times.

Subsequently, a cap conductive film 44 is formed on the free layer 43 (FREE).

In this example, the side wall of the contact hole 42 is over-hung shaped. Thus, the free layer 43 (FREE) and the cap conductive film 44 are formed on the tunnel barrier film 32 and the interlayer insulation film 39 and not formed on the side wall of the contact hole 42.

Figure 33:
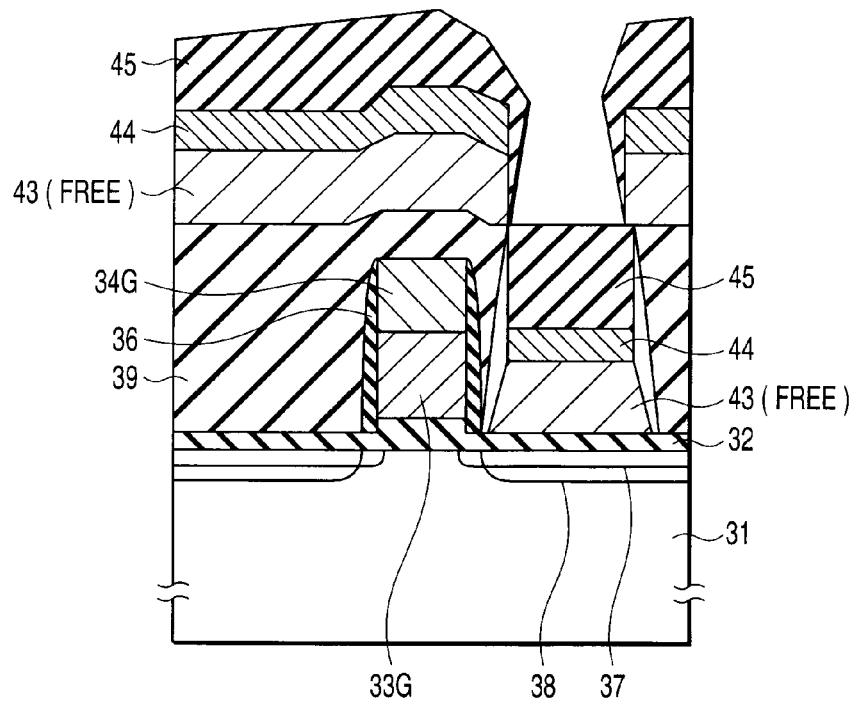
FIG. 33 is a sectional view showing the second example of the method of manufacturing the spin FET.

Next, as shown in FIG. 33, an insulation film (for example, $SiO_2$) 45 is formed on the cap conductive film 44. Subsequently, as shown in FIG. 34, a resist film 46 is formed on the insulation film 45.

Figure 35:
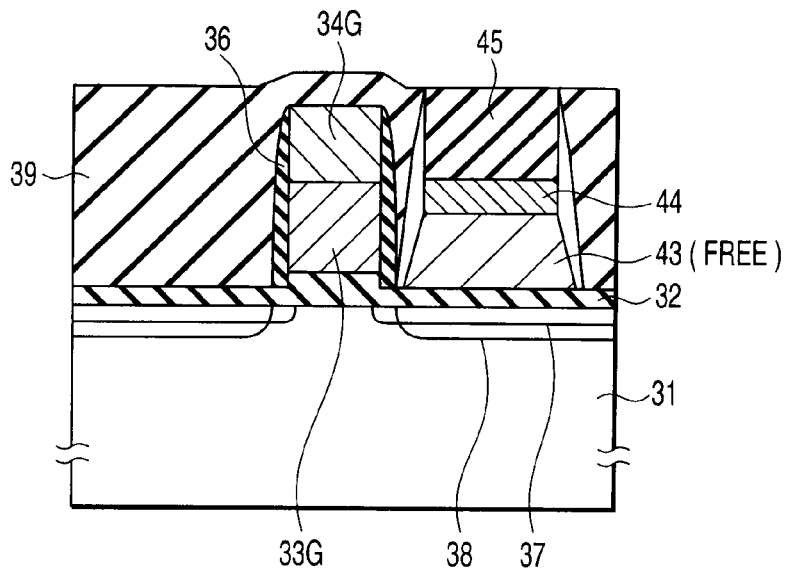
FIG. 35 is a sectional view showing the second example of the method of manufacturing the spin FET.

If the free layer 43 (FREE), the cap conductive film 44, the insulation film 45 and the resist film 46 are polished or etched at the same time after this, as shown in FIG. 35, the free layer 43 (FREE), the cap conductive film 44, the insulation film 45 and the resist film 46 existing on the interlayer insulation film 39 are removed.

Figure 36:
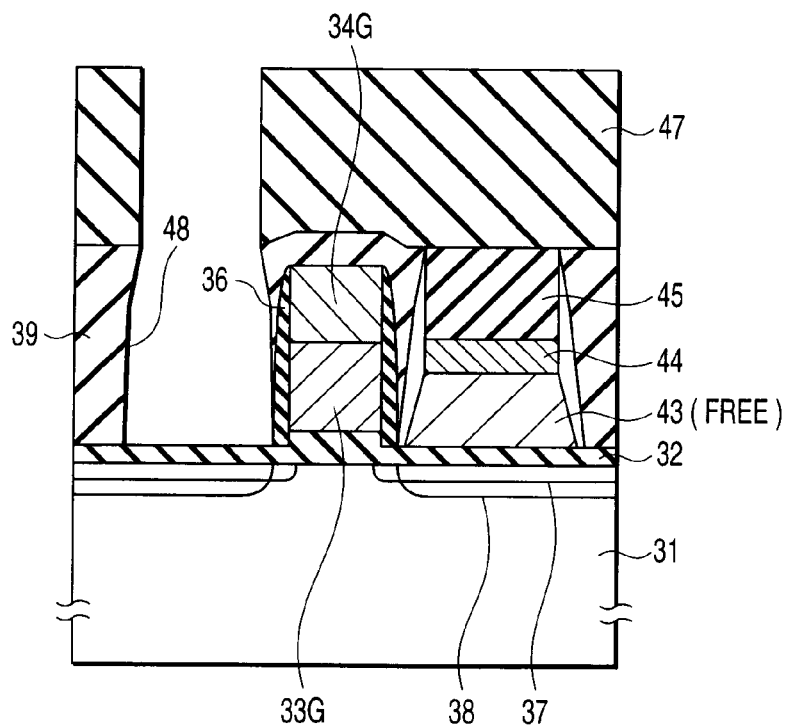
FIG. 36 is a sectional view showing the second example of the method of manufacturing the spin FET.

Next, as shown in FIG. 36, a resist pattern 47 is formed on the interlayer insulation film 39 by a third PEP.

If the interlayer insulation film 39 is etched by RIE with the resist pattern 47 as a mask, a contact hole 48 which reaches the source/drain area 38 is formed in the interlayer insulation film 39.

The configuration of the contact hole 48 is configured so that the size thereof as seen from above the semiconductor substrate 31 is increased gradually as it comes near the semiconductor substrate 31. In this case, the side wall of the contact hole 48 is over-hung shaped.

After that, the resist pattern 47 is removed.

Figure 37:
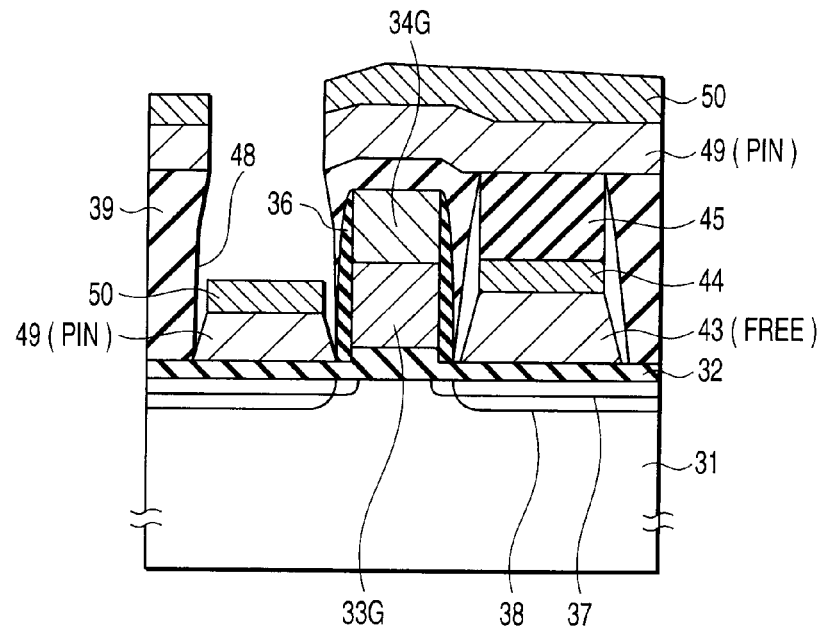
FIG. 37 is a sectional view showing the second example of the method of manufacturing the spin FET.

Next, as shown in FIG. 37, a pinned layer 49 (PIN) is formed of $Co_2FeSi_{0.5}Al_{0.5}$(2 nm)/[Co(1 nm)/Ni(6 nm)]$_6$/IrMn(15 nm) on the interlayer insulation film 39 using a sputtering apparatus having an excellent directivity. The $Co_2FeSi_{0.5}Al_{0.5}$/[Co(1 nm)/Ni(6 nm)]$_6$ is a ferromagnetic film and IrMn is an anti-ferromagnetic ferroelectric film.

A numeral in the parentheses indicates a thickness and the materials sectioned by a slash are formed successively from the left to the right. [Co/Ni]$_6$ means stacking the laminate film comprised of Co/Ni six times.

Subsequently, a cap conductive film 50 is formed on the pinned layer 49 (PIN).

In this example, the side wall of the contact hole 48 is over-hung shaped. Thus, the pinned layer 49 (PIN) and the cap conductive film 50 are formed on the tunnel barrier film 32 and the interlayer insulation film 39 and not formed on the side wall of the contact hole 48.

Figure 38:
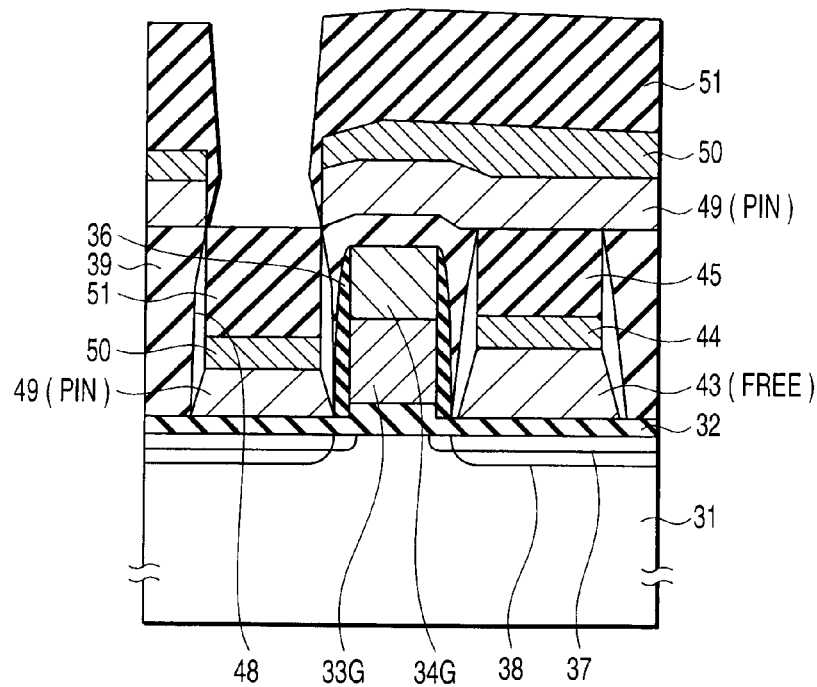
FIG. 38 is a sectional view showing the second example of the method of manufacturing the spin FET.

Next, as shown in FIG. 38, an insulation film (for example, $SiO_2$) 51 is formed on the cap conductive film 50. Subsequently, as shown in FIG. 39, a resist film 52 is formed on the insulation film 51.

When the pinned layer 49 (PIN), the cap conductive film 50, the insulation film 51 and the resist film 52 are polished or etched at the same time after that, as shown in FIG. 40, the pinned layer 49 (PIN), the cap conductive film 50, the insulation film 51 and the resist film 52 existing on the interlayer insulation film 39 are removed.

Finally, the contact holes are formed in the insulation films 45, 51 and when an electrode is formed in each contact hole, the spin FET is completed.

As described above, the manufacturing method of the second example easily enables formation of a tunnel barrier type spin FET in which the ferromagnetic film is disposed on the source/drain diffused layer through the tunnel barrier film.

5. Experimental Example

A result of producing a sample actually and investigating its characteristic will be described below.

The sample produced according to the second example of the manufacturing method is used.

A numeral in the parentheses of a chemical expression indicates a thickness of a film expressed by that chemical expression. The materials sectioned by a slash are formed successively from the left side to the right side.

[A/B]$_x$ means a structure formed by stacking the laminate films comprised of A/B x times.

(1) First Experimental Example

The sample of the first experimental example has a laminate structure of $Cr_2O_3$/Pt(0.7 nm)/[Co(0.3 nm)/Pt(0.7 nm)]$_5$/CoFeB(2 nm).

By applying a write voltage Vpgm to this sample, magnetization of [Co(0.3 nm)/Pt(0.7 nm)]$_5$ as the free layer (perpendicular magnetic film) is changed. $Cr_2O_3$ as the anti-ferromagnetic ferroelectric film assists magnetization reversal of the free layer.

Figure 41:
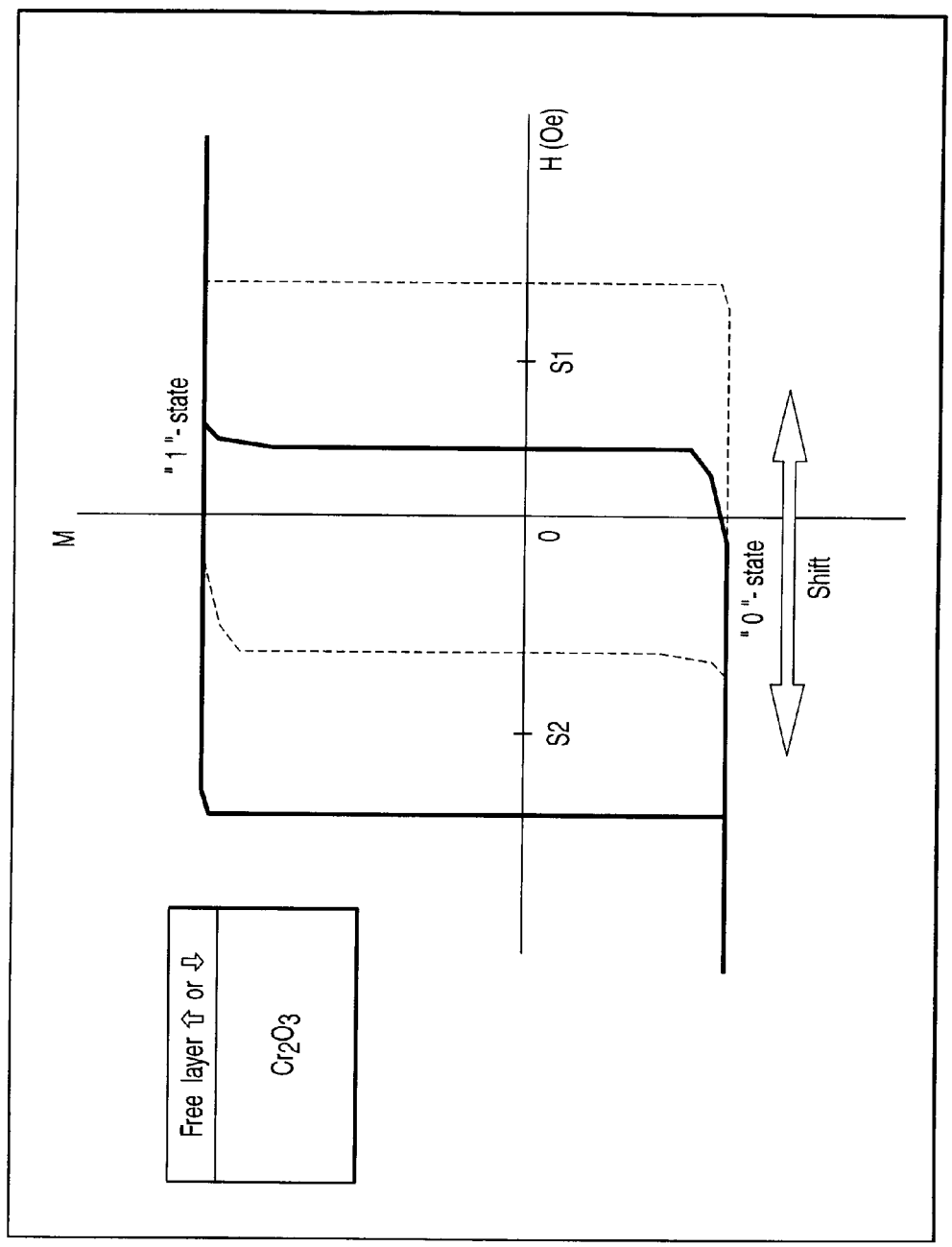
FIG. 41 is a diagram showing the characteristic of a sample of a first experimental example.

FIG. 41 shows the magnetic characteristic of the free layer of the first experimental example.

When 500 kV/m (upward) is applied to the sample as the write voltage Vpgm, magnetization of $Cr_2O_3$ as the anti-ferromagnetic ferroelectric film is directed upward, so that the magnetic characteristic of the free layer is expressed with a full line. If, for example, S1 (ex. 330 Oe) is applied to the sample as an upward directed magnetic field H at this time, magnetization of the free layer is directed upward.

This S1 is a value small enough for magnetization reversal necessary when no anti-ferromagnetic ferroelectric film exists.

If −500 kV/m (downward) is applied to the sample as the write voltage Vpgm, magnetization of $Cr_3O_3$ as the anti-ferromagnetic ferroelectric film is directed downward, so that the magnetic characteristic of the free layer is expressed with a broken line. If S2 (ex. −500 Oe) is supplied to the sample as a downward directed magnetic field H, the magnetization of the free layer is directed downward.

This S2 is a value small enough for magnetization reversal necessary when no anti-ferromagnetic ferroelectric film exists.

When $Cr_2O_3$/[Co(0.1 nm)/Ni(0.6 nm)]$_5$/CoFeB(2 nm) and $Cr_2O_3$/Pt(0.7 nm)/FePt(6 nm)/CoFeB(2 nm) are used as the sample of the first experimental example, it has been confirmed that the magnetization of the free layer can be inverted.

(2) Second Experimental Example

The sample of the second experimental example has a laminate structure of $Cr_2O_3/Pt(0.7$ nm$)/[Co(0.3$ nm$)/Pt(0.7$ nm$)]_5/Co_2FeSi_{0.5}Al_{0.5}(2$ nm$)$.

By applying a write voltage Vpgm to this sample, magnetization of $[Co(0.3$ nm$)/Pt(0.7$ nm$)]_5$ as the free layer (perpendicular magnetic film) is changed. $Cr_2O_3$ as the anti-ferromagnetic ferroelectric film assists magnetization reversal of the free layer.

Figure 42:
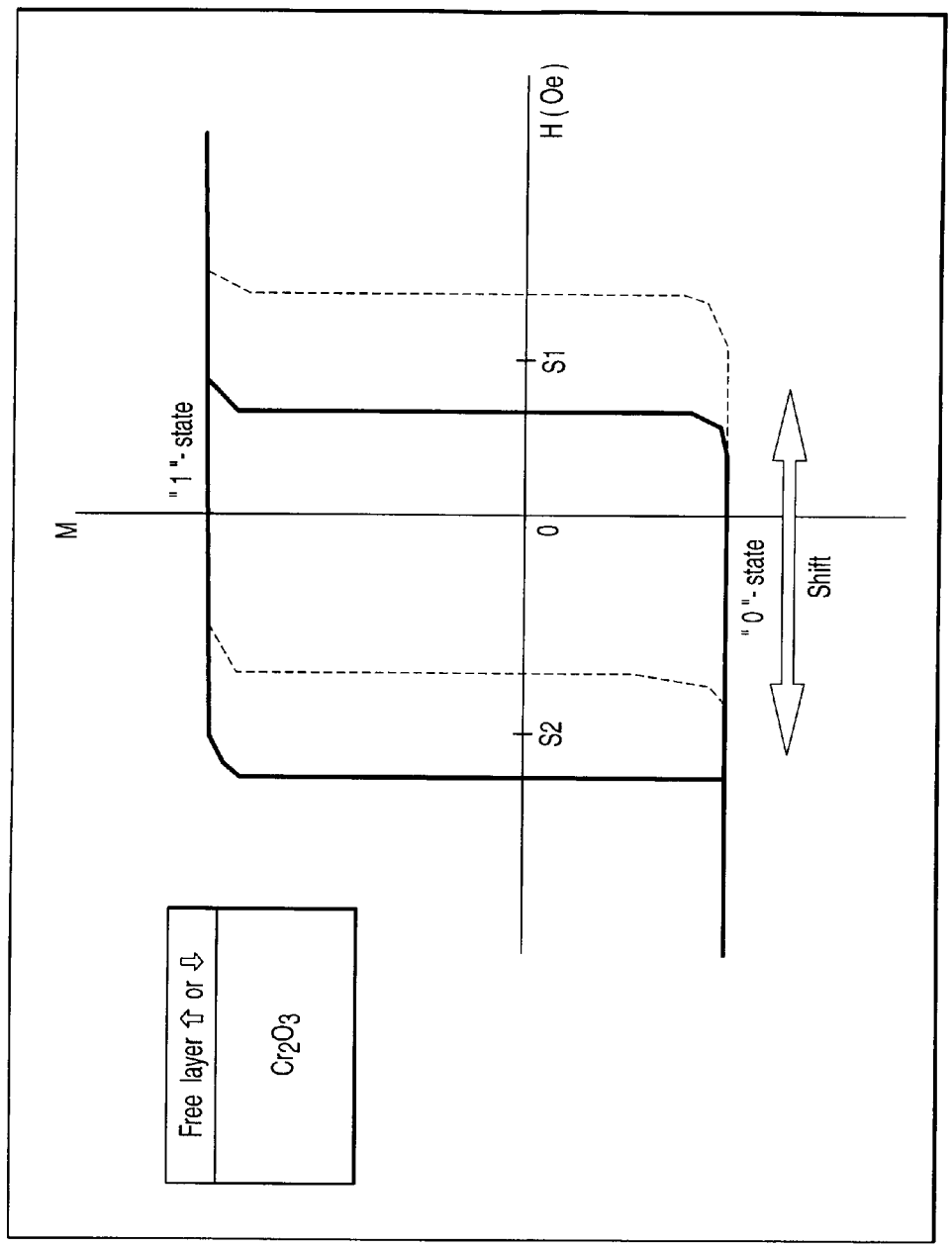
FIG. 42 is a diagram showing the characteristic of a sample of a second experimental example.

FIG. 42 shows the magnetic characteristic of the free layer of the second experimental example.

When 500 kV/m (upward) is applied to the sample as the write voltage Vpgm, magnetization of $Cr_2O_3$ as the anti-ferromagnetic ferroelectric film is directed upward, so that the magnetic characteristic of the free layer is expressed with a full line. If, for example, S1 (ex. 315 Oe) is applied to the sample as an upward directed magnetic field H at this time, magnetization of the free layer is directed upward.

This S1 is a value small enough for magnetization reversal necessary when no anti-ferromagnetic ferroelectric film exists.

If −500 kV/m (downward) is applied to the sample as the write voltage Vpgm, magnetization of $Cr_3O_3$ as the anti-ferromagnetic ferroelectric film is directed downward, so that the magnetic characteristic of the free layer is expressed with a broken line. If S2 (ex. −460 Oe) is supplied to the sample as a downward directed magnetic field H, the magnetization of the free layer is directed downward.

This S2 is a value small enough for magnetization reversal necessary when no anti-ferromagnetic ferroelectric film exists.

When $Cr_2O_3/[Co(0.1$ nm$)/Ni(0.6$ nm$)]_5/Co_2FeSi_{0.5}Al_{0.5}(2$ nm$)$ and $Cr_2O_3/Pt(0.7$ nm$)/FePt(6$ nm$)/Co_2FeSi_{0.5}Al_{0.5}(2$ nm$)$ are used as the sample of the second experimental example, it has been confirmed that the magnetization of the free layer can be inverted.

(3) Third Experimental Example

In the third experimental example, 10,000 samples having dot patterns of the first and second experimental examples are manufactured using an EB drawing unit. The width of each dot is 0.1 μm and six kinds of aspect ratios (depth/length), 1, 1.5, 2, 3, 4, 5, are prepared.

After those dot patterns were annealed by applying magnetic field, "0"-state and "1"-state were produced by applying the write voltage Vpgm and then, the thermal stability of each dot was investigated. More specifically, a sample was kept heated at 120° C. and after its temperature was returned to room temperature, the direction of magnetization was measured in zero magnetic fields so as to verify whether or not the magnitude of magnetization was kept constant.

FIG. 43 shows the thermal stability of a sample.

It was verified that the retention characteristic was excellent in any case where the aspect ratio was 1, 1.5, 2, 3, 4 or 5. That is, it is found that the thermal stability of the free layer having this structure is excellent even under a low aspect ratio and that it is very effective for an increased capacity of the memory cell array.

In the meantime, the excellent retention characteristic is obtained in for example, $Cr_2O_3/Pt(0.7$ nm$)/[Co(0.3$ nm$)/Pt(0.7$ nm$)]_5/CoFeB(2$ nm$)$, $Cr_2O_3/Pt(0.7$ nm$)/FePt(6$ nm$)/CoFeB(2$ nm$)$, $Cr_2O_3/Pt(0.7$ nm$)/[Co(0.3$ nm$)/Pt(0.7$ nm$)]_5/Co_2FeSi_{0.5}Al_{0.5}(2$ nm$)$, $Cr_2O_3/Pt(0.7$ nm$)/FePt(6$ nm$)/Co_2FeSi_{0.5}Al_{0.5}(2$ nm$)$ as well as the materials shown in the first and second experimental examples.

(4) Fourth Experimental Example

According to the fourth experimental example, the spin FET was formed on a Ge substrate.

The free layer is formed of $Co_2FeSi_{0.5}Al_{0.5}(2$ nm$)/[Co(1$ nm$)/Ni(6$ nm$)]_6$ and the anti-ferromagnetic ferroelectric film is formed of $Cr_2O_3$. The pinned layer is formed of $Co_2FeSi_{0.5}Al_{0.2}(2$ nm$)/[Co(1$ nm$)/Ni(6$ nm$)]_6$ and the anti-ferromagnetic film as the pinned layer for fixing magnetization of the pinned layer is formed of IrMn(15 nm).

FIG. 44 expresses a gate voltage $V_{Gate}$ by reading the relationship between drain current and source-drain voltage (bias).

According to this, it is found that in a region in which the source-drain voltage is 0.75V or less, the drain current differs corresponding to magnetization state (parallel/anti-parallel) between the source and drain even if the reading gate voltage $V_{Gate}$ is equal.

That is, an amplification operation, in which a difference between drain current in the parallel state and drain current in the anti-parallel state increases as the reading gate voltage $V_{gate}$ is increased, is obtained so as to realize a reconfigurable logic circuit.

The reading gate voltage $V_{gate}$ is set to a value lower than 2.0V in order to prevent erroneous writing into the free layer.

In the meantime, the same result is obtained both in case of using a GaAs substrate and using an Si substrate instead of the Ga substrate.

(5) Fifth Experimental Example

FIG. 45 shows how a signal voltage changes when a reading gate voltage of 0.2V lower than the value of a write-in pulse is applied after the write-in pulse was applied to the samples of the first to fourth experimental examples under a condition of ±1.6V and 100 nsec.

According to this, it is found that the value "0" and "1" of the signal voltage, that is, memory cell data (parallel/anti-parallel) changes depending on the kind of the write-in pulse. In this experimental example, a basic operation of the spin memory was confirmed.

6. Applications

Next, applications of the spin FET and the spin memory according to the embodiment of the present invention will be described.

If a neuro type circuit is configured of a spin FET of the embodiment of the present invention, a flexible memory system such as realization of brain function can be established.

Hereinafter, a case of applying the spin FET of the embodiment of the present invention to the reconfigurable logic circuit, a case of applying it to the semiconductor memory and a case of loading the spin FET on a chip so as to build up a system will be described.

Further, in case of building up a system by loading the spin FET of the embodiment of the present invention on a chip, a combination with the spin memory of the embodiment of the present invention will be described.

(1) Case of Applying to Reconfigurable Logic Circuit

The reconfigurable logic circuit refers to a circuit capable of realizing one of plural logics selectively with a single logic circuit based on program data.

The program data mentioned here refers to data or control data memorized in a nonvolatile memory such as FeRAM and MRAM in the same chip or in another chip.

Because a conventional logic circuit determines the kind (AND, NAND, OR, NOR, Ex-OR) of logic by a connecting relationship of plural MIS transistors, when the logic is changed, the connecting relationship of the plural MIS transistors must be changed by redesign.

Then, such a reconfigurable logic circuit capable of achieving one of plural logics with a single logic circuit has been demanded.

Use of the spin FET of the embodiment of the present invention enables the reconfigurable logic circuit to be realized.

When the reconfigurable logic circuit is configured using the spin FET, if AND and OR are realized, other logics can be realized by combination of AND and OR. Thus, an example of a reconfigurable logic circuit capable of achieving AND or OR selectively will be described.

Although a following example will be described about an embedded type FET in which the source/drain is comprised of a ferromagnetic film, of course the spin FET may be of stack type in which the ferromagnetic film is formed on the source/drain diffused region.

A. First Example

Figure 46:
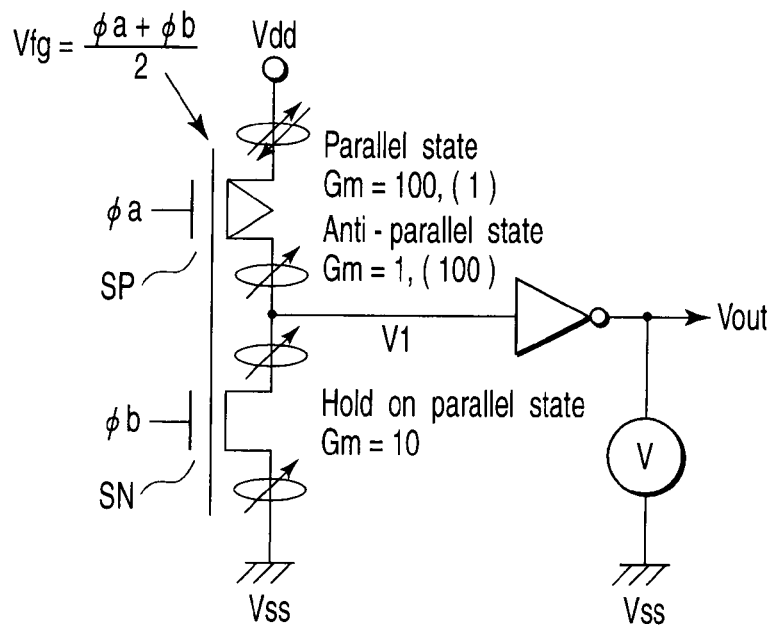
FIG. 46 is a circuit diagram showing a first example of a reconfigurable logic circuit.

FIG. 46 shows a first example of the reconfigurable logic circuit.

In this example, a spin FET of embodiment of present invention is connected in series between power terminals Vdd and Vss.

A spin FET SP is of P channel type and an input signal φa is inputted into its gate. In the spin FET SP, magnetization state (parallel/anti-parallel) of a magnetic recording portion can be rewritten.

As for conductance Gm of the spin FET SP, the material and size thereof are determined so that a ratio between a value in the parallel state and a value in the anti-parallel state is "100:1".

The ratio between the conductance Gm in the parallel state and the conductance Gm in the anti-parallel state may be in an inverse relationship to the above description, that is, "1:100".

A spin FET SN is of N channel type and an input signal φb is inputted to its gate. In the spin FET SN, magnetization state of its magnetic recording portion is fixed, in this example, fixed to the parallel state. If the ratio of the conductance Gm of the spin FET SP is in the above-described relationship, the conductance Gm of the spin FET SN is set to "10".

In the spin FETs SP, SN, for example, a common floating gate may be provided. Because in this case, (φa+φb)/2 can be produced as a voltage Vfg of the floating gate, this is preferable in building up a stable logic.

A signal V1 of a connecting point between the spin FETs SP and SN turns to an output signal Vout when it passes an inverter.

If the magnetization state of the magnetic recording portion of the spin FET SP is in the parallel state or in the anti-parallel state in the reconfigurable logic circuit of FIG. 46, and the conductance Gm thereof is set to "100" (when the conductance Gm of the spin FET SN is "10"), the output signal Vout turns to AND (Y=A·B) between the input signals A and B as shown in Table 1.

TABLE 1

| SP: Parallel state (anti-parallel state) Gm = 100 →AND-gate Y = A · B | | | | | | |
|---|---|---|---|---|---|---|
| A | B | Vfg | SP | SN | V1 | Y (=Vout) |
| 0 | 0 | 0 | On | Off | 1 | 0 |
| 0 | 1 | ½ | On | On | 1 | 0 |
| 1 | 0 | ½ | On | On | 1 | 0 |
| 1 | 1 | 1 | Off | On | 0 | 1 |

In Table 1, a logic value "1" corresponds to "H(high)" and a logic value "0" corresponds to "L(low)". A logic value "½" means an intermediate voltage between "H" and "L".

That is, when both the input signals φa, φb are "1", a voltage Vfg of the common floating gate is "1". At this time, the spin FET SP is turned off and the spin FET SN is turned on. Thus, V1 turns to "0" and the output signal Vout turns to "1".

When both the input signals φa, φb are "0", the voltage Vfg of the common floating gate turns to "0". Because at this time, the spin FET SP is turned on and the spin FET SN is turned off, V1 turns to "1" and the output signal Vout turns to "0".

Further, when one of the input signals φa, φb is "1" while the other is "0", the voltage Vfg of the common floating gate turns to "½". At this time, both the spin FETs SP and SN are turned on.

Because the conductance Gm of the spin FET SP is set to "100" and the conductance Gm of the spin FET SN is set to "10", a ratio of current flowing to the spin FETs SP and SN is "100:10"="10:1".

Therefore, the capacity of pulling up V1 to Vdd (="1") is superior to the capacity of pulling down V1 to Vss (="0"), so that V1 turns to "1" and the output signal Vout turns to "0".

When in the reconfigurable logic circuit of FIG. 46, the magnetization state of the magnetic recording portion of the spin FET SP is parallel or anti-parallel and its conductance Gm is turned to "1" (when the conductance Gm of the spin FET SN is "10"), the output signal Vout turns to OR (Y=A+B) between the input signals φa and φb as shown in Table 2.

TABLE 2

| SP: Anti-parallel state (parallel state) Gm = 1 →OR-gate Y = A + B | | | | | | |
|---|---|---|---|---|---|---|
| A | B | Vfg | SP | SN | V1 | Y (=Vout) |
| 0 | 0 | 0 | On | Off | 1 | 0 |
| 0 | 1 | ½ | On | On | 0 | 1 |
| 1 | 0 | ½ | On | On | 0 | 1 |
| 1 | 1 | 1 | Off | On | 0 | 1 |

In Table 2, a logic value "1" corresponds to "High (high)" and a logic value "0" corresponds to "L (low)". A logic value "½" means an intermediate voltage between "H" and "L".

That is, when both the input signals φa, φb are "1", the voltage Vfg of the common floating gate is "1". Because at this time, the spin FET SP is turned off and the spin FET SN is turned on, V1 turns to "0" and the output signal Vout turns to "1".

When both the input signals φa, φb are "0", the voltage Vfg of the common floating gate is "0". Because at this time, the spin FET SP is turned on and the spin FET SN is turned off, V1 turns to "1" and the output signal Vout turns to "0".

Further, when one of the input signals φa, φb is "1" while the other is "0", the voltage Vfg of the common floating gate turns to "½". At this time, both the spin FETs SP and SN are turned on.

Because the conductance Gm of the spin FET SP is set to "1" and the conductance Gm of the spin FET SN is set to "10", a ratio of current flowing to the spin FETs SP, SN is "1:10".

Thus, the capacity of pulling down V1 to Vss (="0") is superior to the capacity of pulling up V1 to Vdd (="1"), V1 turns to "0" and the output signal Vout turns to "1".

As described above, the reconfigurable logic circuit to which the spin FET of the embodiment of the present invention is applied can achieve one of plural logics selectively with a single logic circuit without any redesign by rewriting the state (parallel/anti-parallel) of the spin FET SP based on program data so as to change its conductance Gm.

In the reconfigurable logic circuit of this embodiment, its conductance Gm is fixed to "10" with the N-channel type spin FET SN fixed to parallel state.

Figure 47:
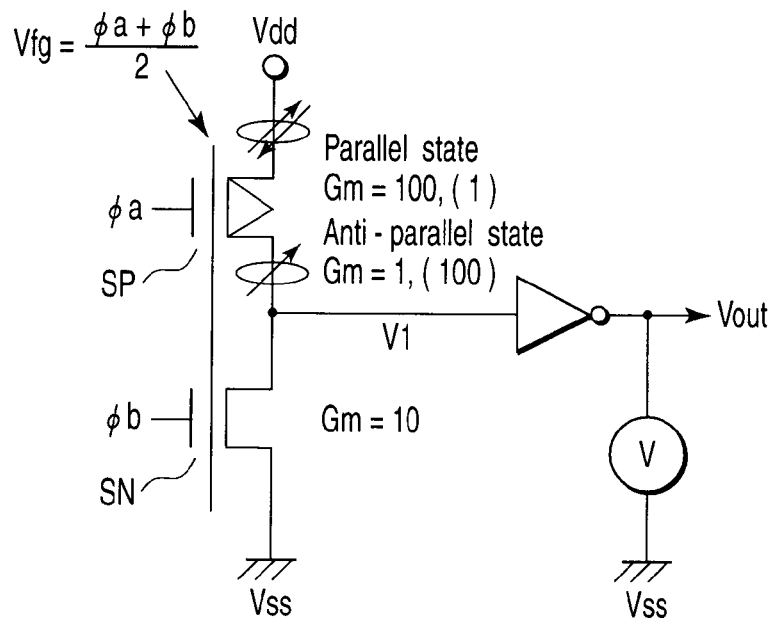
FIG. 47 is a circuit diagram showing the first example of the reconfigurable logic circuit.
Figure 48:
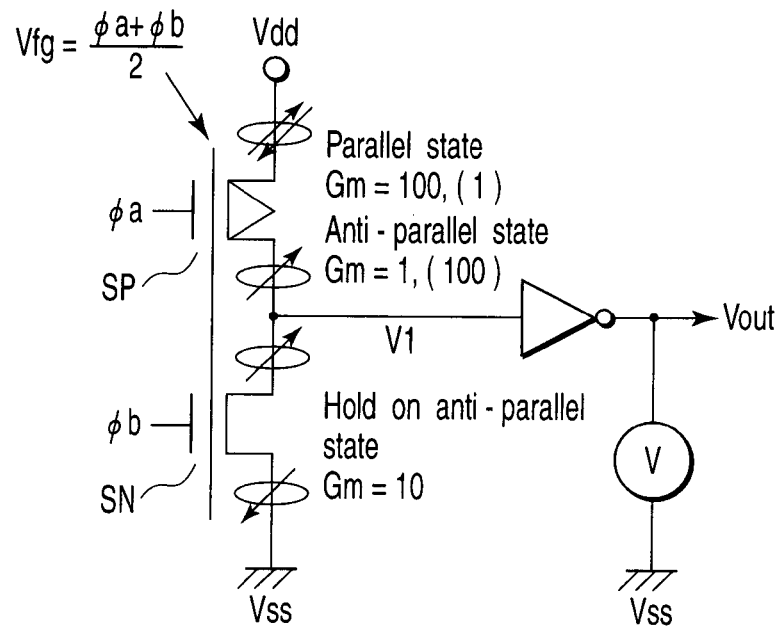
FIG. 48 is a circuit diagram showing the first example of the reconfigurable logic circuit.

Because in the spin FET SN, the conductance Gm only needs to be fixed to "10", for example, an ordinary N-channel MIS transistor SN may be used as shown in FIG. 47 and further, an N-channel type spin FET SN in the anti-parallel state may be used as shown in FIG. 48.

Figure 49:
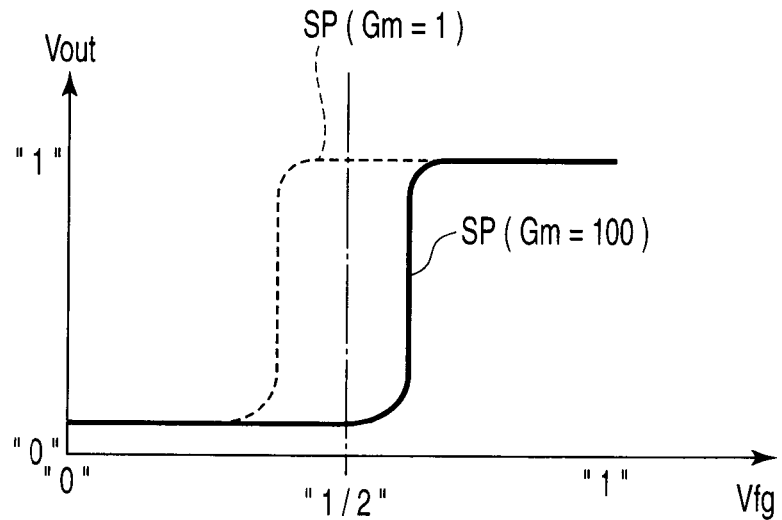
FIG. 49 is a diagram showing a relationship between a floating gate voltage Vfg and an output signal Vout.
Figure 5:
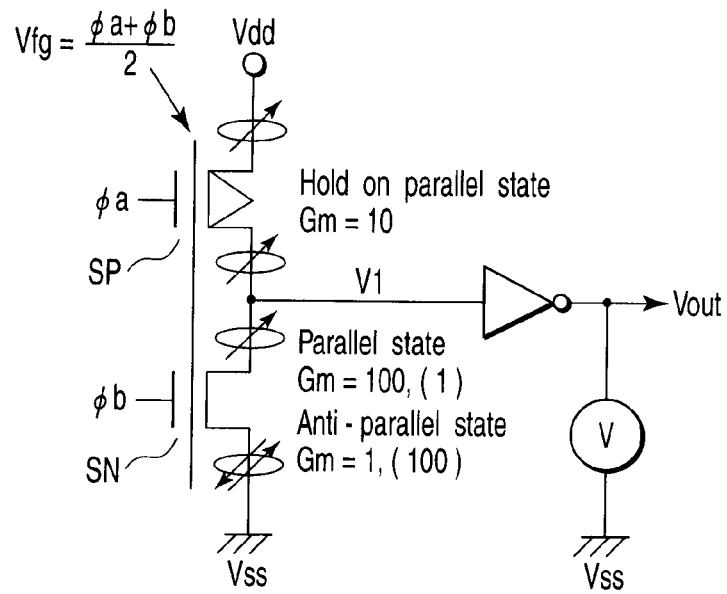
Figure 5:
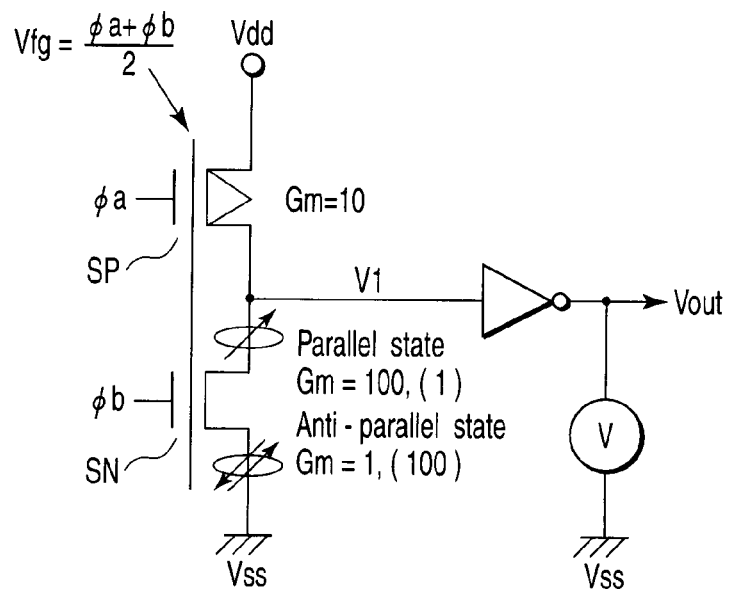

FIG. 49 shows a relationship between the voltage Vfg of the common floating gate and the output voltage Vout in the reconfigurable logic circuit of FIGS. 46 to 48.

Its feature exists in that when the voltage Vfg of the common floating gate is "½", the output voltage Vout is changed corresponding to the state (parallel/anti-parallel) of the spin FET SP.

Next, an example of the device structure of the reconfigurable logic circuit of FIGS. 46 to 48 will be described.

FIG. 50 is a plan view of a device structure of the reconfigurable logic circuit of FIGS. 46 to 48 and FIG. 51 is a sectional view taken along the line LI-LI of FIG. 50.

The feature of this device exists in, first, that the floating gates FG of the spin FETs SP, SN are connected electrically and second, that the drains of the spin FETs SP, SN are comprised of a ferromagnetic body 65*a*.

An STI-structured element separation layer 62 is formed in the semiconductor substrate 61. An N type well area 63*a* and a P type well area 63*b* are formed in an element area surrounded by the element separation layer 62.

A pinned layer 65*a* in which the direction of magnetization is fixed is formed in the concave portion provided on a border between the N type well area 63*a* and the P type well area 63*b*. The pinned layer 65*a* serves as a drain of the spin FETs SP, SN.

An anti-ferromagnetic film 67 is formed on the pinned layer 65*a*. A tunnel barrier film 64*a* is formed between the semiconductor substrate 61 and the pinned layer 65*a*.

A free layer (including anti-ferromagnetic ferroelectric film) 66 in which the direction of magnetization is changed is formed in the concave portion provided in the N type well area 63*a*. The free layer 66 serves as a source of the spin FET SP.

A pinned layer 65*b* in which the direction of magnetization is fixed is formed in the concave portion provided in the P type well area 63*b*. The pinned layer 65*b* serves as a source of the spin FET SN.

An anti-ferromagnetic film 67 is formed on the pinned layer 65*b*. The tunnel barrier film 64*b* is formed between the semiconductor substrate 61 and the pinned layer 65*b* and between the semiconductor substrate 61 and the free layer 66.

A floating gate electrode FG is formed on a channel between the pinned layer 65*a* and the free layer 66 through a gate insulation film. A gate electrode to which the input signal φa is applied is formed on the floating gate electrode FG through an insulation film comprised of oxide/nitride/oxide (ONO).

Likewise, the floating gate electrode FG is formed on a channel between the pinned layers 65*a* and 65*b* through the gate insulation film. A gate electrode to which the input signal φb is applied is formed on the floating gate electrode FG through the insulation film comprised of ONO.

As described above, according to the first example, a reconfigurable logic circuit excellent in thermal stability can be achieved by applying the spin FET of the embodiment of the present invention to a reconfigurable logic circuit.

B. Second Example

FIG. 52 shows a second example of the reconfigurable logic circuit.

In this example, a spin FET of embodiment of present invention is connected in series between the power terminals Vdd and Vss.

The spin FET SP is of P-channel type and the input signal φa is inputted its the gate. In the spin FET SP, the magnetization state of its magnetic recording portion is fixed, in this example, fixed to the parallel state. The conductance Gm of the spin FET SP is set to "10" if the ratio of the conductance Gm of the spin FET SN is in a relationship described below.

The spin FET SN is of N-channel type and the input signal φb is inputted to its gate. In the spin FET SN, the magnetization state (parallel/anti-parallel) of its magnetic recording portion can be rewritten.

As for conductance Gm of the spin FET SP, the material and size thereof are determined so that a ratio between a value in the parallel state and a value in the anti-parallel state is "100:1".

The ratio between the conductance Gm in the parallel state and the conductance Gm in the anti-parallel state may be in an inverse relationship to the above description, that is, "1:100".

In the spin FETs SP, SN, for example, a common floating gate may be provided like the first example. Because in this case, (φa+φb)/2 can be produced as a voltage Vfg of the floating gate, this is preferable in building up a stable logic.

A signal V1 of a connecting point between the spin FETs SP and SN turns to an output signal Vout when it passes an inverter.

If the magnetization state of the magnetic recording portion of the spin FET SN is in the parallel state or in the anti-parallel state in the reconfigurable logic circuit of FIG. 52, and the conductance Gm thereof is set to "100" (when the conductance Gm of the spin FET SP is "10"), the output signal Vout turns to OR (Y=A+B) between the input signals φa and φb as shown in Table 3.

TABLE 3

SN: Parallel state (anti-parallel state) Gm = 100
→OR-gate Y = A + B

| A | B | Vfg | SP | SN | V1 | Y (=Vout) |
|---|---|---|---|---|---|---|
| 0 | 0 | 0 | On | Off | 1 | 0 |
| 0 | 1 | ½ | On | On | 0 | 1 |
| 1 | 0 | ½ | On | On | 0 | 1 |
| 1 | 1 | 1 | Off | On | 0 | 1 |

In Table 3, a logic value "1" corresponds to "High (high)" and a logic value "0" corresponds to "L (low)". A logic value "½" means an intermediate voltage between "H" and "L".

That is, when both the input signals φa, φb are "1", the voltage Vfg of the common floating gate is "1". Because at this time, the spin FET SP is turned off and the spin FET SN is turned on, V1 turns to "0" and the output signal Vout turns to "1".

When both the input signals φa, φb are "0", the voltage Vfg of the common floating gate is "0". Because at this time, the spin FET SP is turned on and the spin FET SN is turned off, V1 turns to "1" and the output signal Vout turns to "0".

Further, when one of the input signals φa, φb is "1" while the other is "0", the voltage Vfg of the common floating gate turns to "½". At this time, both the spin FETs SP and SN are turned on.

Because the conductance Gm of the spin FET SP is set to "10" and the conductance Gm of the spin FET SN is set to "100", a ratio of current flowing to the spin FETs SP, SN is "10:100"="1:10".

Thus, the capacity of pulling down V1 to Vss (="0") is superior to the capacity of pulling up V1 to Vdd (="1"), V1 turns to "0" and the output signal Vout turns to "1".

If the magnetization state of the magnetic recording portion of the spin FET SN is in the parallel state or in the anti-parallel state in the reconfigurable logic circuit of FIG. 52, and the conductance Gm is set to "1" (when the conductance Gm of the spin FET SP is "10"), the output signal Vout turns to AND (Y=A·B) between the input signals φa and φb as shown in Table 4.

TABLE 4

SN: Anti-parallel state (parallel state) Gm = 1
→AND-gate Y = A · B

| A | B | Vfg | SP | SN | V1 | Y (=Vout) |
|---|---|-----|-----|-----|----|-----------|
| 0 | 0 | 0   | On  | Off | 1  | 0         |
| 0 | 1 | ½   | On  | On  | 1  | 0         |
| 1 | 0 | ½   | On  | On  | 1  | 0         |
| 1 | 1 | 1   | Off | On  | 0  | 1         |

In Table 4, a logic value "1" corresponds to "High (high)" and a logic value "0" corresponds to "L (low)". A logic value "½" means an intermediate voltage between "H" and "L".

That is, when both the input signals φa, φb are "1", the voltage Vfg of the common floating gate is "1". Because at this time, the spin FET SP is turned off and the spin FET SN is turned on, V1 turns to "0" and the output signal Vout turns to "1".

When both the input signals φa, φb are "0", the voltage Vfg of the common floating gate is "0". Because at this time, the spin FET SP is turned on and the spin FET SN is turned off, V1 turns to "1" and the output signal Vout turns to "0".

Further, when one of the input signals φa, φb is "1" while the other is "0", the voltage Vfg of the common floating gate turns to "½". At this time, both the spin FETs SP and SN are turned on.

Because the conductance Gm of the spin FET SP is set to "10" and the conductance Gm of the spin FET SN is set to "1", a ratio of current flowing to the spin FETs SP, SN is "10:1".

Thus, the capacity of pulling up V1 to Vdd (="1") is superior to the capacity of pulling down V1 to Vss (="0"), V1 turns to "1" and the output signal Vout turns to "0".

As described above, the reconfigurable logic circuit to which the spin FET of the embodiment of the present invention is applied can achieve one of plural logics selectively with a single logic circuit without any redesign by rewriting the state (parallel/anti-parallel) of the spin FET SN based on program data so as to change its conductance Gm.

In the reconfigurable logic circuit of this embodiment, its conductance Gm is fixed to "10" with the P-channel type spin FET SP fixed to parallel state.

Figure 54:
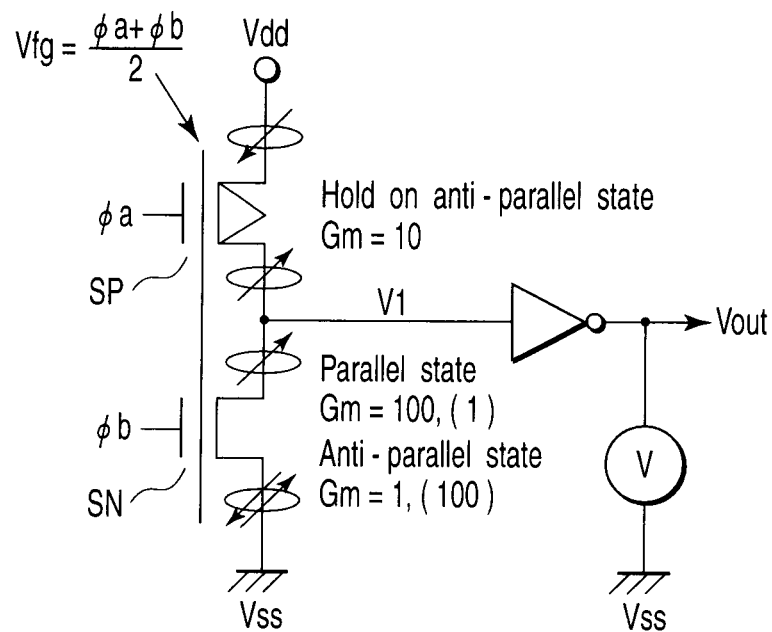
FIG. 54 is a circuit diagram showing the second example of the reconfigurable logic circuit.

Because in the spin FET SP, the conductance Gm only needs to be fixed to "10", for example, an ordinary P-channel MIS transistor SP may be used as shown in FIG. 53 and further, a P-channel type spin FET SP in the anti-parallel state may be used as shown in FIG. 54.

Figure 55:
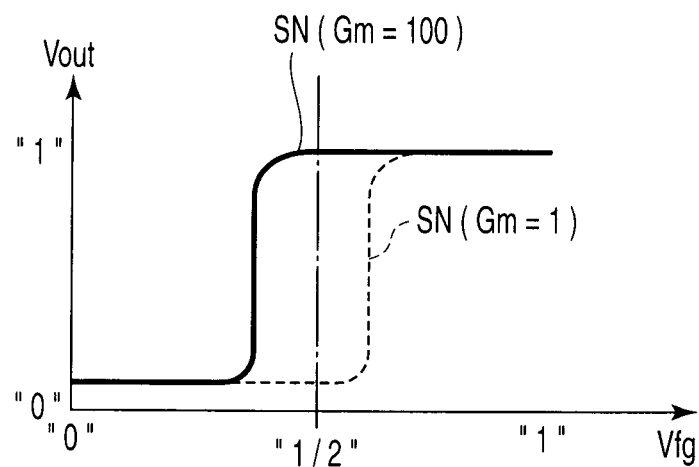
FIG. 55 is a diagram showing a relationship between a floating gate voltage Vfg and an output voltage Vout.

FIG. 55 shows a relationship between the voltage Vfg of the common floating gate and the output voltage Vout in the reconfigurable logic circuit of FIGS. 52 to 54.

Its feature exists in that when the voltage Vfg of the common floating gate is "½", the output voltage Vout is changed corresponding to the state (parallel/anti-parallel) of the spin FET SN.

Next, an example of the device structure of the reconfigurable logic circuit of FIGS. 52 to 54 will be described.

Figure 56:
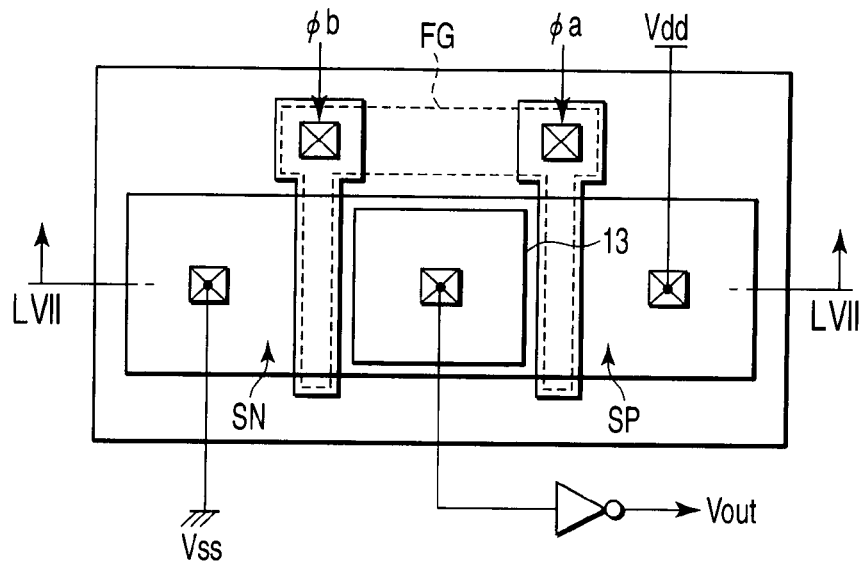
FIG. 56 is a plan view showing an example of a device structure.
Figure 57:
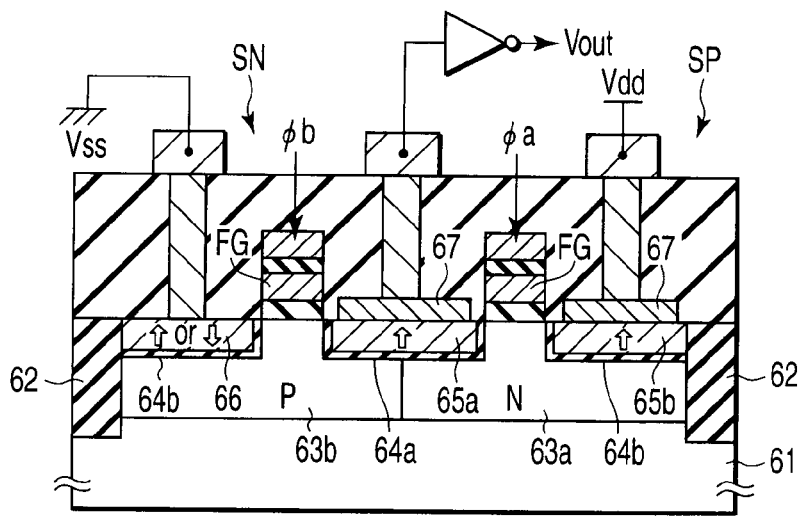
FIG. 57 is a sectional view taken along the line LVII-LVII of FIG. 56.

FIG. 56 is a plan view of a device structure of the reconfigurable logic circuit of FIGS. 52 to 54 and FIG. 57 is a sectional view taken along the line LVII-LVII of FIG. 56.

The feature of this device exists in, first, that the floating gates FG of the spin FETs SP, SN are connected electrically and second, that the drains of the spin FETs SP, SN are comprised of a ferromagnetic body 65a.

An STI-structured element separation layer 62 is formed in the semiconductor substrate 61. An N type well area 63a and a P type well area 63b are formed in an element area surrounded by the element separation layer 62.

A pinned layer 65a in which the direction of magnetization is fixed is formed in the concave portion provided on a border between the N type well area 63a and the P type well area 63b. The pinned layer 65a serves as a drain of the spin FETs SP, SN.

An anti-ferromagnetic film 67 is formed on the pinned layer 65a. A tunnel barrier film 64a is formed between the semiconductor substrate 61 and the pinned layer 65a.

A pinned layer 65b in which the direction of magnetization is fixed is formed in the concave portion provided in the N type well area 63a. The pinned layer 65b serves as a source of the spin FET SP.

A free layer (including the anti-ferromagnetic ferroelectric film) 66 in which the direction of magnetization is changed is formed in the concave portion provided in the P type well area 63b. The free layer 66 serves as a source of the spin FET SN.

The anti-ferromagnetic film 67 is formed on the pinned layer 65b. The tunnel barrier film 64b is formed between the semiconductor substrate 61 and the pinned layer 65b and between the semiconductor substrate 61 and the free layer 66.

A floating gate electrode FG is formed on a channel between the pinned layers 65a and 65b through a gate insulation film. A gate electrode to which the input signal φa is applied is formed on the floating gate electrode FG through an insulation film comprised of ONO.

The floating gate electrode FG is formed on a channel between the pinned layer 65a and the free layer 66 through the gate insulation film. A gate electrode to which the input signal φb is applied is formed on the floating gate electrode FG through the insulation film comprised of ONO.

As described above, according to the second example, a reconfigurable logic circuit excellent in thermal stability can be achieved by applying the spin FET of the embodiment of the present invention to a reconfigurable logic circuit.

C. Others

Although in the first and second examples, the P-channel type spin FET and the N-channel type spin FET are used as a pair, the conductive type of the transistor is not restricted to any particular type as long as the same logic is achieved.

(2) Case of Application to Semiconductor Memory

Next, a case of applying the spin FET of the embodiment of the present invention to the semiconductor memory will be described.

The spin FET of the embodiment of the present invention can be used as a memory cell of the semiconductor memory.

FIG. 58 shows an example of the semiconductor memory using the spin FET.

The memory cell array is comprised of a plurality of the spin FETs arranged in an array. Then, a memory cell is comprised of a spin FET. One of the source/drain of the spin FET is connected to a bit line BL(L) and the other is connected to a bit line BL(R). The bit lines BL(L), BL(R) are extended in the same direction, in this example, in a column direction.

A CMOS type driver/sinker DS1 is connected to an end of the bit line BL(L). The driver/sinker DS1 is connected in series between the power terminals Vdd and Vss and comprised of the P-channel MOS transistor P1 and the N-channel MOS transistor N1 which control generation/shut-down of spin injection current Is.

An end of the bit line BL(L) is connected to a connecting point between the MOS transistors P1 and N1 and a control signal A is inputted to the gate of the P-channel MOS transistor P1 while a control signal C is inputted to the gate of the N-channel MOS transistor N1.

A sense amplifier S/A is connected to the other end of the bit line BL(L) through the N-channel MOS transistor ST1 as a column selection switch. The sense amplifier S/A is comprised of a differential amplifier, which determines the value of data memorized in the spin FET based on a reference voltage Vref.

An output signal of the sense amplifier S/A turns to reading data DATA of a selected spin FET.

The control signal $\phi j$ is a column selection signal which selects a column j and inputted to the gate of the N-channel MOS transistor ST1.

A CMOS type driver/sinker DS2 is connected to an end of the bit line BL(R). The driver/sinker DS2 is connected in series between the power terminals Vdd and Vss and comprised of the P-channel MOS transistor P2 and the N-channel MOS transistor N2 which control generation/shut-down of spin injection current Is.

An end of the bit line BL(R) is connected to a connecting point between the MOS transistors P2 and N2 and a control signal B is inputted to the gate of the P-channel MOS transistor P2 while a control signal D is inputted to the gate of the N-channel MOS transistor N2.

An N-channel MOS transistor NE is connected between the bit line BL(R) and the power terminal Vss and turned on at the time of reading. The control signal E is a row selection signal which selects a row i and is inputted to the gate of the MOS transistor.

If the spin FET as a memory cell is of N channel type in such a semiconductor memory, writing to the magnetic recording portion of the spin FET is carried out as follows.

In case of writing "0", with a control signal Wi set to "H", control signals A, C set to "L" and control signals B, D set to "H", the spin injection current Is is supplied from the driver/sinker DS1 to the driver/sinker DS2.

In case of writing "1", with the control signal Wi set to "H", the control signals A, C set to "H" and the control signals B, D set to "L", the spin injection current Is is supplied from the driver/sinker DS2 to the driver/sinker DS1.

In case of data reading, with the control signal Wi set to "H", the control signals A, B set to "H", the control signals C, D set to "L" and the control signals E, $\phi j$ set to "H", reading current is supplied from the sense amplifier S/A to the MOS transistor NE through the spin FET.

In the meantime, the value of the reading current is set lower than the value of the spin injection current, thereby preventing generation of error in reading.

(3) Case of Building Up System by Loading on Chip

Figure 59:
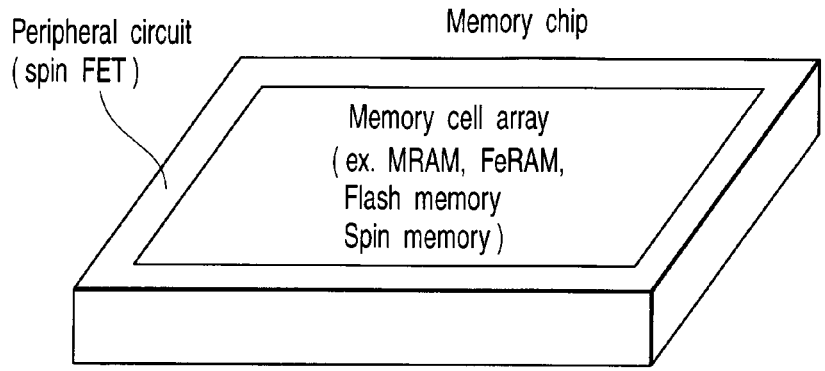
FIG. 59 is a diagram showing a memory chip.

FIG. 59 shows an example of the semiconductor memory.

The spin FET of the embodiment of the present invention is used for a peripheral circuit of the semiconductor memory. The memory cell array includes, for example, a magnetic random access memory (MRAM), a ferroelectric random access memory (FeRAM), a flash memory (a NAND type, a NOR type) and the like.

As the memory cell array, it is possible to use a spin memory based on a new principle of the embodiment of the present invention.

Figure 60:
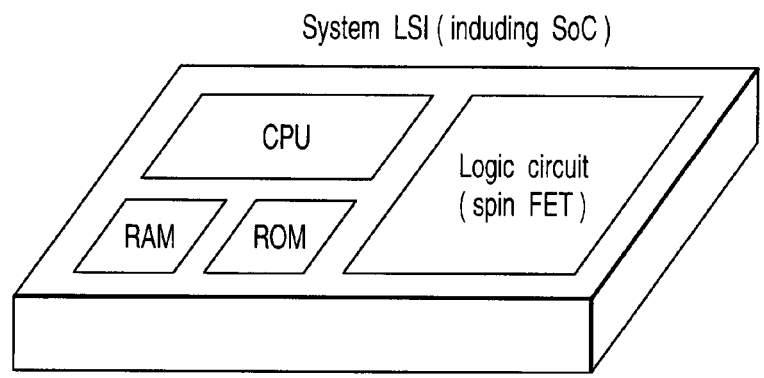
FIG. 60 is a diagram showing a system LSI.

FIG. 60 shows an example of a system LSI.

The system LSI includes a system on chip (SoC).

The spin FET of the embodiment of the present invention is used in a logic circuit which comprises the system LSI. The central processing unit (CPU) may be comprised of an ordinary CMOS circuit or of a spin FET of the embodiment of the present invention.

As the read only memory (ROM), the semiconductor memory which uses the spin FET of the embodiment of the present invention as its memory cell, and the spin memory of the embodiment of the present invention may be used as well as a nonvolatile semiconductor memory such as a flash memory.

The random access memory (RAM) is comprised of a memory which can operate rapidly such as SRAM and DRAM.

Figure 61:
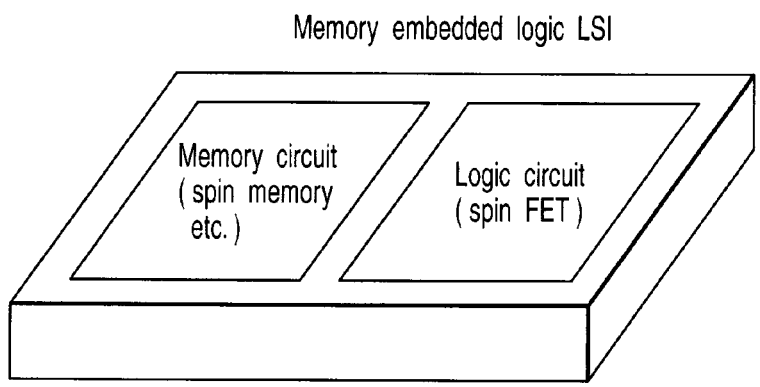
FIG. 61 is a diagram showing a logic LSI loaded with a memory.

FIG. 61 shows an example of a logic LSI loaded with a memory.

The spin FET of the embodiment of the present invention is used in a logic circuit. As the memory circuit, the semiconductor memory which uses the spin FET of the embodiment of the present invention as its memory cell and the spin memory of the embodiment of the present invention may be used as well as the ordinary semiconductor memory.

7. Others

The embodiments of the present invention can realize a spin FET, a magnetoresistive element and a spin memory with low power consumption and high reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin FET comprising:
   first and second source/drain areas;
   a channel area disposed between the first and second source/drain areas;
   a gate insulation film disposed on the channel area;
   a gate electrode disposed on the gate insulation film;
   a first ferromagnetic film disposed on the first source/drain area having a direction of magnetization fixed in an upward direction or a downward direction perpendicular to a film surface;
   an anti-ferromagnetic ferroelectric film disposed above the second source/drain area and arranged at a side of the gate electrode through a side insulation film;
   a second ferromagnetic film disposed between the second source/drain area and the anti-ferromagnetic ferroelectric film, and having a direction of magnetization in the upward direction or the downward direction, the direction of magnetization being controlled by a direction of a writing voltage applied between the gate electrode and the anti-ferromagnetic ferroelectric film; and a tunnel barrier film disposed at least one of between the first source/drain area and the first ferromagnetic film and between the second source/drain area and the second ferromagnetic film, wherein a reading voltage is applied to the gate electrode for detecting a reading current between the first and second source/drain areas, and the reading current depends on the direction of magnetization of the second ferromagnetic film.

2. A spin FET comprising:
a first ferromagnetic film in which a direction of magnetization is fixed to an upward direction or a downward direction perpendicular to a film surface;
a second ferromagnetic film in which a direction of magnetization is changed in the upward direction or the downward direction;
a channel area disposed between the first and second ferromagnetic films;
a gate insulation film disposed on the channel area;
a gate electrode disposed on the gate insulation film;
an anti-ferromagnetic ferroelectric film disposed on the second ferromagnetic film; and
a tunnel barrier film disposed at least one of between the first ferromagnetic film and the channel area and between the second ferromagnetic film and the channel area,
wherein no ferromagnetic film is provided between the anti-ferromagnetic film and the second ferromagnetic layer.

3. The spin FET according to claim 1, wherein resistance of the anti-ferromagnetic ferroelectric film is larger than ON resistance when current is flowed through the channel area.

4. The spin FET according to claim 2, wherein resistance of the anti-ferromagnetic ferroelectric film is larger than ON resistance when current is flowed through the channel area.

5. The spin FET according to claim 1, wherein the first and second source/drain areas and the channel area are disposed in a semiconductor substrate comprised of at least one of Si and Ge, and the tunnel barrier film is disposed directly on the semiconductor substrate.

6. The spin FET according to claim 1, wherein the first and second source/drain areas and the channel area are disposed in a semiconductor substrate comprised of at least one of GaAs and ZnSe, and the tunnel barrier film is disposed directly on the semiconductor substrate.

7. The spin FET according to claim 1, wherein the first and second source/drain areas and the channel area are disposed in a semiconductor substrate, and p-n junction is formed on an interface between the first and second source/drain areas and the semiconductor substrate.

8. The spin FET according to claim 2, wherein the first and second ferromagnetic films are disposed in concave portions of a semiconductor substrate comprised of at least one of Si and Ge, and the tunnel barrier film is disposed directly on an inner face of the concave portion.

9. The spin FET according to claim 2, wherein the first and second ferromagnetic films are disposed in concave portions of a semiconductor substrate comprised of GaAs or ZnSe, and the tunnel barrier film is disposed directly on an inner face of the concave portion.

10. The spin FET according to claim 1, wherein the anti-ferromagnetic ferroelectric film is $Cr_2O_3$.

11. The spin FET according to claim 2, wherein the anti-ferromagnetic ferroelectric film is $Cr_2O_3$.

12. The spin FET according to claim 1, wherein at least one of the first and second ferromagnetic films includes laminated first and second thin films,
the first thin film includes at least one of an amorphous material selected from the group comprising of Ni—Fe, Co—Fe, Co—Fe—Ni and Co—Fe—B, Heusler alloy selected from the group comprising of $Co_2FeSi_{1-x}Al_x$ ($0.25 \leq x \leq 0.75$), $Co_2MnGe$, $Co_2Mn_{1-x}Fe_xSi$ ($0.25 \leq x \leq 0.75$) and $Co_2MnSi$, and a magnetic semiconductor selected from the group comprising of SiMn, GeMn, $Fe_3Si$ and $Fe_3Ge$, and
the second thin film includes a material comprising perpendicular magnetic anisotropy selected from the group comprising of FePt, Co/Pt and Co/Ni.

13. The spin FET according to claim 2, wherein at least one of the first and second ferromagnetic films includes laminated first and second thin films,
the first thin film includes at least one of an amorphous material selected from the group comprising of Ni—Fe, Co—Fe, Co—Fe—Ni and Co—Fe—B, Heusler alloy selected from the group comprising of $Co_2FeSi_{1-x}Al_x$ ($0.25 \leq x \leq 0.75$), $Co_2MnGe$ and $Co_2MnSi$, and a magnetic semiconductor selected from the group comprising of SiMn, GeMn, $Fe_3Si$ and $Fe_3Ge$, and
the second thin film includes a material comprising perpendicular magnetic anisotropy selected from the group comprising of FePt, Co/Pt and Co/Ni.

14. The spin FET according to claim 1, wherein the tunnel barrier film includes oxide or nitride of a material selected from the group comprising of Si, Ge, Al, Ga, Mg, and Ti.

15. The spin FET according to claim 2, wherein the tunnel barrier film includes oxide or nitride of a material selected from the group comprising of Si, Ge, Al, Ga, Mg, and Ti.

16. The spin FET according to claim 1, wherein the anti-ferromagnetic ferroelectric film is magnetically coupled to the second ferromagnetic film, and further wherein a magnetization direction of the anti-ferromagnetic ferroelectric film is changed by an electric field within the anti-ferromagnetic ferroelectric film.

17. The spin FET according to claim 1, further comprising:
a driver/sinker supplying a spin injection current to the anti-ferromagnetic ferroelectric film and the second ferromagnetic film,
wherein the anti-ferromagnetic ferroelectric film generates spin polarization electrons and the electric field by the spin injection current, and
further wherein the magnetization reversal of the second ferromagnetic film is executed by the spin polarization electrons and the magnetic coupling between the anti-ferromagnetic ferroelectric film and the second ferromagnetic film.

18. The spin FET according to claim 1, wherein the anti-ferromagnetic ferroelectric film has a magnetic coupling with the second ferromagnetic film, and the direction of magnetization of the second ferromagnetic film is changed by the magnetic coupling.

19. The spin FET according to claim 2, wherein the anti-ferromagnetic ferroelectric film is magnetically coupled to the second ferromagnetic film, and further wherein a magnetization direction of the anti-ferromagnetic ferroelectric film is changed by an electric field within the anti-ferromagnetic ferroelectric film.

20. The spin FET according to claim 2, further comprising:
a driver/sinker supplying a spin injection current to the anti-ferromagnetic ferroelectric film and the second ferromagnetic film,
wherein the anti-ferromagnetic ferroelectric film generates spin polarization electrons and the electric field by the spin injection current, and
further wherein the magnetization reversal of the second ferromagnetic film is executed by the spin polarization electrons and the magnetic coupling between the anti-ferromagnetic ferroelectric film and the second ferromagnetic film.

21. The spin FET according to claim 2, wherein the anti-ferromagnetic ferroelectric film has a magnetic coupling with the second ferromagnetic film, and the direction of magnetization of the second ferromagnetic film is changed by the magnetic coupling.

* * * * *